United States Patent
Kurokawa

(10) Patent No.: US 9,287,370 B2
(45) Date of Patent: Mar. 15, 2016

(54) MEMORY DEVICE COMPRISING A TRANSISTOR INCLUDING AN OXIDE SEMICONDUCTOR AND SEMICONDUCTOR DEVICE INCLUDING THE SAME

(71) Applicant: Semiconductor Energy Laboratory Co., Ltd., Atsugi-shi, Kanagawa-ken (JP)

(72) Inventor: Yoshiyuki Kurokawa, Kanagawa (JP)

(73) Assignee: Semiconductor Energy Laboratory Co., Ltd., Atsugi-shi,Kanagawa-ken (JP)

( * ) Notice: Subject to any disclaimer, the term of this patent is extended or adjusted under 35 U.S.C. 154(b) by 264 days.

(21) Appl. No.: 13/772,530

(22) Filed: Feb. 21, 2013

(65) Prior Publication Data

US 2013/0228773 A1    Sep. 5, 2013

(30) Foreign Application Priority Data

Mar. 2, 2012 (JP) ................................. 2012-046571

(51) Int. Cl.
| | | |
|---|---|---|
| G11C 11/00 | (2006.01) | |
| H01L 29/26 | (2006.01) | |
| H01L 29/24 | (2006.01) | |
| H01L 27/12 | (2006.01) | |
| G11C 8/16 | (2006.01) | |
| H01L 27/11 | (2006.01) | |
| H01L 27/115 | (2006.01) | |

(52) U.S. Cl.
CPC ...... *H01L 29/26* (2013.01); *G11C 8/16* (2013.01); *H01L 27/1225* (2013.01); *H01L 29/24* (2013.01); *H01L 27/1108* (2013.01); *H01L 27/1156* (2013.01)

(58) Field of Classification Search
CPC .............. H01L 29/7869; H01L 21/02554; H01L 27/1225; H01L 21/02565; H01L 27/11; H01L 27/11529; H01L 27/1156; H01L 27/11578; G11C 7/1006; G11C 11/24; G11C 11/34; G11C 5/06; G11C 11/412; G11C 8/16; G11C 11/419; G11C 11/4091; G11C 11/413; G11C 7/06; G11C 8/10
See application file for complete search history.

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |

(Continued)

FOREIGN PATENT DOCUMENTS

| | | |
|---|---|---|
| EP | 1 737 044 A1 | 12/2006 |
| EP | 2 226 847 A2 | 9/2010 |

(Continued)

OTHER PUBLICATIONS

Ohara, H et al., "Amorphous In—Ga—Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

(Continued)

*Primary Examiner* — Hien Nguyen
(74) *Attorney, Agent, or Firm* — Fish & Richardson P.C.

(57) ABSTRACT

A memory device consumes low power, has high capacity, and is shared by a plurality of processors. A data write transistor of a memory device is manufactured with a material capable of achieving a sufficiently low off-state current of a transistor (e.g., an oxide semiconductor material that is a wide band gap semiconductor). The memory device has a memory cell including at least one data write transistor, at least one data storage transistor, and at least two data read transistors.

16 Claims, 23 Drawing Sheets

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0124141 A1 | 5/2010 | Arai |
| 2011/0121878 A1 | 5/2011 | Kato et al. |
| 2011/0148463 A1 | 6/2011 | Kato et al. |
| 2011/0187410 A1 | 8/2011 | Kato et al. |
| 2011/0255325 A1 | 10/2011 | Nagatsuka et al. |
| 2011/0305072 A1 | 12/2011 | Ishii et al. |
| 2012/0002460 A1* | 1/2012 | Rimondi ............... G11C 11/412 365/156 |
| 2012/0170355 A1 | 7/2012 | Ohmaru et al. |
| 2012/0195122 A1 | 8/2012 | Ohmaru |
| 2012/0206956 A1 | 8/2012 | Fujita |
| 2012/0230138 A1 | 9/2012 | Endo |
| 2012/0243340 A1 | 9/2012 | Kobayashi et al. |
| 2012/0250407 A1 | 10/2012 | Kurokawa |
| 2012/0269013 A1 | 10/2012 | Matsuzaki |
| 2012/0271984 A1 | 10/2012 | Ohmaru et al. |
| 2012/0274378 A1 | 11/2012 | Fujita |
| 2012/0275214 A1 | 11/2012 | Atsumi et al. |
| 2012/0287702 A1 | 11/2012 | Fujita |
| 2012/0287703 A1 | 11/2012 | Kobayashi et al. |
| 2012/0292613 A1 | 11/2012 | Shionoiri et al. |
| 2012/0314512 A1 | 12/2012 | Kurokawa |
| 2013/0170275 A1* | 7/2013 | Kumar ................. G11C 11/412 365/63 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-083700 A | 3/1994 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2010-123157 A | 6/2010 |
| JP | 2011-258270 A | 12/2011 |
| WO | 2004/114391 A1 | 12/2004 |

OTHER PUBLICATIONS

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

(56) References Cited

OTHER PUBLICATIONS

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.
Osada, T et al., "Development of Driver-Integrated Panel Using Amorphous In—Ga—Zn—Oxide TFT," AM-FPD '09 Digest of Technical Papers, Jul. 1, 2009, pp. 33-36.
Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.
Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.
Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.
Park, J et al., "High performance amorphous oxide thin film transistors with self-aligned top-gate structure," IEDM 09: Technical Digest of International Electron Devices Meeting, Dec. 7, 2009, pp. 191-194.
Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.
Park, J et al., "Amorphous Indium—Gallium—Zinc Oxide TFTs and Their Application for Large Size AMOLED," AM-FPD '08 Digest of Technical Papers, Jul. 2, 2008, pp. 275-278.
Park, S et al., "Challenge to Future Displays: Transparent AM-OLEAD Driven by PEALD Grown ZnO TFT," IMID '07 Digest, 2007, pp. 1249-1252.
Prins, M et al., "A Ferroelectric Transparent Thin-Film Transistor," Appl. Phys. Lett. (Applied Physics Letters), Jun. 17, 1996, vol. 68, No. 25, pp. 3650-3652.
Sakata, J et al., "Development of 4.0-In. AMOLED Display With Driver Circuit Using Amorphous In—Ga—Zn—Oxide TFTs," IDW '09 : Proceedings of the 16th International Display Workshops, 2009, pp. 689-692.
Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.
Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.
Tsuda, K et al., "Ultra Low Power Consumption Technologies for Mobile TFT-LCDs," IDW '02 : Proceedings of the 9th International Display Workshops, Dec. 4, 2002, pp. 295-298.
Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.
Van De Walle, C, "Hydrogen as a Cause of Doping in Zinc Oxide," Phys. Rev. Lett. (Physical Review Letters), Jul. 31, 2000, vol. 85, No. 5, pp. 1012-1015.
Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.
Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.
Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.
Clark, S et al., "First Principles Methods Using CASTEP," Zeitschrift fur Kristallographie, 2005, vol. 220, pp. 567-570.
Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.
Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.
Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.
Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.
Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.
Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.
Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.
Hayashi, R et al., "42.1: Invited Paper: Improved Amorphous In—Ga—Zn—O TFTs," SID Digest '08 : SID International Symposium Digest of Technical Papers, May 20, 2008, vol. 39, pp. 621-624.
Hirao, T et al., "Novel Top-Gate Zinc Oxide Thin-Film Transistors (ZnO TFTs) for AMLCDS," Journal of the SID, 2007, vol. 15, No. 1, pp. 17-22.
Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.
Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.
Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.
Ikeda, T et al., "Full-Functional System Liquid Crystal Display Using CG-Silicon Technology," SID Digest '04 : SID International Symposium Digest of Technical Papers, 2004, vol. 35, pp. 860-863.
Janotti, A et al., "Native Point Defects in ZnO," Phys. Rev. B (Physical Review. B), 2007, vol. 76, No. 16, pp. 165202-1-165202-22.
Janotti, A et al., "Oxygen Vacancies in ZnO," Appl. Phys. Lett. (Applied Physics Letters), 2005, vol. 87, pp. 122102-1-122102-3.
Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.
Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.
Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.
Kikuchi, H et al., "39.1: Invited Paper: Optically Isotropic NANO-Structured Liquid Crystal Composites for Display Applications," SID Digest '09 : SID International Symposium Digest of Technical Papers, May 31, 2009, pp. 578-581.

(56) References Cited

OTHER PUBLICATIONS

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YbFe2O4, and Yb2Fe3O7 Types of Structures for Compounds in the In2O3 and Sc2O3—A2O3—Bo Systems [A; Fe, Ga, or Al; B: Mg, Mn, Fe, Ni, Cu,or Zn] at Temperatures Over 1000° C.," Journal of Solid State Chemistry, 1985, vol. 60, pp. 382-384.

Kimizuka, N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World'S Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium—Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3—Ga2ZnO4—ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In—Ga—Zn—Oxide TFTs With a Novel Passivation Layer," SID Digest '09 : SID International Symposium Digest of Technical Papers, May 31, 2009, pp. 284-287.

\* cited by examiner

MEMORY DEVICE COMPRISING A TRANSISTOR INCLUDING AN OXIDE SEMICONDUCTOR AND SEMICONDUCTOR DEVICE INCLUDING THE SAME

BACKGROUND OF THE INVENTION

1. Field of the Invention

The disclosed invention relates to a memory device and a semiconductor device including the memory device.

Memory devices herein refer to general devices including memory elements, and are not limited to a main memory device and an auxiliary memory device. For example, an arithmetic device that includes a device including a memory element, such as a register, is regarded as a memory device.

Note that semiconductor devices herein refer to general elements and devices which function by utilizing semiconductor characteristics.

2. Description of the Related Art

A semiconductor device in which arithmetic processing is performed in a plurality of processors for high arithmetic capacity, what is called, a multiprocessor-system semiconductor device has become widespread. Multiprocessor-system-based semiconductor devices are classified into a loosely coupled system, a tightly coupled system, and the like in accordance with coupling systems of individual processors.

In a loosely coupled system, each processor has a special-purpose memory and can almost independently perform arithmetic processing. However, common data for a plurality of processors needs to be stored in each special-purpose memory of individual processors. Therefore, each processor needs a large-scale special-purpose memory.

In a tightly coupled system, a shared memory to which a plurality of processors has an access is provided, and individual processors can perform arithmetic processing with the use of common data stored in the shared memory. An example of a tightly coupled system is a multi-core processor in which a plurality of processor cores is provided for one processor package.

As a shared memory of such a tightly coupled system multiprocessor, a dual-port memory which has two input/output ports, or the like can be given (e.g., Patent Document 1).

REFERENCE

[Patent Document 1] Japanese Published Patent Application No. 2011-258270

SUMMARY OF THE INVENTION

As the above shared memory, a dynamic random access memory (DRAM), a static random access memory (SRAM), or the like which is used as a main memory or a cache memory is often used.

A DRAM and an SRAM are each a volatile memory device which needs regular or constant supply of power for retaining memory.

For example, in the case of a DRAM, data is stored in such a manner that a transistor included in a memory element is selected and electric charge is stored in a capacitor. A transistor included in a memory element has leakage current (off-state current) between a source and a drain in an off state or the like and electric charge flows into or out of the transistor even if the transistor is not selected, which makes a data holding period short. For that reason, another writing operation (refresh operation) is necessary at predetermined intervals, and it is difficult to sufficiently reduce power consumption.

In the case of an SRAM, stored data is held with a circuit such as a flip-flop. The flip-flop circuit includes two cross-connected CMOS inverter circuits which include four transistors. Generating leakage current (off-state current) between a source and a drain of a transistor in the CMOS inverter results in current flow from a high potential power source line to a low potential power source line and makes it difficult to achieve sufficiently low power consumption.

In addition, in the case of an SRAM, a standard structure includes six transistors, and the number of elements is very large. Further, in the case of using an SRAM as a dual-port memory, two transistors for access in data write/read are added; accordingly, the number of elements is eight. Such an increase in the number of elements causes a large area of a memory cell, which poses a problem in that increased capacity of the memory device is difficult to be achieved.

In view of the above problems, in one embodiment of the disclosed invention, one object is to provide a memory device which consumes low power. Another object is to provide a memory device whose capacity is high.

Another object is to provide a semiconductor device including the above memory device.

In one embodiment of the disclosed invention, a data write transistor of a memory device is manufactured with a material capable of achieving a sufficiently low off-state current of a transistor (e.g., an oxide semiconductor material that is a wide band gap semiconductor). Using a wide band gap semiconductor material capable of achieving a sufficiently low off-state current of a transistor makes it possible to hold a potential for a long time without regular or constant supply of power, and therefore, low power consumption can be achieved.

In one embodiment of the disclosed invention, a memory device has a memory cell including at least one data write transistor, at least one data storage transistor, and at least two data read transistors. With this structure, the number of elements can be small in comparison with at least the case of a memory cell of a dual-port SRAM, which results in achieving a small area of a memory cell and easily achieving a high capacity of the memory device.

Specifically, structures described below can be employed, for example.

According to another embodiment of the disclosed invention, a memory device includes a first write selection line, a second write selection line, a first read selection line, a second read selection line, a first write data line, a second write data line, a first read data line, a second read data line, a first power supply line, and a plurality of memory cells. One of the plurality of memory cells includes a first transistor including a first gate electrode, a first source electrode, a first drain electrode, and a first channel formation region; a second transistor including a second gate electrode, a second source electrode, a second drain electrode, and a second channel formation region; a third transistor including a third gate electrode, a third source electrode, a third drain electrode, and a third channel formation region; a fourth transistor including a fourth gate electrode, a fourth source electrode, a fourth drain electrode, and a fourth channel formation region; and a fifth transistor including a fifth gate electrode, a fifth source electrode, a fifth drain electrode, and a fifth channel formation region. The first channel formation region and the fifth channel formation region include a semiconductor material different from semiconductor materials in the second channel formation region, the third channel formation region, and the fourth channel formation region. A node holding an electric charge electrically connects the second gate electrode, the first drain electrode, and the fifth drain electrode. The second drain electrode, the third source electrode, and the fourth source electrode are electrically connected. The first write selection line is electrically connected to the first gate electrode. The second write selection line is electrically connected to the fifth gate electrode. The first read selection line is electrically connected to the third gate electrode. The second read selection line is electrically connected to the fourth gate electrode. The first write data line is electrically connected to the first source electrode. The second write data line is electrically connected to the fifth source electrode. The first read data line is electrically connected to the third drain electrode. The second read data line is electrically connected to the fourth drain electrode. The first power supply line is electrically connected to the second source electrode.

According to another embodiment of the disclosed invention, a semiconductor device includes the memory device, a first processor, and a second processor. The first processor writes data to the memory device by using the first write selection line and the first write data line. The first processor reads data of the memory device by using the first read selection line and the first read data line. The second processor writes data to the memory device by using the second write selection line and the second write data line. The second processor reads data of the memory device by using the second read selection line and the second read data line.

According to another embodiment of the disclosed invention, a memory device includes a write selection line, a first read selection line, a second read selection line, a write data line, a first read data line, a second read data line, a first power supply line, and a plurality of memory cells. One of the plurality of memory cells includes a first transistor including a first gate electrode, a first source electrode, a first drain electrode, and a first channel formation region, a second transistor including a second gate electrode, a second source electrode, a second drain electrode, and a second channel formation region, a third transistor including a third gate electrode, a third source electrode, a third drain electrode, and a third channel formation region, and a fourth transistor including a fourth gate electrode, a fourth source electrode, a fourth drain electrode, and a fourth channel formation region. The first channel formation region includes a semiconductor material different from semiconductor materials in the second channel formation region, the third channel formation region, and the fourth channel formation region. A node holding an electric charge electrically connects the second gate electrode and the first drain electrode. The second drain electrode, the third source electrode, and the fourth source electrode are electrically connected. The write selection line is electrically connected to the first gate electrode. The first read selection line is electrically connected to the third gate electrode. The second read selection line is electrically connected to the fourth gate electrode. The write data line is electrically connected to the first source electrode. The first read data line is electrically connected to the third drain electrode. The second read data line is electrically connected to the fourth drain electrode. The first power supply line is electrically connected to the second source electrode.

According to another embodiment of the disclosed invention, a semiconductor device includes the memory device, a first processor, a second processor, and a selector. The first processor writes data to the memory device by using the write selection line and the write data line through the selector at timing different from that of the second processor. The first processor reads data of the memory device by using the first read selection line and the first read data line. The second processor writes data to the memory device by using the write selection line and the write data line through the selector at timing different from that of the first processor. The second processor reads data of the memory device by using the second read selection line and the second read data line.

The above devices is preferably include a capacitor having one electrode electrically connected to a node where electric charge is held and the other electrode electrically connected to a second power supply line.

The first channel formation region of the first transistor preferably includes an oxide semiconductor. The second channel formation region of the second transistor preferably includes single crystal silicon. The third channel formation region of the third transistor and the fourth channel formation region of the fourth transistor preferably include single crystal silicon. The fifth channel formation region of the fifth transistor preferably includes an oxide semiconductor.

In this specification and the like, the term "high potential H" means a potential higher than or equal to the potential level at which an n-channel transistor in a memory device is turned on and a p-channel transistor in a memory device is turned off. The term "low potential L" means a potential higher than or equal to the potential level at which an n-channel transistor in a memory device is turned off and a p-channel transistor in a memory device is turned on.

Note that in this specification and the like, the term such as "over" or "below" does not necessarily mean that a component is placed "directly on" or "directly under" another component. For example, the expression "a gate electrode over a gate insulating layer" can mean the case where there is an additional component between the gate insulating layer and the gate electrode.

In addition, in this specification and the like, the term such as "electrode" or "wiring" does not limit a function of a component. For example, an "electrode" is sometimes used as part of a "wiring", and vice versa. Furthermore, the term "electrode" or "wiring" can include the case where a plurality of "electrodes" or "wirings" is formed in an integrated manner.

Functions of a "source" and a "drain" are sometimes replaced with each other when a transistor of opposite polarity is used or when the direction of current flowing is changed in circuit operation, for example. Therefore, the terms "source" and "drain" can be replaced with each other in this specification and the like.

Note that in this specification and the like, the term "electrically connected" includes the case where components are connected through an object having any electric function. There is no particular limitation on an object having any electric function as long as electric signals can be transmitted and received between components that are connected through the object.

Examples of an "object having any electric function" are a switching element such as a transistor, a resistor, an inductor, a capacitor, and an element with a variety of functions as well as an electrode and a wiring.

According to one embodiment of the disclosed invention, a memory device which consumes low power can be provided. According to one embodiment of the disclosed invention, a memory device whose capacity is high can be provided.

A semiconductor device including the memory device can be provided.

DETAILED DESCRIPTION OF THE INVENTION

Figure 1:
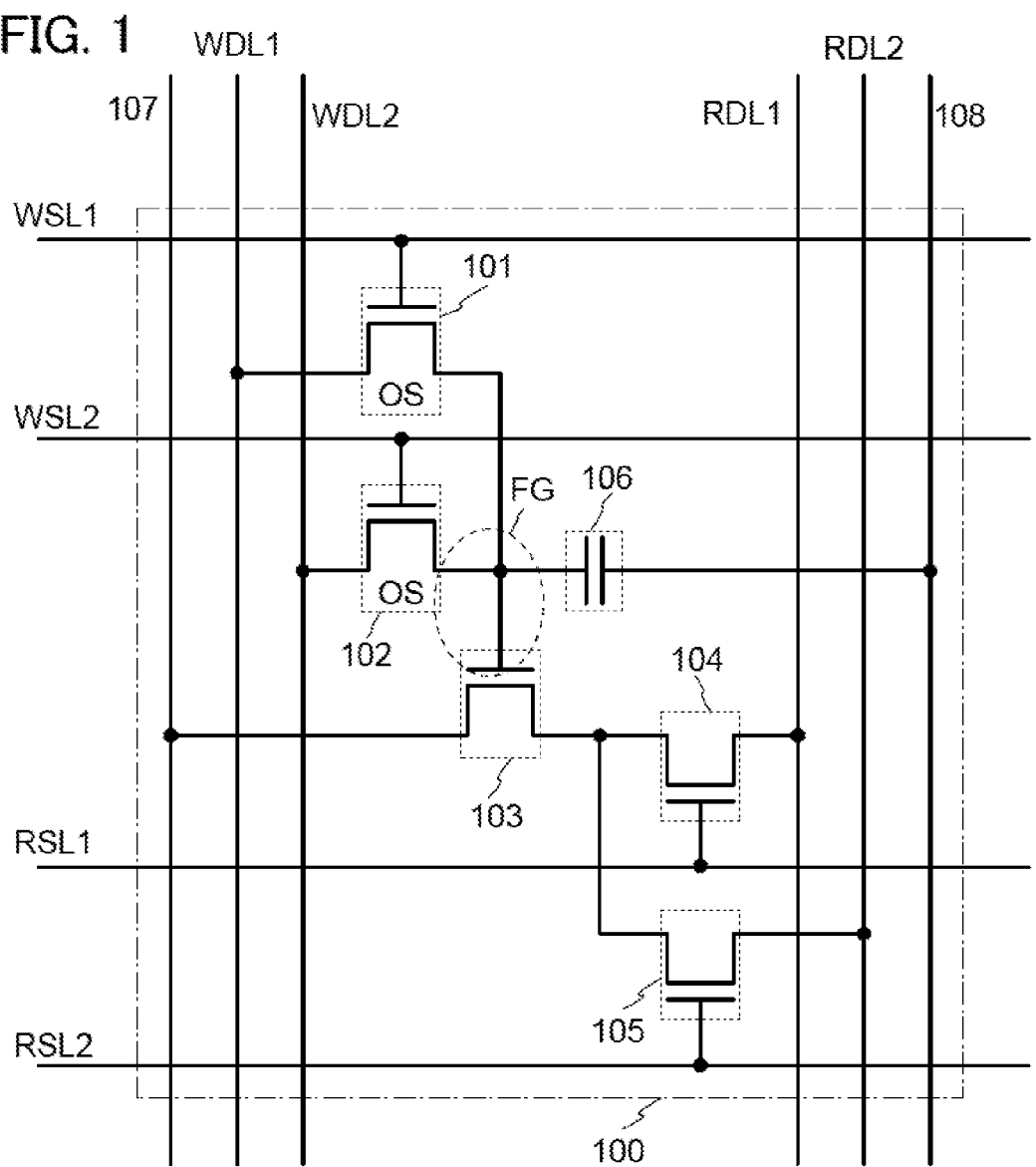
FIG. 1 is a circuit diagram of a memory device according to one embodiment of the disclosed invention.

Hereinafter, embodiments of the present invention will be described with reference to the drawings. Note that the present invention is not limited to the following description and it will be readily appreciated by those skilled in the art that modes and details can be modified in various ways without departing from the spirit and the scope of the present invention. Therefore, the invention should not be construed as being limited to the description in the following embodiment.

Note that the position, the size, the range, or the like of each structure illustrated in drawings and the like is not accurately represented in some cases for easy understanding. Therefore, the disclosed invention is not necessarily limited to the position, size, range, or the like as disclosed in the drawings and the like.

In this specification and the like, ordinal numbers such as "first", "second", and "third" are used in order to avoid confusion among components, and the terms do not mean limitation of the number of components.

Embodiment 1

In this embodiment, a circuit configuration and operation of a memory device according to one embodiment of the disclosed invention will be described with reference to FIG. 1, FIG. 2, FIGS. 3A and 3B, FIG. 4, FIG. 5, and FIG. 6. Note that in each of circuit diagrams, in some cases, "OS" is written beside a transistor in order to indicate that the transistor includes an oxide semiconductor.

First, a basic structure of the memory device according to one embodiment of the disclosed invention (hereinafter referred to as a memory cell) and operation thereof will be described with reference to FIG. 1, FIG. 2, FIGS. 3A and 3B, and FIG. 4. A memory cell 100 illustrated in FIG. 1 includes a transistor 101, a transistor 102, a transistor 103, a transistor 104, a transistor 105, and a capacitor 106. These elements included in the memory cell 100 are electrically connected to a first write selection line WSL1, a second write selection line WSL2, a first read selection line RSL1, a second read selection line RSL2, a first write data line WDL1, a second write data line WDL2, a first read data line RDL1, a second read data line RDL2, a first power supply line 107, and a second power supply line 108.

A specific connection relation in the memory cell 100 is as follows. A gate electrode of the transistor 103, a drain electrode (or a source electrode) of the transistor 101, and a drain electrode (or a source electrode) of the transistor 102 are electrically connected to one another. Hereinafter, the node, in which the gate electrode of the transistor 103, the drain electrode (or the source electrode) of the transistor 101, and the drain electrode (or the source electrode) of the transistor 102 are electrically connected to one another, is also referred to as a node FG. A drain electrode (or a source electrode) of the transistor 103, a source electrode (or a drain electrode) of the transistor 104, and a source electrode (or a drain electrode) of the transistor 105 are electrically connected to one another. The first write selection line WSL1 and the second write selection line WSL2 are electrically connected to a gate electrode of the transistor 101 and a gate electrode of the transistor 102, respectively. The first read selection line RSL1 and the second read selection line RSL2 are electrically connected to a gate electrode of the transistor 104 and a gate electrode of the transistor 105, respectively. The first write data line WDL1 and the second write data line WDL2 are electrically connected to a source electrode (or a drain electrode) of the transistor 101 and a source electrode (or a drain electrode) of the transistor 102, respectively. The first read data line RDL1 and the second read data line RDL2 are electrically connected to a drain electrode (or a source electrode) of the transistor 104 and a drain electrode (or a source electrode) of the transistor 105, respectively. The first power supply line 107 is electrically connected to a source electrode (or a drain electrode) of the transistor 103. One electrode of the capacitor 106 is electrically connected to the node FG, and the other electrode of the capacitor 106 is electrically connected to the second power supply line 108.

Note that a predetermined potential is applied to the first power supply line 107 and the second power supply line 108. Here, the predetermined potential is, for example, GND (low potential L) or the like. The potentials of the first power supply line 107 and the second power supply line 108 may be the same or different. In addition, the other electrode of the capacitor 106 may be electrically connected to the first power supply line 107. Providing the capacitor 106 as described above enables the node FG to hold much electric charge, and accordingly, data retention characteristics can be high.

Note that the capacitor 106 is not necessarily provided. For example, a high parasitic capacitance of the transistor 103 can be an alternative to the capacitor 106.

The transistors 101 and 102 are each preferably a transistor having an extremely low off-state current. The transistor having an extremely low off-state current preferably includes, in a channel formation region, a wide bandgap semiconductor which has a wider bandgap and lower intrinsic carrier density than single crystal silicon. For example, the band gap of the wide band gap semiconductor may be more than 1.1 eV, preferably 2.5 eV or more and 4 eV or less, still preferably 3 eV or more and 3.8 eV or less. For example, as such a wide band gap semiconductor, a compound semiconductor such as silicon carbide (SiC) or gallium nitride (GaN), an oxide semiconductor formed of metal oxide such as an In—Ga—Zn—O-based oxide semiconductor, or the like can be used. Alternatively, since a transistor including amorphous silicon, microcrystalline silicon, or the like has a lower off-state current than a transistor including single crystal silicon, the transistors 101 and 102 may employ amorphous silicon, microcrystalline silicon, or the like.

The band gap of single crystal silicon is approximately 1.1 eV, and even in a state where there is no carrier caused by a donor or an acceptor (i.e., even in the case of an intrinsic semiconductor), the concentration of thermally excited carriers is approximately $1 \times 10^{11}$ cm$^{-3}$. The band gap of an In—Ga—Zn—O-based oxide semiconductor which is the wide band gap semiconductor is approximately 3.2 eV and the concentration of thermally excited carriers is approximately $1 \times 10^{-7}$ cm$^{-3}$. The off-state resistance (referred to as a resistance between a source and a drain of a transistor in an off state) of a transistor is inversely proportional to the concentration of thermally excited carriers in the channel formation region. Accordingly, the resistivity of an In—Ga—Zn—O-based oxide semiconductor at the time when the transistor is off is 18 orders of magnitude higher than that of silicon.

When wide band gap semiconductor is used for the transistors 101 and 102, for example, the off-state current (per unit channel width (1 μm), here) at room temperature (25° C.) is less than or equal to 100 zA (1 zA (zeptoampere) is $1 \times 10^{-21}$ A), preferably less than or equal to 10 zA.

For example, when the off-state currents of the transistors 101 and 102 at room temperature (25° C.) (here, a value per channel width (1 μm) unit) are each 10 zA (1 zA (zeptoampere) is $1 \times 10^{-21}$ A) or lower, data can be held for $10^4$ seconds or longer. Needless to say, the retention time depends on transistor characteristics and the capacitance of the capacitor with an electrode of the transistor.

In this embodiment, a transistor having an extremely low off-state current which is used as the transistors 101 and 102 is a transistor including an oxide semiconductor. By turning off such transistors 101 and 102, the potential of the gate electrode of the transistor 103 can be held for an extremely long time without regular or constant supply of power.

Here, the transistors 101 and 102 each function as a data write transistor. When the potential of the first write selection line WSL1 or the second write selection line WSL2 is a high potential H and the transistor 101 or 102 is turned on, the potential of the first write data line WDL1 or the second write data line WDL2 is applied to the gate electrode of the transistor 103 (the node FG) (data write). Here, any one of two different potentials (hereinafter, a high potential H and a low potential L) is applied to the node FG by data write. Note that to improve storage capacity, three or more different potentials can be used.

After that, the potentials of the first write selection line WSL1 and the second write selection line WSL2 are set to potentials at which the transistors 101 and 102 are turned off (a low potential L), and the transistors 101 and 102 are turned off, whereby electric charge supplied to the gate electrode of the transistor 103 (the node FG) can be held (data holding). Here, since off-state currents of the transistors 101 and 102 are extremely low, the electric charge of the gate electrode of the transistor 103 (the node FG) can be held for a long time.

In this manner, when a data write transistor is a transistor including a wide band gap semiconductor, the data write transistor can have an extremely low off-state current. With this structure, refresh frequency as high as that of a DRAM is not needed and a flip-flop circuit in which a leakage current is generated is not needed unlike an SRAM; therefore, sufficiently low power consumption can be achieved.

A transistor including amorphous silicon, microcrystalline silicon, or the like has a lower off-state current than a transistor including single crystal silicon. Therefore, by using amorphous silicon, microcrystalline silicon, or the like for the data write transistor, a memory device that has a lower number of refresh operations than a DRAM or the like including single crystal silicon can be obtained.

A semiconductor material used for the transistors 103 to 105 is not particularly limited. However, the semiconductor material preferably has a band gap different from that of the semiconductor material used for the transistors 101 and 102. As such a semiconductor material, silicon, germanium, silicon germanium, gallium arsenide, or the like can be used, and a single crystal semiconductor is preferably used. In terms of increasing the speed of reading data, it is preferable to use, for example, a transistor with high switching rate such as a transistor formed using single crystal silicon.

The transistor 103 functions as a data storage transistor. The state of the transistor 103 depends on a potential applied to the gate electrode of the transistor 103. That is, in writing the data, application of a high potential H results in an "on state" of the transistor 103 and application of a low potential L results in an "off state" of the transistor 103.

The drain electrode of the transistor 101, the drain electrode of the transistor 102, and the gate electrode of the transistor 103 (i.e., the node FG) have the same effect as a floating gate of a floating-gate transistor that is used as a nonvolatile memory element. However, since data can be directly rewritten by switching of the transistor 101 and 102, extraction of electric charge from a floating gate with the use of a high voltage is not necessary and thus, a reduction in operation speed, which is attributed to erasing operation, can be prevented. In this manner, high-speed operation of a memory device described in this embodiment can be achieved. For the same reason, deterioration of a gate insulating film (tunnel insulating film), which is a problem of a conventional floating gate transistor, does not exist. This means that there is no limit on the number of times of writing in principle, unlike a conventional floating gate transistor. Accordingly, the memory device described in this embodiment can be satisfactorily used as a memory device that requires high rewriting frequency and high-speed operation, such as a main memory or a cache memory.

In addition, the transistors 104 and 105 each function as a data read transistor. When the potential of the first read selection line RSL1 or the second read selection line RSL2 is set to a high potential H and the transistor 104 or 105 is turned on, the potential corresponding to an on state or an off state of the transistor 103 is applied to the first read data line RDL1 or the second read data line RDL2 (data read).

The memory cell described in this embodiment includes two data write transistors, one data storage transistor, and two data read transistors. Therefore, a memory cell that is compatible with a multiprocessor system and has a smaller number of elements than a dual-port SRAM requiring eight transistors can be obtained. In addition, the area of the memory cell can be small and the capacity of the memory device can be high.

Although the transistors 101 to 105 are n-channel transistors in this embodiment, p-channel transistors may be used as appropriate.

Here, a memory device disclosed in this specification can be accessed from a plurality of processors (also referred to as a processing device) and functions as what is called a shared memory. FIG. 2 is a block diagram of what is called a multi-processor-system semiconductor device including such a plurality of processors and the memory device. The semiconductor device in FIG. 2 includes a first processor 11, a second processor 12, a controller 13, and a memory device 14 including the memory cell 100 in FIG. 1.

The first processor 11 and the second processor 12 each have an arithmetic device and/or a controlling device. The first processor 11 and the second processor 12 read data and a program which are used for arithmetic operations and control of a device from the memory device 14, and write arithmetic results or the like to the memory device 14.

The controller 13 has a function of transmitting a signal to the memory device 14 in response to an instruction of the first processor 11 and the second processor 12 to read or write data. Examples of such a signal are a clock signal for synchronizing the memory device 14 and each of the first processor 11 and the second processor 12, a write enable signal for providing an instruction to perform data writing operation to the memory device 14, a read enable signal for providing an instruction to perform data reading operation to the memory device 14, and a write data signal corresponding to data written to the memory device 14. The controller 13 has a function of restoring data to the first processor 11 and the second processor 12 in accordance with a read data signal read from the memory device 14.

In a block diagram of FIG. 2, the controller 13 is provided outside the memory device 14; however, this embodiment is not limited thereto. For example, the controller 13 may be provided inside the memory device 14.

A signal is transmitted from the controller 13 to the memory cell 100 in the memory device 14. Here, a signal relating to a data writing instruction of the first processor 11 is supplied to the memory cell 100 through the first write selection line WSL1 and the first write data line WDL1. A signal relating to a data reading instruction of the first processor 11 is supplied to the first read selection line RSL1, and a read data signal of the memory cell 100 which is read in response to the above signal is transmitted to the controller 13 through the first read data line RDL1. In similar manner, a signal relating to a data writing instruction of the second processor 12 is supplied to the memory cell 100 through the second write selection line WSL2 and the second write data line WDL2. A signal relating to a data reading instruction of the second processor 12 is supplied to the second read selection line RSL2, and a read data signal of the memory cell 100 which is read in response to the above signal is transmitted to the controller 13 through the second read data line RDL2.

In this case, when data is written by an instruction from the first processor 11, the transistor 101 is on. When data is read by an instruction from the first processor 11, the transistor 104 is on. When data is written by an instruction from the second processor 12, the transistor 102 is on. When data is read by an instruction from the second processor 12, the transistor 105 is on. Therefore, the transistor 101, the transistor 104, the transistor 102, and the transistor 105 can also be referred to as a data write transistor for the first processor 11, a data read transistor for the first processor 11, a data write transistor for the second processor 12, and a data read transistor for the second processor 12, respectively.

Figure 2:
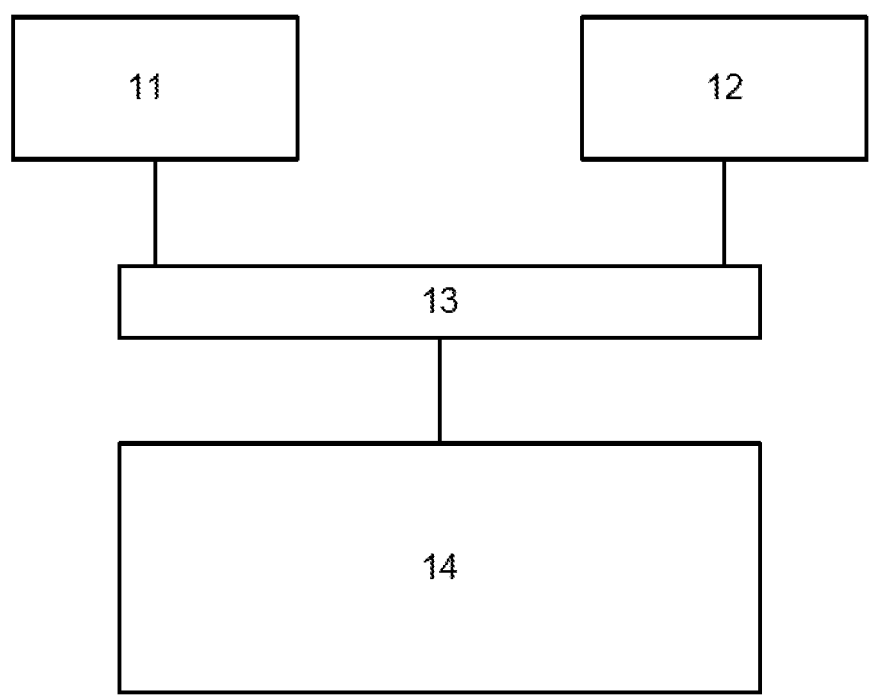
FIG. 2 is a block diagram of a semiconductor device according to one embodiment of the disclosed invention.

Note that in the semiconductor device in FIG. 2, two processors are provided and the memory cell in FIG. 1 is also compatible with two processors; however, the memory device and the semiconductor device described in this embodiment are not limited thereto. The number of processors can be three or more. In this case, the number of write selection lines, read selection lines, write data lines, read data lines, data write transistors, and data read transistors which are provided for a memory cell may be increased in accordance with the number of processors. For example, in the case of adding a third processor to the structure in FIG. 2, a third write selection line, a third read selection line, a third write data line, a third read data line, a third data write transistor, and a third data read transistor may be added to the structure of the memory cell in FIG. 1.

As a memory device shared by a plurality of processors in the multiprocessor-system semiconductor device in FIG. 2, for example, a cache memory shared by processor cores in a multi-core processor can be given. In a semiconductor device including a display device, a video random access memory (VRAM) which writes and outputs a video data stimulously, or the like also can be used.

Figure 3A:
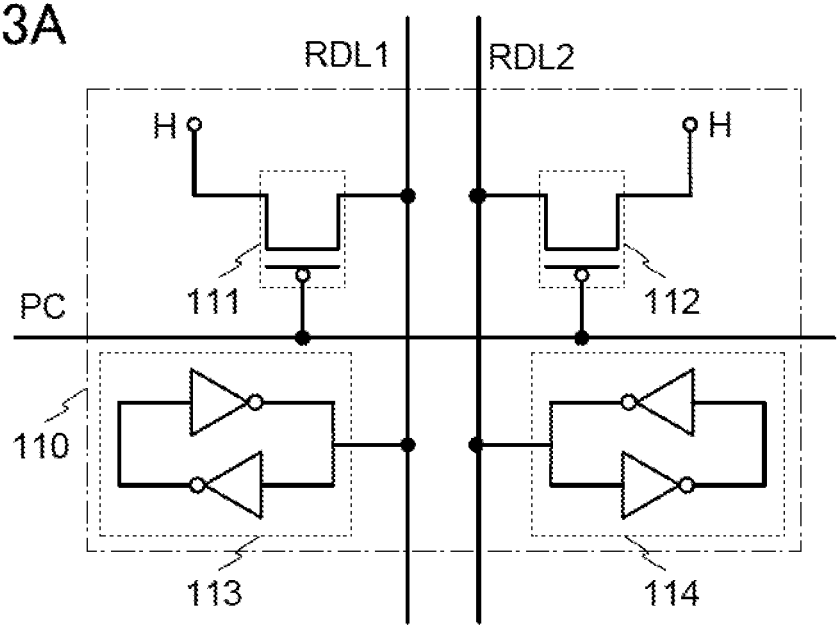
FIGS. 3A and 3B are each a circuit diagram of a memory device according to one embodiment of the disclosed invention.
Figure 3B:
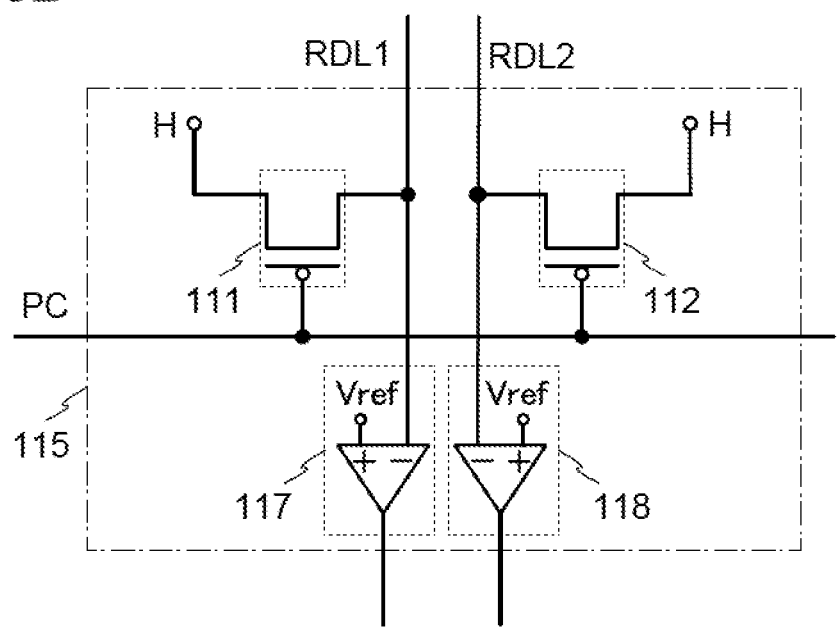

The first read data line RDL1 and the second read data line RDL2 in the memory cell 100 in FIG. 1 are electrically connected to a reading circuit. FIGS. 3A and 3B show an example of the reading circuit.

A reading circuit 110 in FIG. 3A includes a transistor 111, a transistor 112, a latch circuit 113, and a latch circuit 114. Note that in this embodiment, the transistors 111 and 112 are p-channel transistors; however, one embodiment of the disclosed invention is not limited thereto, and the transistors 111 and 112 may be n-channel transistors. In addition, in this embodiment, an example where the latch circuits 113 and 114 are each composed of two inverters is described, one embodiment of the disclosed invention is not limited thereto.

In the reading circuit 110 in FIG. 3A, a gate electrode of the transistor 111 is electrically connected to a precharge signal line PC, a source electrode of the transistor 111 is electrically connected to a power supply line at a high potential H, and a drain electrode of the transistor 111 is electrically connected to the first read data line RDL1. A terminal of the latch circuit 113 is electrically connected to the first read data line RDL1. A gate electrode of the transistor 112 is electrically connected to the precharge signal line PC, a source electrode of the transistor 112 is electrically connected to the power supply line at a high potential H, and a drain electrode of the transistor 112 is electrically connected to the second read data line RDL2. A terminal of the latch circuit 114 is electrically connected to the second read data line RDL2.

The latch circuits 113 and 114 can hold a high potential H or a low potential L which is applied to the first read data line RDL1 and the second read data line RDL2, and can supply a high potential H or a low potential L from the power supply line provided in the latch circuits 113 and 114 to the first read data line RDL1 and the second read data line RDL2.

In the reading circuit 110, by application of a low potential L to the precharge signal line PC, the transistors 111 and 112 are turned on; accordingly, a high potential H is applied to the first read data line RDL1 and the second read data line RDL2. Hereinafter, the operation is also referred to as precharge. At the same time, the latch circuits 113 and 114 hold a high potential H.

After the precharge, when the transistors 111 and 112 are turned off by application of a high potential H to the precharge signal line PC, the first power supply line 107 is electrically connected to the first read data line RDL1 and the second read data line RDL2 through the transistor 103. In this case, when the transistor 103 is on, a low potential L is applied to the first read data line RDL1 and the second read data line RDL2. At the same time, a low potential L is held in the latch circuits 113 and 114. In addition, when the transistor 103 is off, a high potential H held in the latch circuits 113 and 114 is applied to the first read data line RDL1 and the second read data line RDL2 and a precharged high potential H is kept.

In such a manner, a change in potentials of the first read data line RDL1 and the second read data line RDL2 after precharge enables data written to the memory cell 100 to be read.

A reading circuit 115 illustrated in FIG. 3B includes the transistor 111, the transistor 112, a sense amplifier circuit 117, and a sense amplifier circuit 118. That is, the reading circuit 115 has the sense amplifier circuits 117 and 118, whereas the reading circuit 110 has the latch circuits 113 and 114.

A first terminal of the sense amplifier circuit 117 is electrically connected to the first read data line RDL1, a reference potential Vref is applied to a second terminal of the sense amplifier circuit 117, and a data signal is output from a third terminal of the sense amplifier circuit 117. A first terminal of the sense amplifier circuit 118 is electrically connected to the second read data line RDL2, the reference potential Vref is applied to a second terminal of the sense amplifier circuit 118, and a data signal is output from a third terminal of the sense amplifier circuit 118. Here, the reference potential Vref is a potential between a low potential L and a high potential H and preferably at about the midpoint between a low potential L and a high potential H.

In the reading circuit 115, as in the reading circuit 110, the first read data line RDL1 and the second read data line RDL2 can perform precharge. After the precharge, when the transistors 111 and 112 are turned off by application of a high potential H to the precharge signal line PC, the first power supply line 107 is electrically connected to the first read data line RDL1 and the second read data line RDL2 through the transistor 103.

In this case, when the transistor 103 is on, a low potential L is applied to the first read data line RDL1 and the second read data line RDL2, so that the potentials of the first read data line RDL1 and the second read data line RDL2 each become lower than the reference potential Vref of the sense amplifier circuits 117 and 118. As a result, a data signal which is amplified is output from the sense amplifier circuits 117 and 118. In addition, when the transistor 103 is off, a high potential H precharged by the first read data line RDL1 and the second read data line RDL2 is kept and is still higher than the reference potential Vref of the sense amplifier circuits 117 and 118, so that the amplified data signal is output from the sense amplifier circuits 117 and 118.

Note that in this embodiment, the reading circuit 110 in FIG. 3A is used.

Figure 4:
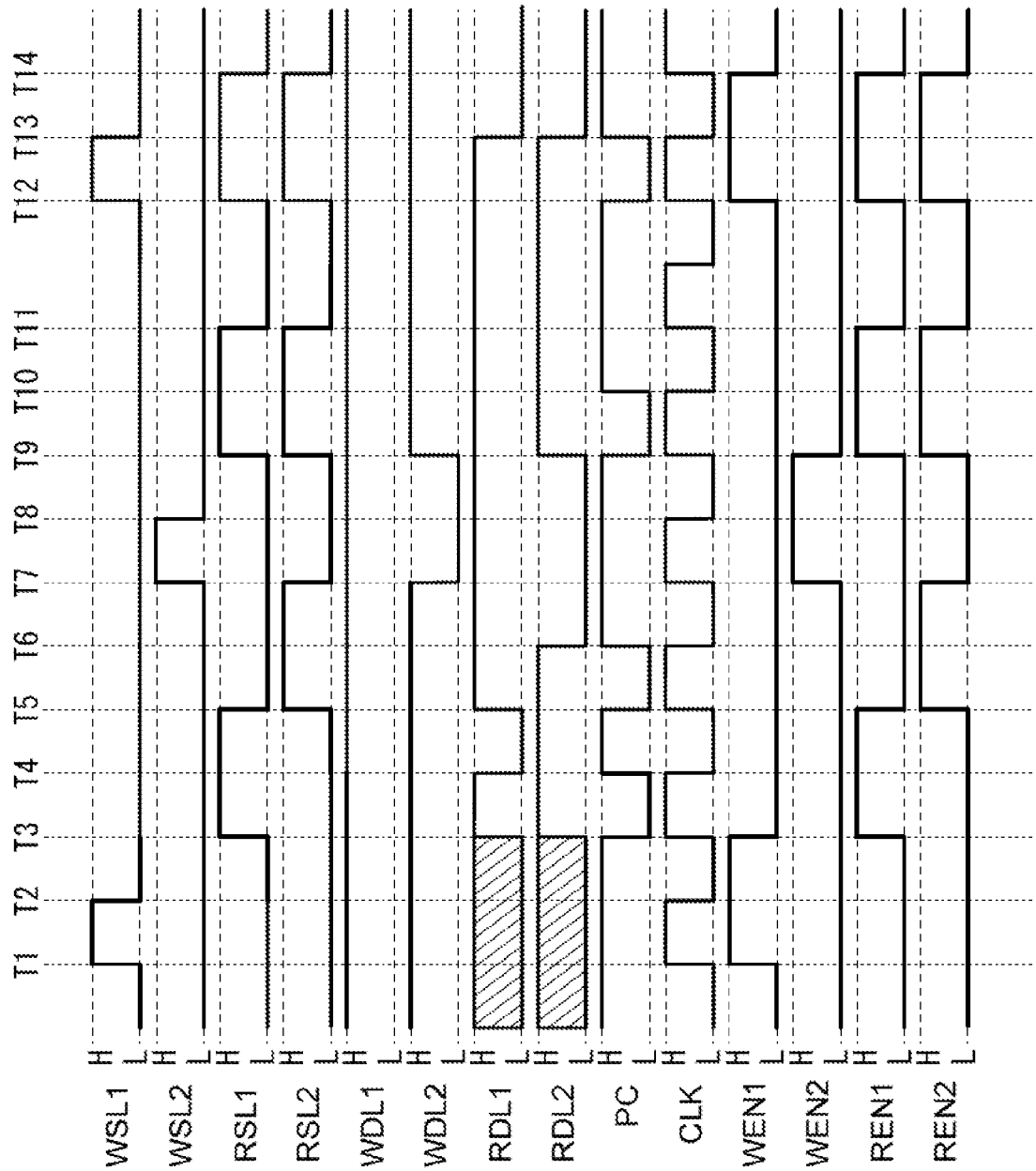
FIG. 4 is a timing diagram of a memory device according to one embodiment of the disclosed invention.

The operation of the memory device in FIG. 1 is described with reference to a timing diagram in FIG. 4. The timing diagram in FIG. 4 shows the potentials of the first write selection line WSL1, the second write selection line WSL2, the first read selection line RSL1, the second read selection line RSL2, the first write data line WDL1, the second write data line WDL2, the first read data line RDL1, the second read data line RDL2, and the precharge signal line PC, from time T1 to time T14. In addition, CLK, WEN1, WEN2, REN1, and REN2 represent signals transmitted from the controller 13 to a driver circuit connected to the above wirings and represent a clock signal CLK, a first write enable signal WEN1, a second write enable signal WEN2, a first read enable signal REN1, and a second read enable signal REN2, respectively.

The first write enable signal WEN1 and the second write enable signal WEN2 show a writing period, and data writing operation is performed when the signals are each a high potential H. The first write enable signal WEN1 and the second write enable signal WEN2 are connected to the first processor 11 and the second processor 12, respectively. In addition, the first read enable signal REN1 and the second read enable signal REN2 show a reading period, and data reading operation is performed when the signals are each a high potential H. The first read enable signal REN1 and the second read enable signal REN2 are connected to the first processor 11 and the second processor 12.

The timing diagram in FIG. 4 shows a first data writing/reading operation from the time T1 to the time T7, a second data writing/reading operation from the time T7 to the time T11, and the third data writing/reading operation from the time T12 to the time T14. Here, the first to third data writing/reading operations are continuously performed in synchronization with the clock signal CLK input from the controller 13.

Note that in this embodiment, the state where a low potential L is held at the node FG in the memory cell 100 is a state where data "0" is held. In addition, the state where a high potential H is held at the node FG in the memory cell 100 is a state where data "1" is held.

First, the first data writing/reading operation from the time T1 to the time T7 is described. The first data writing/reading operation is performed as follows: data "1" is written from the first processor 11 (the time T1 to the time T3), the data "1" is read to the first processor 11 (the time T3 to the time T5), and the data "1" is read to the second processor 12 (the time T5 to the time T7).

In writing of the data "1" from the first processor 11, a high potential H is supplied from the controller 13 as the first write enable signal WEN1, and a high potential H is supplied to the first write selection line WSL1 and the first write data line WDL1 from the time T1 to the time T2. Accordingly, the transistor 101 is turned on, and a high potential H of the first write data line WDL1 is applied to the gate electrode of the transistor 103 (the node FG).

From the time T2 to the time T3, the first write enable signal WEN1 keeps a high potential H, the potential of the first write selection line WSL1 is set to be a low potential L, and the first write data line WDL1 keeps being at a high potential H. Accordingly, since the transistor 101 is turned off while the potential of the first write data line WDL1 is a high potential H, the potential applied to the gate electrode of the transistor 103 (the node FG) is held. As a result, the transistor 103 keeps being on and the data "1" is written.

In a period from the time T1 to the time T3 during which data is written from the first processor 11, data is not written from the second processor 12. Accordingly, the second write enable signal WEN2 is a low potential L, and the second write selection line WSL2 is also at a low potential L. As a result, the transistor 102 is off. At this time, the second write data line WDL2 is at a high potential H.

In the period from T1 to T3 during which data is written from the first processor 11, data is not read to the first processor 11 and the second processor 12. Accordingly, the first read enable signal REN1 and the second read enable signal REN2 are a low potential L, and the first read selection line RSL1 and the second read selection line RSL2 also become a low potential L. As a result, the transistors 104 and 105 become off. At this time, the precharge signal line PC is at a high potential H; accordingly, the transistors 111 and 112 are off and the first read data line RDL1 and the second read data line RDL2 are in a floating state.

In reading of the data "1" to the first processor 11, from the time T3 to the time T4, a high potential H is supplied from the controller 13 as the first read enable signal REN1, and a low potential L is applied to the precharge signal line PC and a high potential H is applied to the first read selection line RSL1. By application of a low potential L to the precharge signal line PC, a high potential H is applied to the first read data line RDL1 through the transistor 111. At this time, the latch circuit 113 holds a high potential H. In addition, a high potential H is applied to the first read selection line RSL1, so that the transistor 104 is turned on. Further, by writing of the data "1" from the time T1 to the time T3, the transistor 103 is also turned on.

From the time T4 to the time T5, the first read enable signal REN1 is a high potential H, the precharge signal line PC is at a high potential H, and the first read selection line RSL1 is at a high potential H. Accordingly, electrical continuity is established between the first read data line RDL1 and the first power supply line 107, and therefore the potential of the first read data line RDL1 is a low potential L. In this manner, a potential is applied to the first read data line RDL1 in accordance with the potential written to the node FG of the memory cell 100. As a result, the data of the memory cell 100 can be read.

A potential applied to the first read data line RDL1 is transmitted to the controller 13 as a read data signal, and the data "1" is given to the first processor 11. In this manner, the data "1" written from the first processor 11 is read to the first processor 11.

In a period from the time T3 to the time T5 during which the data is read to the first processor 11, the data is not read to the second processor 12; therefore, the second read enable signal REN2 is a low potential L and the second read selection line RSL2 is at a low potential L. Accordingly, the transistor 105 is off. At this time, the precharge signal line PC is at a low potential L from the time T3 to the time T4, and therefore, the transistor 112 is turned on and the second read data line RDL2 is at a high potential H.

In the period from T3 to T5 during which the data is read to the first processor 11, data is not written from the first processor 11 and the second processor 12. Accordingly, the first write enable signal WEN1 and the second write enable signal WEN2 are a low potential L, and the first write selection line WSL1 and the second write selection line WSL2 are also at a low potential L. As a result, the transistors 101 and 102 are off. At this time, the first write data line WDL1 and the second write data line WDL2 are at a high potential H.

In reading of the data "1" to the second processor 12, from the time T5 to the time T6, a high potential H is supplied from the controller 13 as the second read enable signal REN2, and a low potential L is applied to the precharge signal line PC and a high potential H is applied to the second read selection line RSL2. By application of a low potential L to the precharge signal line PC, a high potential H is applied to the second read data line RDL2 through the transistor 112. At this time, the latch circuit 114 holds a high potential H. In addition, a high potential H is applied to the second read selection line RSL2, so that the transistor 105 is turned on. Further, by writing of the data "1" from the time T1 to the time T3, the transistor 103 is also on.

From the time T6 to the time T7, the second read enable signal REN2 is a high potential H, the precharge signal line PC is at a high potential H, and the second read selection line RSL2 is at a high potential H. Accordingly, electrical continuity is established between the second read data line RDL2 and the first power supply line 107, and therefore the potential of the second read data line RDL2 is a low potential L. In this manner, a potential is applied to the second read data line RDL2 in accordance with the potential written to the node FG of the memory cell 100. As a result, the data of the memory cell 100 can be read.

A potential applied to the second read data line RDL2 is transmitted to the controller 13 as a read data signal, and the data "1" is given to the second processor 12. In this manner, the data "1" written from the first processor 11 is read to the second processor 12.

In a period from the time T5 to the time T7 during which the data is read to the second processor 12, the data is not read to the first processor 11; therefore, the first read enable signal REN1 is a low potential L and the first read selection line RSL1 is at a low potential L. Accordingly, the transistor 104 is turned off. At this time, the precharge signal line PC is at a low potential L from the time T5 to the time T6, and therefore, the transistor 111 is on and the first read data line RDL1 is at a high potential H.

In a period from the time T5 to the time T7 during which the data is read to the second processor 12, the data is not written from the first processor 11 and the second processor 12, as in the period from the time T3 to the time T5.

As illustrated in FIG. 1, a plurality of data write transistors of a memory cell and a plurality of data read transistors of a memory cell are provided in accordance with the number of connected processors. Thus, data writing operation and data reading operation can be successively performed.

Next, the second data writing/reading operation from the time T7 to the time T11 is described. The second data writing/reading operation is performed as follows: data "0" is written from the second processor 12 (the time T7 to the time T9), and the data "0" is read to the first processor 11 and the second processor 12 (the time T7 to the time T11). That is, the second data writing/reading operation is different from the first data writing/reading operation in that the data "0" is first written from the second processor 12 and the data "0" is read to the first processor 11 and the second processor 12 at the same time.

In writing of the data "0" from the second processor 12, a high potential H is supplied from the controller 13 as the second write enable signal WEN2, and a high potential H is supplied to the second write selection line WSL2 and the second write data line WDL2 from the time T7 to the time T8. Accordingly, the transistor 102 is turned on, and a low potential L of the second write data line WDL2 is applied to the gate electrode of the transistor 103 (the node FG).

From the time T8 to the time T9, the second write enable signal WEN2 is a high potential H, the potential of the second write selection line WSL2 is at a low potential L, and the second write data line WDL2 is at a low potential L. Accordingly, since the transistor 102 is turned off while the potential of the second write data line WDL2 is a low potential L, the potential applied to the gate electrode of the transistor 103 (the node FG) is held. As a result, the transistor 103 is off and the data "0" is written.

Note that a potential corresponding to data is held at the node FG in advance. That is, even when data is written, the data can be easily rewritten by applying a potential corresponding to new data in this manner.

In a period from the time T7 to the time T9 during which the data is written from the second processor 12, the data is not written from the first processor 11; therefore, the first write enable signal WEN1 is a low potential L and the first write selection line WSL1 is at a low potential L. Accordingly, the transistor 101 is off. At this time, the first write data line WDL1 is at a high potential H.

In a period from the time T7 to the time T9 during which data is written from the second processor 12, data is not read to the first processor 11 and the second processor 12, as in a period from the time T1 to the time T3.

In reading of the data "0" to the first processor 11 and the second processor 12, from the time T9 to the time T10, a high potential H is supplied from the controller 13 as the first read enable signal REN1 and the second read enable signal REN2, and a low potential L is applied to the precharge signal line PC and a high potential H is applied to the first read selection line RSL1 and the second read selection line RSL2. By application of a low potential L to the precharge signal line PC, a high potential H is applied to the first read data line RDL1 through the transistor 111 and a high potential H is applied to the second read data line RDL2 through the transistor 112. At this time, the latch circuits 113 and 114 hold a high potential H. In addition, a high potential H is applied to the first read selection line RSL1, so that the transistor 104 is turned on. Further, a high potential H is applied to the second read selection line RSL2, so that the transistor 105 is also on. Further, by writing of the data "0" from the time T7 to the time T9, the transistor 103 is off.

From the time T10 to the time T11, the first read enable signal REN1 and the second read enable signal REN2 are a high potential H, the precharge signal line PC is at a high potential H, and the first read selection line RSL1 and the second read selection line RSL2 are at a high potential H. Here, unlike a period from the time T4 to the time T5, the transistor 103 is off. Accordingly, electrical continuity is not established between the first read data line RDL1 and the first power supply line 107 and between the second read data line RDL2 and the first power supply line 107. Therefore, the first read data line RDL1 and the second read data line RDL2 are at a high potential H. In this manner, a potential is applied to the first read data line RDL1 and the second read data line RDL2 in accordance with the potential written to the node FG of the memory cell 100. As a result, the data of the memory cell 100 can be read.

A potential applied to the first read data line RDL1 and the second read data line RDL2 is transmitted to the controller 13 as a read data signal, and the data "0" is given to the first processor 11 and the second processor 12. In this manner, the data "0" written from the second processor 12 is read to the first processor 11 and the second processor 12.

In a period from the time T9 to the time T11 during which data is read to the first processor 11 and the second processor 12, data is not written from the first processor 11 and the second processor 12, as in the period from the time T3 to the time T5.

As illustrated in FIG. 1, a plurality of data write transistors of a memory cell and a plurality of data read transistors of a memory cell are provided in accordance with the number of connected processors. Thus, data writing operation and data reading operation can be successively performed and data can be read to a plurality of processors at the same time.

Next, the third data writing/reading operation from the time T12 to the time T14 is described. The third data writing/reading operation is as follows: the data "1" is written from the first processor 11 and the data "1" is read to the first processor 11 and the second processor 12. The third data writing/reading operation is the operation performing all of the following operations at the same time: the data "1" is written from the first processor 11 (the time T1 to the time T3), the data "1" is read to the first processor 11 (the time T3 to the time T5), and the data "1" is read to the second processor 12 (the time T5 to the time T7).

In writing of the data "1" from the first processor 11, a high potential H is supplied from the controller 13 as the first write enable signal WEN1, and a high potential H is supplied to the first write selection line WSL1 and the first write data line WDL1 from the time T12 to the time T13. Accordingly, the transistor 101 is turned on, and a high potential H of the first write data line WDL1 is applied to the gate electrode of the transistor 103 (the node FG).

In reading of the data "1" to the first processor 11 and the second processor 12, from the time T12 to the time T13, a high potential H is supplied from the controller 13 as the first read enable signal REN1 and the second read enable signal REN2, and a low potential L is applied to the precharge signal line PC and a high potential H is applied to the first read selection line RSL1 and the second read selection line RSL2. By application of a low potential L to the precharge signal line PC, a high potential H is applied to the first read data line RDL1 through the transistor 111 and a high potential H is applied to the second read data line RDL2 through the transistor 112. At this time, the latch circuits 113 and 114 hold a high potential H. In addition, a high potential H is applied to the first read selection line RSL1, so that the transistor 104 is on. Further, a high potential H is applied to the second read selection line RSL2, so that the transistor 105 is also on. Further, by writing of the data "1" performed at the same time, the transistor 103 is also turned on.

From the time T13 to the time T14, the first write enable signal WEN1 is a high potential H, the potential of the first write selection line WSL1 is a low potential L, and the first write data line WDL1 is at a high potential H. Accordingly, since the transistor 101 is turned off while the potential of the first write data line WDL1 is a high potential H, the potential applied to the gate electrode of the transistor 103 (the node FG) is held. As a result, the transistor 103 is on and the data "1" is written.

At this time, from the time T13 to the time T14, the first read enable signal REN1 and the second read enable signal REN2 are a high potential H, the precharge signal line PC is at a high potential H, and the first read selection line RSL1 and the second read selection line RSL2 are at a high potential H. Accordingly, electrical continuity is established between the first read data line RDL1 and the first power supply line 107 and between the second read data line RDL2 and the first power supply line 107. Thus, the potential of the first read data line RDL1 and the potential of the second read data line RDL2 are a low potential L. In this manner, a potential is applied to the first read data line RDL1 and the second read data line RDL2 in accordance with the potential written to the node FG of the memory cell 100. As a result, the data of the memory cell 100 can be read.

A potential applied to the first read data line RDL1 and the second read data line RDL2 is transmitted to the controller 13 as a read data signal, and the data "1" is given to the first processor 11 and the second processor 12. In this manner, the data "1" written from the first processor 11 is read to the first processor 11 and the second processor 12.

In a period from the time T12 to the time T14 during which the data is written from the first processor 11, as in the period from the time T1 to the time T3, data is not written from the second processor 12.

As illustrated in FIG. 1, a plurality of data write transistors of a memory cell and a plurality of data read transistors of a memory cell are provided in accordance with the number of connected processors. Thus, data writing operation and data reading operation can be performed at the same time and data can be read to a plurality of processors.

Next, a memory cell array 120 including the plurality of memory cells 100 in FIG. 1, a memory device including the memory cell array 120, and the operation of the memory cell array and the memory device will be described with reference to FIG. 5 and FIG. 6. Note that the memory cell array 120 illustrated in FIG. 5 can be used as the memory device 14 in the semiconductor device in FIG. 2.

Figure 5:
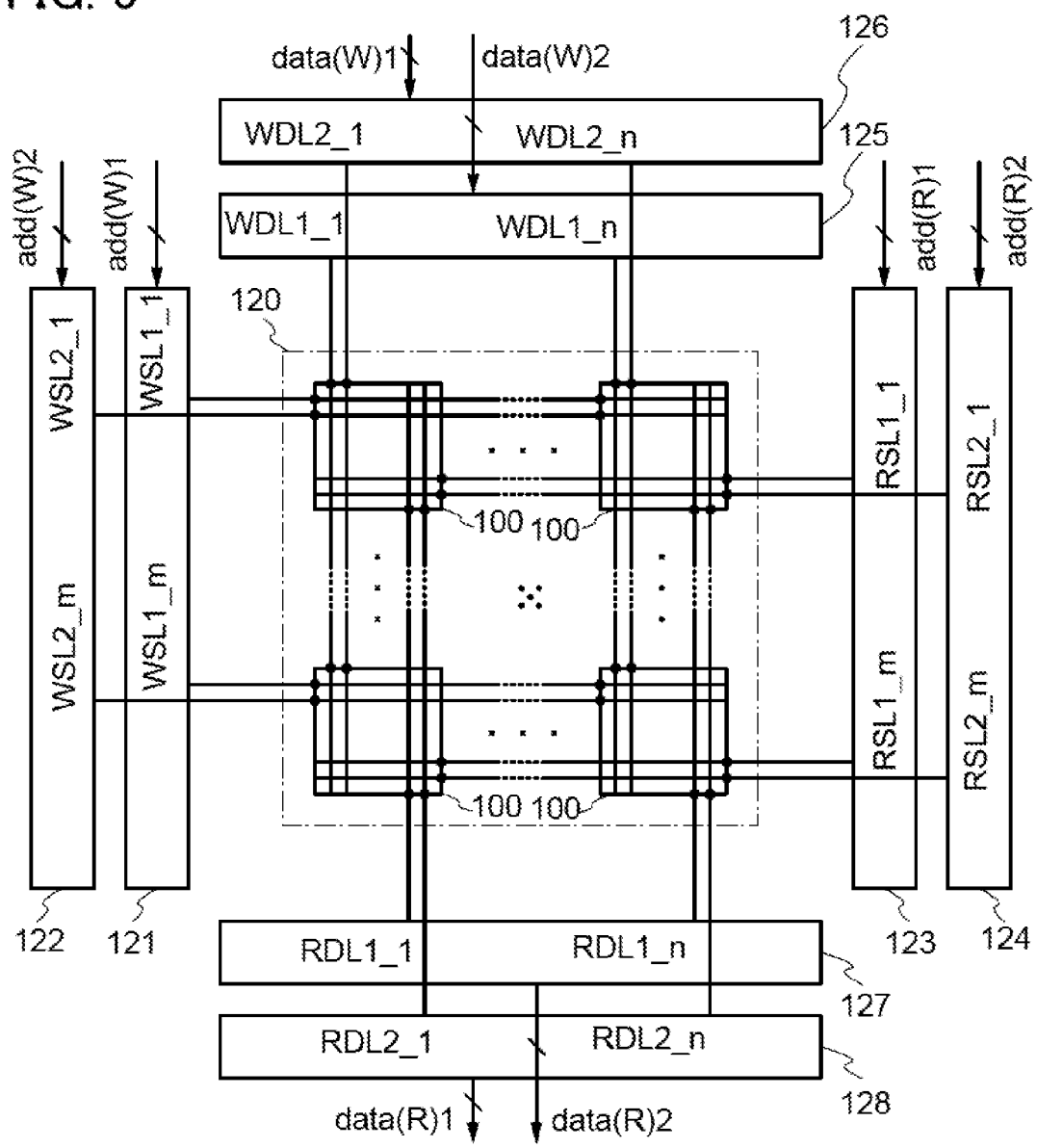
FIG. 5 is a block diagram of a memory device according to one embodiment of the disclosed invention.

FIG. 5 is an example of a block diagram of the memory cell array 120 including (m×n) memory cells 100. Here, the structure of the memory cell 100 in FIG. 5 is substantially the same as that in FIG. 1.

The memory device in FIG. 5 includes the memory cell array 120 in which the memory cells 100 are arranged in a matrix of m rows and n columns (m and n are natural numbers of 2 or more). The memory cell array 120 includes m first write selection lines WSL1_1 to WSL1_$m$, m second write selection lines WSL2_1 to WSL2_$m$, m first read selection lines RSL1_1 to RSL1_$m$, and the m second read selection lines RSL2_1 to RSL2_$m$, which are extended in the row direction. In addition, the memory cell array 120 includes n first write data lines WDL1_1 to WDL1_$n$, n second write data lines WDL2_1 to WDL2_$n$, n first read data lines RDL1_1 to RDL1_$n$, and n second read data lines RDL2_1 to RDL2_$n$, which are extended in the column direction. Note that these wirings are electrically connected to elements included in the memory cell 100, as similar to those in FIG. 1. Note that the plurality of memory cells 100 arranged in the row direction shares the wiring extended in the row direction. Note that the plurality of memory cells 100 arranged in the column direction shares the wiring extended in the column direction.

Note that in FIG. 5, the first power supply line 107 and the second power supply line 108 in FIG. 1 are omitted for easy understanding. Needless to say, as illustrated in FIG. 1, the plurality of memory cells 100 arranged in the column direction can share the first power supply line 107 and the second power supply line 108 which are extended in the column direction. Alternatively, the plurality of memory cells 100 arranged in the row direction can share the first power supply line 107 and the second power supply line 108 which are extended in the row direction.

The m first write selection lines WSL1_1 to WSL1_$m$ are electrically connected to a first driving circuit 121. The m second write selection lines WSL2_1 to WSL2_$m$ are electrically connected to a second driving circuit 122. The m first read selection lines RSL1_1 to RSL1_$m$ are electrically connected to a third driving circuit 123. The m second read selection lines RSL2_1 to RSL2_$m$ are electrically connected to a fourth driving circuit 124.

The n first write data lines WDL1_1 to WDL1_$n$ are electrically connected to a fifth driving circuit 125. The n second write data lines WDL2_1 to WDL2_$n$ are electrically connected to a sixth driving circuit 126. The n first read data lines RDL1_1 to RDL1_$n$ are electrically connected to a seventh driving circuit 127. The n second read data lines RDL2_1 to RDL2_$n$ are electrically connected to an eighth driving circuit 128.

The first driving circuit 121 supplies an appropriate potential to the first write selection lines WSL1_1 to WSL1_$m$ in accordance with a data writing instruction from the first processor 11 and the values of the first write enable signal WEN1 and a first writing address signal add(W)1 which are transmitted from the controller 13. The second driving circuit 122 supplies an appropriate potential to the second write selection lines WSL2_1 to WSL2_$m$ in accordance with a data writing instruction from the second processor 12 and the values of the second write enable signal WEN2 and a second writing address signal add(W)2 which are transmitted from the controller 13. The third driving circuit 123 supplies an appropriate potential to the first read selection lines RSL1_1 to RSL1_$m$ in accordance with a data reading instruction from the first processor 11 and the values of the first read enable signal REN1 and a first reading address signal add(R)1 which are transmitted from the controller 13. The fourth driving circuit 124 supplies an appropriate potential to the second read selection lines RSL2_1 to RSL2_$m$ in accordance with a data reading instruction from the second processor 12 and the values of the second read enable signal REN2 and the second reading address signal add(R)2 which are transmitted from the controller 13.

The fifth driving circuit 125 supplies an appropriate potential to the first write data lines WDL1_1 to WDL1_$n$ in accordance with a data writing instruction from the first processor 11 and the values of the first write enable signal WEN1 and a first write data signal data(W)1 which are transmitted from the controller 13. The sixth driving circuit 126 supplies an appropriate potential to the second write data lines WDL2_1 to WDL2_$n$ in accordance with a data writing instruction from the second processor 12 and the values of the second write enable signal WEN2 and a second write data signal data(W)2 which are transmitted from the controller 13. The seventh driving circuit 127 supplies a low potential L to the precharge signal line PC in accordance with a data reading instruction from the first processor 11 and the value of the first read enable signal REN1 transmitted from the controller 13 so that the first read data lines RDL1_1 to RDL1_$n$ are precharged. The potentials of the first read data lines RDL1_1 to RDL1_$n$ which are obtained by post-precharge data read are given to the controller 13 as a first read data signal data (R)1. The eighth driving circuit 128 supplies a low potential L to the precharge signal line PC in accordance with a data reading instruction from the second processor 12 in accordance with the value of the second read enable signal REN2 transmitted from the controller 13 so that the second read data lines RDL2_1 to RDL2_$n$ are precharged. The potentials of the second read data lines RDL2_1 to RDL2_$n$ which are obtained by post-precharge data read are given to the controller 13 as a second read data signal data(R)2.

Note that in the case of using the reading circuit in FIG. 3A or 3B, reading circuits may be separately provided for the seventh driving circuit 127 and the eighth driving circuit 128, or a reading circuit may be provided for the seventh driving circuit 127 and the eighth driving circuit 128 to share the precharge signal line PC. In this embodiment, reading circuits in the seventh driving circuit 127 and the eighth driving circuit 128 share a precharge signal line.

Note that the structures of the first driving circuit 121 to the eighth driving circuit 128 are not limited to the above structures. For example, the locations of the first driving circuit 121 to the eighth driving circuit 128 may be changed, or one driver circuit may have the functions of two or more of the first driving circuit 121 to the eighth driving circuit 128.

The operation of the memory device in FIG. 5 will be described with reference to a timing diagram in FIG. 6. The timing diagram in FIG. 6 shows the potentials of the first write selection line WSL1, the second write selection line WSL2, the first read selection line RSL1, the second read selection line RSL2, the first write data line WDL1, the second write data line WDL2, the first read data line RDL1, the second read data line RDL2, and the precharge signal line PC, from the time T1 to the time T5. Note that CLK, WEN1, WEN2, REN1, and REN2 represent the same signals as those in the timing diagram in FIG. 4. In addition, add(W)1, add(W)2, add(R)1, and add(R)2 represent the first writing address signal add(W)1, the second writing address signal add(W)2, the first reading address signal add(R)1, and the second reading address signal add(R)2, respectively. Note that the number in a writing address signal and a reading address signal in the timing diagram indicates the number of rows selected by the signal, and a cross means that any wiring is not selected by the address signal.

Note that for simplicity, the memory cell array 120 where the memory cells 100 are arranged in 2 (rows)×2 (columns) is described, for example. In addition, in the timing diagram, "_1" and "_2" added to the end of wiring names represent wiring's positions in rows or columns. Hereinafter, in the case of describing the structure of the memory cell 100 in k-th row and n-th column, the memory cell is sometimes denoted by [k, n].

The first processor 11 and the second processor 12 perform data writing operation and data reading operation on the memory cell array 120 by row. In the timing diagram in FIG. 6, first, the first processor 11 writes data to memory cells in the first row, and at the same time, the second processor 12 writes data to memory cells in the second row. After the data write, the first processor 11 reads data from the memory cells in the first row, and at the same time, the second processor 12 reads data from the memory cells in the second row.

Figure 6:
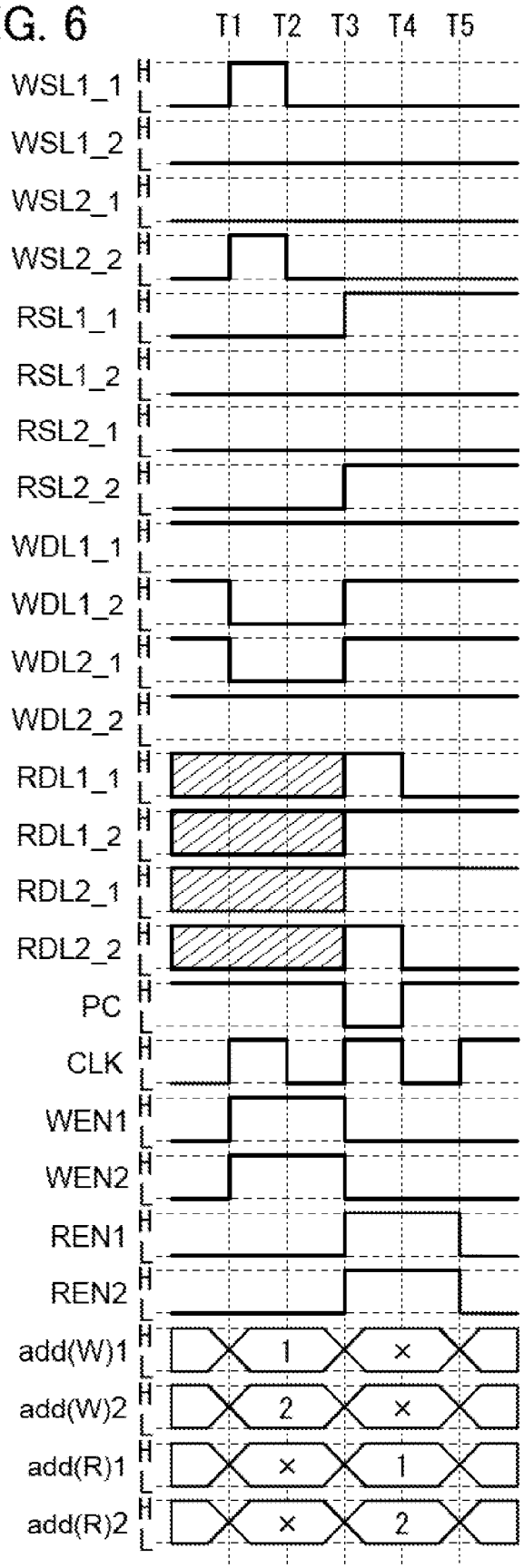
FIG. 6 is a timing diagram of a memory device according to one embodiment of the disclosed invention.

More specifically, according to the timing diagram in FIG. 6, first, the following operations are performed at the same time in the period from the time T1 to the time T3: the first processor 11 writes data "1" to the first-row and first-column memory cell 100[1, 1], the first processor 11 writes data "0" to the first-row and second-column memory cell 100[1, 2], the second processor 12 writes data "0" to the second-row and first-column memory cell 100[2, 1], and the second processor 12 writes data "1" to the second-row and second-column memory cell 100[2, 2]. Then, the following operations are performed at the same time in the period from the time T3 to the time T5: the data "1" of the first-row and first-column memory cell 100[1, 1] is read to the first processor 11, the data "0" of the first-row and second-column memory cell 100[1, 2] is read to the first processor 11, the data "0" of the second-row and first-column memory cell 100[2, 1] is read to the second processor 12, and the data "1" of the second-row and second-column memory cell 100[2, 2] is read to the second processor 12. Here, the data writing operation and the data reading operation are sequentially performed in synchronization with the clock signal CLK input from the controller 13. The operation is described below in detail with reference to the timing diagram in FIG. 6.

First, from the time T1 to the time T2, the controller 13 supplies a high potential H as the first write enable signal WEN1 and the first writing address signal add(W)1 for selecting the first write selection line WSL1_1 to the first driving circuit 121. In addition, the controller 13 supplies a high potential H as the second write enable signal WEN2 and the second writing address signal add(W)2 for selecting the second write selection line WSL2_2 to the second driving circuit 122. In response to the operation, a high potential H is supplied to the first write selection line WSL1_1 and the second write selection line WSL2_2, and a low potential L is supplied to the first write selection line WSL1_2 and the second write selection line WSL2_1. Accordingly, the transistor 101[1, 1], the transistor 101[1, 2], the transistor 102[2, 1], and the transistor 102[2, 2] are turned on, and the transistor 101[2, 1], the transistor 101[2, 2], the transistor 102[1, 1], and the transistor 102[1, 2] are turned off.

At this time, the controller 13 supplies a high potential H as the first write enable signal WEN1 and the first write data signal data(W)1 to the fifth driving circuit 125. In addition, the controller 13 supplies a high potential H as the second write enable signal WEN2 and the second write data signal data(W)2 to the sixth driving circuit 126. In response to the operation, a high potential H is supplied to the first write data line WDL1_1 and the second write data line WDL2_2, and a low potential L is supplied to the first write data line WDL1_2 and the second write data line WDL2_1. Accordingly, a high potential H at the first write data line WDL1_1 is supplied to the node FG[1, 1] through the transistor 101[1, 1] which is in an on state, and a high potential H at the second write data line WDL2_2 is supplied to the node FG[2, 2] through the transistor 102[2, 2] which is in an on state. In addition, a low potential L at the first write data line WDL1_2 is supplied to the node FG[1, 2] through the transistor 101[1, 2] which is in an on state, and a low potential L at the second write data line WDL2_1 is supplied to the node FG[2, 1] through the transistor 102[2, 1] which is in an on state. Note that at this time, the transistor 102 of the memory cell 100 in the first row and the transistor 101 of the memory cell 100 in the second row are in an off state, and therefore, unnecessary potential is prevented from being applied to the node FG of each memory cell 100.

From the time T2 to the time T3, the first write enable signal WEN1 and the second write enable signal WEN2 are a high potential H, and the first writing address signal add(W)1 and the second writing address signal add(W)2 are kept. Here, the first write selection line WSL1_1, the first write selection line WSL1_2, the second write selection line WSL2_1, and the second write selection line WSL2_2 are at a low potential L. On the other hand, the potentials of the first write data line WDL1_1, the first write data line WDL1_2, the second write data line WDL2_1, and the second write data line WDL2_2 are kept. Accordingly, the transistor 101[1, 1] is turned off while the potential of the first write data line WDL1_1 is held; therefore, the potential supplied to the node FG[1, 1] is held. The same is applied to the transistor 101[1, 2], the transistor 102[2, 1], and the transistor 102[2, 2]. In this manner, the data "1" is written to the memory cell 100[1, 1], the data "0" is written to the memory cell 100[1, 2], the data "0" is written to the memory cell 100[2, 1], and the data "1" is written to the memory cell 100[2, 2].

In the period from the time T1 to the time T3 during which data is written from the first processor 11 and the second processor 12, as in the period from the time T1 to the time T3 in the timing diagram in FIG. 4, data is not read to the first processor 11 and the second processor 12.

As illustrated in FIG. 1, a plurality of data write transistors of a memory cell and a plurality of data read transistors of a memory cell are provided in accordance with the number of connected processors. Thus, data writing operation can be performed on memory cells in different rows of a memory cell array at the same time.

First, from the time T3 to the time T4, the controller 13 supplies a high potential H as the first read enable signal REN1 and the first reading address signal add(R)1 for selecting the first read selection line RSL1_1 to the third driving circuit 123. In addition, the controller 13 supplies a high potential H as the second read enable signal REN2 and the second reading address signal add(R)2 for selecting the second read selection line RSL2_2 to the fourth driving circuit 124. In response to the operation, a high potential H is supplied to the first read selection line RSL1_1 and the second read selection line RSL2_2, and a low potential L is supplied to the first read selection line RSL1_2 and the second read selection line RSL2_1. Accordingly, the transistor 104[1, 1], the transistor 104[1, 2], the transistor 105[2, 1], and the transistor 105[2, 2] are on, and the transistor 104[2, 1], the transistor 104[2, 2], the transistor 105[1, 1], and the transistor 105[1, 2] are off.

At this time, the controller 13 supplies a high potential H as the first read enable signal REN1 to the seventh driving circuit 127, and the controller 13 supplies a high potential H as the second read enable signal REN2 to the eighth driving circuit 128. In response to the operation, a low potential L is supplied to the precharge signal line PC. Accordingly, a high potential H is supplied to the first read data line RDL1_1, the first read data line RDL1_2, the second read data line RDL2_1, and the second read data line RDL2_2. At this time, a latch circuit that is electrically connected to wirings holds a high potential H.

From the time T4 to the time T5, the first read enable signal REN1 and the second read enable signal REN2 are a high potential H, and the first reading address signal add(R)1 and the second reading address signal add(R)2 are kept. The potential of the precharge signal line PC becomes a high potential H, and the potentials of the first read selection line RSL1_1, the first read selection line RSL1_2, the second read selection line RSL2_1, and the second read selection line RSL2_2 are kept. Here, since the transistor 103[1, 1] and the transistor 103[2, 2] are in an on state, electrical continuity is established between the first read data line RDL1_1 and the first power supply line 107 and between the second read data line RDL2_2 and the first power supply line 107. Accordingly, the potentials of the first read data line RDL1_1 and the second read data line RDL2_2 are lowered to a low potential L. On the other hand, since the transistor 103[1, 2] and the transistor 103[2, 1] are in an off state, electrical continuity is not established between the first read data line RDL1_2 and the first power supply line 107 and between the second read data line RDL2_1 and the first power supply line 107. Accordingly, the first read data line RDL1_2 and the second read data line RDL2_1 are at a high potential H. In this manner, a potential is applied to the first read data line RDL1_1, the first read data line RDL1_2, the second read data line RDL2_1, and the second read data line RDL2_2 in accordance with the potential written to the nodes FG of the memory cells 100. As a result, data of the memory cells 100 can be read.

The potential applied to the first read data line RDL1_1 and the first read data line RDL1_2 is transmitted to the controller 13 as a read data signal data(R)1 through the seventh driving circuit 127, and the data "1" in the memory cell 100[1, 1] and the data "0" in the memory cell 100[1, 2] are given to the first processor 11. The potential applied to the second read data line RDL2_1 and the second read data line RDL2_2 is transmitted to the controller 13 as a read data signal data(R)2 through the eighth driving circuit 128, and the data "0" in the memory cell 100[2, 1] and the data "1" in the memory cell 100[2, 2] are given to the second processor 12.

In this manner, data written from the first processor 11 and the second processor 12 from the time T1 to the time T3 is read to the first processor 11 and the second processor 12 from the time T3 to the time T5.

In a period from the time T3 to the time T5 during which data is read to the first processor 11 and the second processor 12, as in the period from the time T1 to the time T3 in the timing diagram in FIG. 4, data is not written from the first processor 11 and the second processor 12.

As illustrated in FIG. 1, a plurality of data write transistors of a memory cell and a plurality of data read transistors of a memory cell are provided in accordance with the number of connected processors. Thus, data reading operation can be performed on memory cells in different rows of a memory cell array at the same time.

Note that according to the timing diagram in FIG. 6, data reading operation is performed after data writing operation. However, as in a period from the time T12 to the time T14 in the timing diagram in FIG. 4, data writing operation and data reading operation can be performed at the same time.

As described above, a data write transistor of a memory device shared by a plurality of processors is manufactured with a material capable of achieving a sufficiently low off-state current of a transistor (e.g., an oxide semiconductor material that is a wide band gap semiconductor). Using a wide band gap semiconductor material capable of achieving a sufficiently low off-state current of a transistor makes it possible to hold a potential for a long time without regular or constant supply of power, and therefore, low power consumption can be achieved.

A memory device has a memory cell including at least one data write transistor, at least one data storage transistor, and at least two data read transistors, and is shared by a plurality of processors. With this structure, the number of elements can be smaller than at least that of a memory cell of a dual-port SRAM, which results in achieving a small area of a memory cell and easily achieving a high capacity of the memory device.

In addition, a semiconductor device where a plurality of processors shares the memory device can be provided.

The methods and structures described in this embodiment can be combined as appropriate with any of the methods and structures described in the other embodiments.

Embodiment 2

In this embodiment, a memory device that has a structure different from that of the memory device described in the above embodiment and the operation thereof will be described with reference to FIG. 7, FIG. 8, and FIG. 9.

Figure 7:
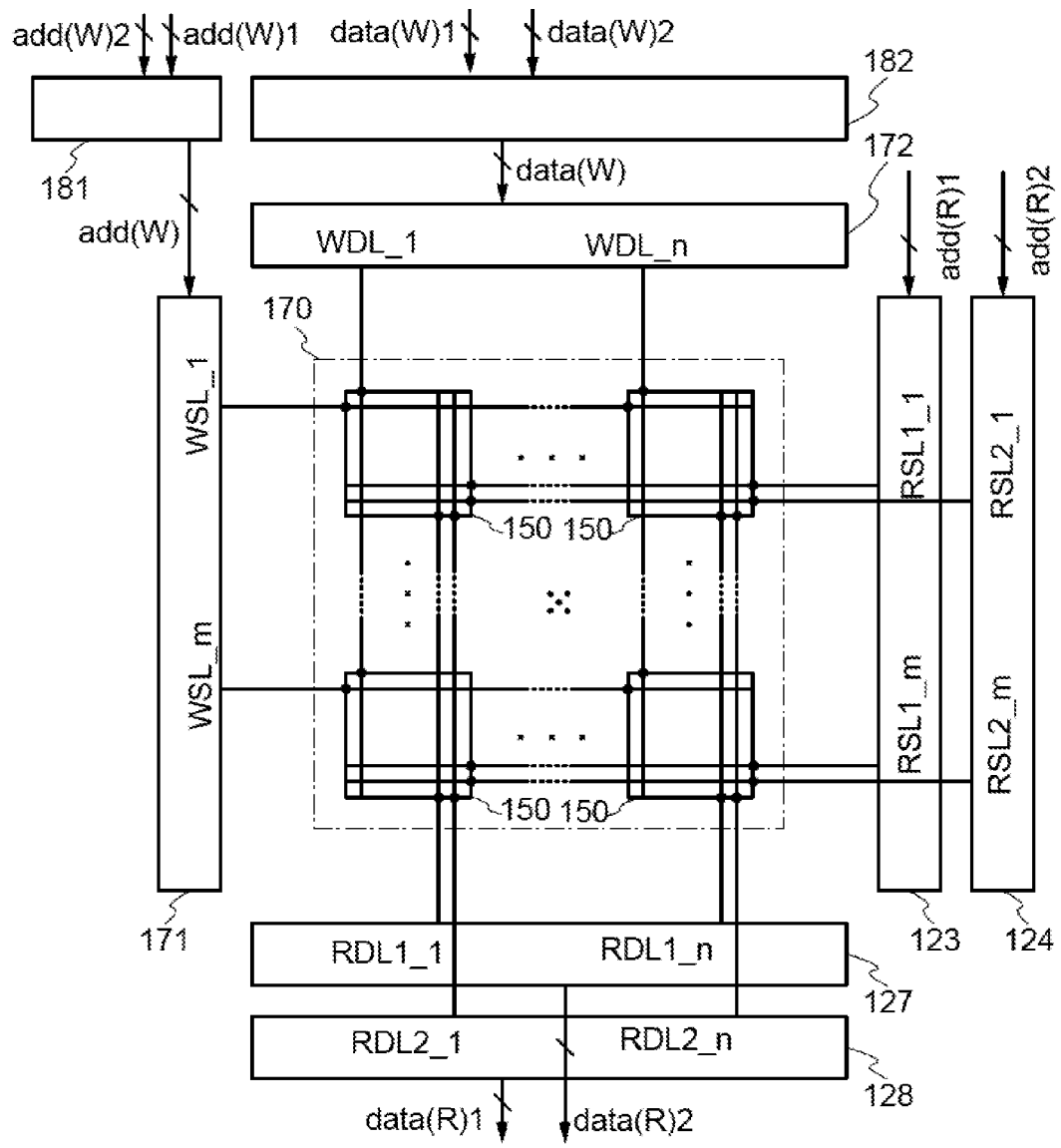
FIG. 7 is a block diagram of a memory device according to one embodiment of the disclosed invention.

FIG. 7 is an example of a block diagram of a memory cell array 170 which includes (m×n) memory cells 150. FIG. 8 illustrates the structure of the memory cell 150 in FIG. 7. Note that the memory cell array 170 in FIG. 7 can be used as the memory device 14 in the semiconductor device in FIG. 2, as described in the above embodiment.

In the memory device in FIG. 5, the m first write selection lines WSL1_1 to WSL1_m, the n first write data lines WDL1_1 to WDL1_n, the first driving circuit 121, and the fifth driving circuit 125 are provided for the first processor 11. In addition, the m second write selection lines WSL2_1 to WSL2_m, the n second write data lines WDL2_1 to WDL2_n, the second driving circuit 122, and the sixth driving circuit 126 are provided for the second processor 12.

On the other hand, the memory device in FIG. 7 includes m write selection lines WSL_1 to WSL_m, n write data lines WDL_1 to WDL_n, a first driving circuit 171 which is electrically connected to the m write selection lines WSL_1 to WSL_m, and the second driving circuit 172 which is electrically connected to the n write data lines WDL_1 to WDL_n. That is, in the memory device in FIG. 7, the number of wirings for writing data and the number of driving circuits for writing data are reduced to half in comparison with the memory device in FIG. 5.

Further, the first driving circuit 171 and the second driving circuit 172 are electrically connected to an address signal selector 181 and a data signal selector 182, respectively. The address signal selector 181 has a function of outputting an address signal and a write enable signal which are transmitted from the first processor 11 to the first driving circuit 171 at certain timing and outputting an address signal and a write enable signal which are transmitted from the second processor 12 to the first driving circuit 171 at different timing. The data signal selector 182 has a function of outputting a data signal and a write enable signal which are transmitted from the first processor 11 to the second driving circuit 172 at certain timing and outputting a data signal and a write enable signal which are transmitted from the second processor 12 to the second driving circuit 172 at different timing.

That is, the first write enable signal WEN1, the second write enable signal WEN2, the first writing address signal add(W)1, and the second writing address signal add(W)2 are transmitted from the controller 13 to the address signal selector 181 in accordance with a data writing instruction of the first processor 11 and the second processor 12. Thus, the timing for transmitting a signal of the first processor 11 and the timing for transmitting a signal of the second processor 12 are made to be different. As a result, a write enable signal WEN and a write address signal add(W) are transmitted to the first driving circuit 171 to apply an appropriate potential at the write selection lines WSL_1 to WSL_*m*.

That is, the first write enable signal WEN1, the second write enable signal WEN2, the first write data signal data(W)1, and the second write data signal data(W)2 are transmitted from the controller 13 to the address signal selector 182 in accordance with a data writing instruction of the first processor 11 and the second processor 12. Thus, the timing for transmitting a signal of the first processor 11 and the timing for transmitting a signal of the second processor 12 are made to be different. As a result, a write enable signal WEN and a write data signal data(W) are transmitted to the second driving circuit 172 to apply an appropriate potential at the write data lines WDL_1 to WDL_*n*.

In consideration of these differences, the memory cell 150 includes one data write transistor 152, whereas the memory cell 100 includes the two data write transistors 101 and 102. Note that the transistor 152 is similar to the transistor 101 or 102. In addition, as in the transistors 101 and 102, a drain electrode (or a source electrode) of the transistor 152 is electrically connected to the node FG; a gate electrode of the transistor 152 is electrically connected to the write selection line WSL, and a source electrode (or a drain electrode) of the transistor 152 is electrically connected to the write data line WDL. Note that the structure of other portions of the memory cell 150 is similar to that of the memory cell 100 and therefore the above embodiment can be referred to for the details.

The structure of other portions of the memory device in FIG. 7 is similar to that of the memory device in FIG. 5 and therefore the above embodiment can be referred to for the details.

Note that the address signal selector 181 and the data signal selector 182 are separately provided in the block diagram of FIG. 7; however, this embodiment is not limited thereto. For example, the address signal selector 181 and the data signal selector 182 may be combined into one. In addition, the address signal selector 181 and the data signal selector 182 are provided inside a memory device in the block diagram of FIG. 7; however, this embodiment is not limited thereto. For example, the address signal selector 181 and the data signal selector 182 may be provided outside the memory device 14.

The operation of the memory device in FIG. 7 will be described with reference to the timing diagram in FIG. 9. Note that for simplicity, the memory cell array 170 where the memory cells 100 are arranged in 2 (rows)×2 (columns) is described, for example.

The first processor 11 and the second processor 12 perform data writing operation and data reading operation on the memory cell array 170 by row. In the timing diagram in FIG. 9, first, the first processor 11 writes data to memory cells in the first row, and then, the second processor 12 writes data to memory cells in the second row. After data write, the first processor 11 reads data from the memory cells in the first row, and at the same time, the second processor 12 reads data from the memory cells in the second row.

Figure 9:
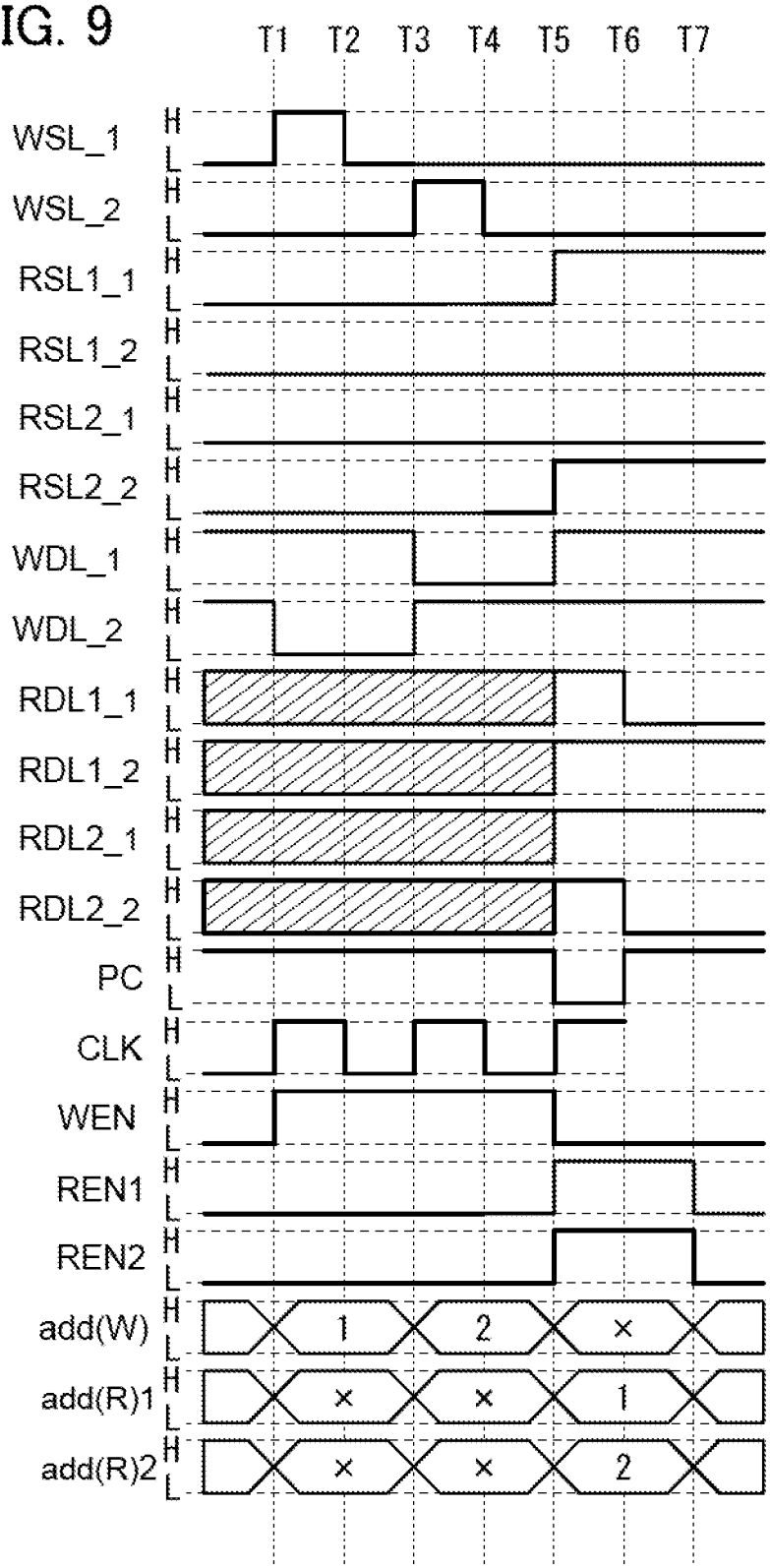
FIG. 9 is a timing diagram of a memory device according to one embodiment of the disclosed invention.

More specifically, according to the timing diagram in FIG. 9, first, in a period from the time T1 to the time T3 which is timing for transmitting a signal to the first processor 11, data "1" is written to the first-row and first-column memory cell 100[1, 1] and data "0" is written to the first-row and second-column memory cell 100[1, 2] in accordance with an instruction of the first processor 11. Next, in a period from the time T3 to the time T5 which is timing for transmitting a signal to the second processor 12, data "0" is written to the second-row and first-column memory cell 100[2, 1] and data "1" is written to the second-row and second-column memory cell 100[2, 2] in accordance with an instruction of the second processor 12. Then, the following operations are performed at the same time in a period from the time T5 to the time T7: the data "1" of the first-row and first-column memory cell 100[1, 1] is read to the first processor 11, the data "0" of the first-row and second-column memory cell 100[1, 2] is read to the first processor 11, the data "0" of the second-row and first-column memory cell 100[2, 1] is read to the second processor 12, and the data "1" of the second-row and second-column memory cell 100[2, 2] is read to the second processor 12. Here, the data writing operation and the data reading operation are sequentially performed in synchronization with the clock signal CLK input from the controller 13. The operation is described below in detail with reference to the timing diagram in FIG. 9.

First, from the time T1 to the time T2, the address signal selector 181 supplies a high potential H as the write enable signal WEN and the write address signal add(W) for selecting the write selection line WSL_1 to the first driving circuit 171. In response to the operation, a high potential H is applied to the write selection line WSL_1, and a low potential L is applied to the write selection line WSL_2. Accordingly, the transistor 152[1, 1] and the transistor 152[1, 2] are on, and the transistor 152[2, 1] and the transistor 152[2, 2] are off.

At this time, the data signal selector 182 supplies a high potential H as the write enable signal WEN and the write data signal data (W) to the second driving circuit 172. In response to the signals, a high potential H is applied to the write data line WDL_1, and a low potential L is applied to the write data line WDL_2. As described above, a high potential H at the write data line WDL_1 is supplied to the node FG[1, 1] through the transistor 152[1, 1] which is in an on state. A low potential L at the write data line WDL_2 is supplied to the node FG[1, 2] through the transistor 152[1, 2] which is in an on state. Note that at this time, the transistor 152 of the memory cells 150 in the second row is in an off state, and therefore, unnecessary potential is prevented from being applied to the node FG of the memory cell 150 in the second row.

From the time T2 to the time T3, the write enable signal WEN is a high potential H, and the write address signal add(W) is kept. The potential of the write selection line WSL_1 is a low potential L. On the other hand, the potentials of the write selection line WSL_2, the write data line WDL_1, and the write data line WDL_2 are kept. Accordingly, the transistor 152[1, 1] and the transistor 152[1, 2] are turned off while the potentials of the write data line WDL_1 and the write data line WDL_2 are held. Therefore, the potential applied to the node FG[1, 1] and the node FG[1, 2] are held. In this manner, the data "1" is written to the memory cell 150[1, 1], and the data "0" is written to the memory cell 150[1, 2].

From the time T3 to the time T4, the address signal selector 181 supplies a high potential H as the write enable signal WEN and the write address signal add(W) for selecting the write selection line WSL_2 to the first driving circuit 171. In response to the operation, a low potential L is applied to the write selection line WSL_1, and a high potential H is applied to the write selection line WSL_2. Accordingly, the transistor 152[1, 1] and the transistor 152[1, 2] are turned off, and the transistor 152[2, 1] and the transistor 152[2, 2] are turned on.

At this time, the data signal selector 182 supplies a high potential H as the write enable signal WEN and the write data signal data (W) to the second driving circuit 172. In response to the signals, a low potential L is applied to the write data line WDL_1, and a high potential H is applied to the write data line WDL_2. As described above, a low potential L at the write data line WDL_1 is supplied to the node FG[2, 1] through the transistor 152[2, 1] which is in an on state. A high potential H at the write data line WDL_2 is supplied to the node FG[2, 2] through the transistor 152[2, 2] which is in an on state. Note that at this time, the transistor 152 of the memory cells 150 in the first row is in an off state, and therefore, unnecessary potential is prevented from being applied to the node FG of the memory cell 150 in the first row.

From the time T4 to the time T5, the write enable signal WEN is a high potential H, and the write address signal add(W) is also kept. The potential of the write selection line WSL_2 becomes a low potential L. On the other hand, the potentials of the write selection line WSL_1, the write data line WDL_1, and the write data line WDL_2 are kept. Accordingly, the transistor 152[2, 1] and the transistor 152[2, 2] are turned off while the potentials of the write data line WDL_1 and the write data line WDL_2 are held. Therefore, the potential applied to the node FG[2, 1] and the node FG[2, 2] are held. In this manner, the data "0" is written to the memory cell 150[2, 1], and the data "1" is written to the memory cell 150[2, 2].

In a period from the time T1 to the time T5 during which data is written from the first processor 11 and the second processor 12, as in the period from the time T1 to the time T3 in the timing diagram in FIG. 4, data is not read to the first processor 11 and the second processor 12.

Figure 8:
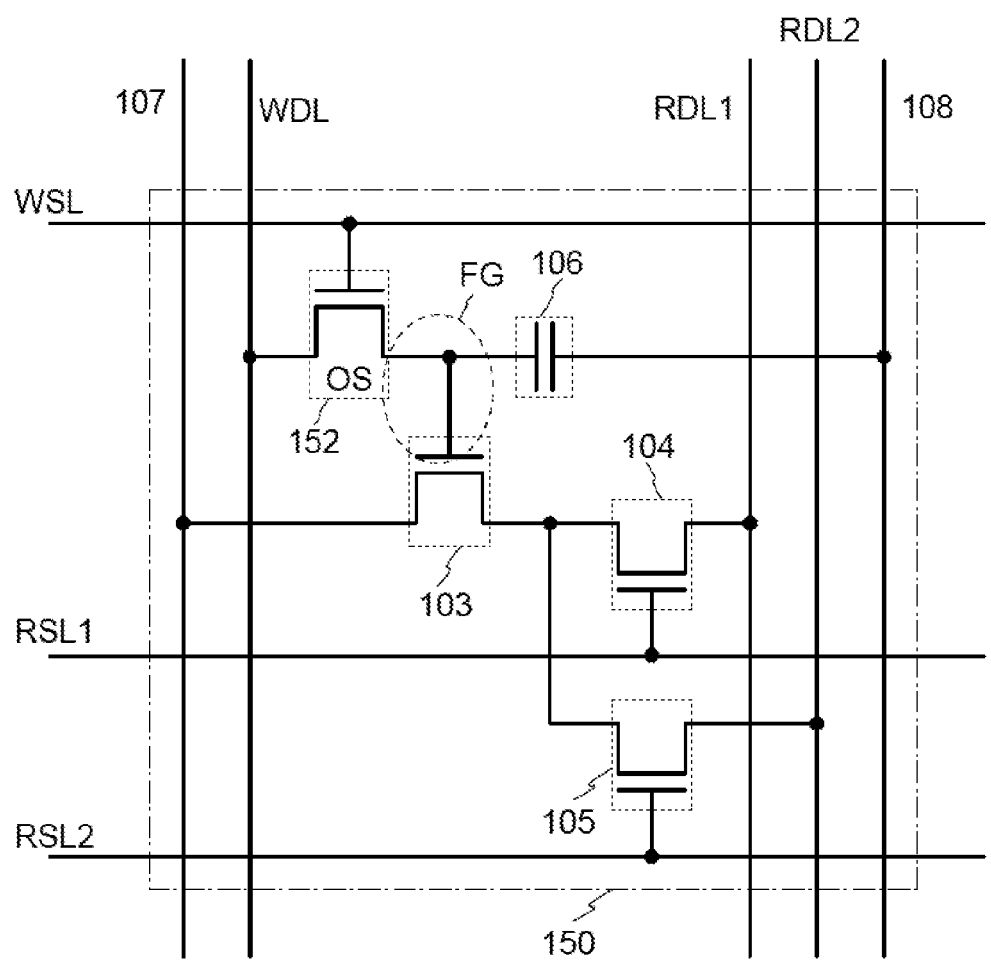
FIG. 8 is a circuit diagram of a memory device according to one embodiment of the disclosed invention.

As illustrated in FIG. 7 and FIG. 8, a plurality of data write transistors of a memory cell and a plurality of data write transistors electrically connected to the driving circuit, and a plurality of data writing driving circuits connected to an address signal selector and a data signal selector are provided in accordance with the number of connected processors. Thus, data writing operation can be performed on memory cells in different rows of a memory cell array at the same time.

The data reading operation from the time T5 to the time T7 can be performed in a manner similar to the data reading operation that is performed from the time T3 to the time T5 in the timing diagram in FIG. 9.

Note that, according to the timing diagram in FIG. 9, data reading operation is performed after data writing operation. However, as in a period from the time T12 to the time T14 in the timing diagram in FIG. 4, data writing operation and data reading operation can be performed at the same time.

As described in the above embodiment, a data write transistor of a memory device shared by a plurality of processors is manufactured with a material capable of achieving a sufficiently low off-state current of a transistor (e.g., an oxide semiconductor material that is a wide band gap semiconductor). Using a wide band gap semiconductor material capable of achieving a sufficiently low off-state current of a transistor makes it possible to hold a potential for a long time without regular or constant supply of power, and therefore, low power consumption can be achieved.

A memory device has a memory cell including at least one data write transistor, at least one data storage transistor, and at least two data read transistors, and is shared by a plurality of processors. With this structure, the number of elements can be smaller than at least that of a memory cell of a dual-port SRAM, which results in achieving a small area of a memory cell and easily achieving a high capacity of the memory device.

In addition, a semiconductor device where a plurality of processors shares the memory device can be provided.

The methods and structures described in this embodiment can be combined as appropriate with any of the methods and structures described in the other embodiments.

Embodiment 3

In this embodiment, an example of a method for manufacturing the memory device described in the above embodiment will be described with reference to FIGS. 10A to 10D, FIGS. 11A and 11B, FIGS. 12A to 12C, FIGS. 13A and 13B, and FIGS. 14A and 14B. As an example, a method for manufacturing the transistor 101 and the transistor 103 in the memory cell 100 in FIG. 1 will be described. Note that in FIGS. 10A to 10D, FIGS. 11A and 11B, FIGS. 12A to 12C, and FIGS. 13A and 13B, a cross-sectional view taken along line A-B corresponds to a cross-sectional view of a region where the transistor 101 including an oxide semiconductor as an wide band gap semiconductor and the n-channel transistor 103, and a cross-sectional view taken along line C-D corresponds to a cross-sectional view of the node FG at which the drain electrode (or the source electrode) of the transistor 101 including an oxide semiconductor film is connected to the gate electrode of the n-channel transistor 103.

Note that the transistor 102 in FIG. 1 and the transistor 152 in FIG. 8 can be formed using a material and a method that are similar to those of the transistor 101. The transistors 104 and 105 in FIG. 1 can be formed using a material and a method that are similar to those of the transistor 103.

Figure 10A:
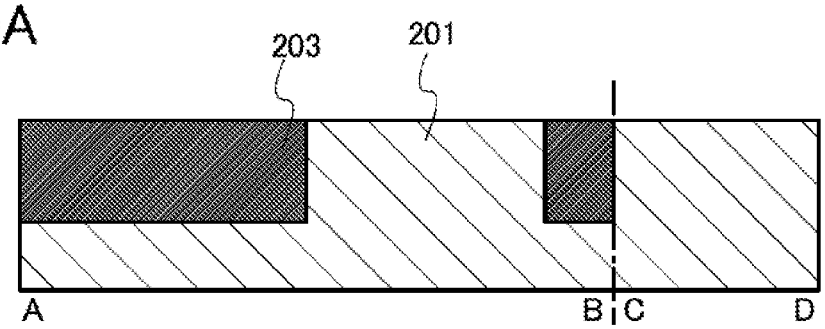
FIGS. 10A to 10D are cross-sectional views illustrating a manufacturing process of a memory device according to one embodiment of the disclosed invention.

First, as illustrated in FIG. 10A, an element isolation region 203 is formed in a p-type semiconductor substrate 201.

As the p-type semiconductor substrate 201, a single crystal silicon substrate (a silicon wafer) having p-type conductivity or a compound semiconductor substrate (e.g., a SiC substrate, or a GaN substrate) can be used.

Instead of the p-type semiconductor substrate 201, the following substrate may be used as a silicon on insulator (SOI) substrate: a so-called separation by implanted oxygen (SIMOX) substrate which is formed in such a manner that after an oxygen ion is implanted into a mirror-polished wafer, an oxide layer is formed at a certain depth from the surface and defects generated in a surface layer are eliminated by high temperature heating; or an SOI substrate formed by a technique called a Smart-Cut method in which a semiconductor substrate is cleaved by utilizing the thermally induced growth of a minute void formed by implantation of a hydrogen ion, an epitaxial layer transfer (ELTRAN: a registered trademark of Canon Inc.) method, or the like.

The element isolation region 203 can be formed by a local oxidation of silicon (LOCOS) method, a shallow trench isolation (STI) method, or the like.

In the case where a p-channel transistor is formed over the same substrate, for example, in the case where the reading circuit in FIG. 3A or 3B is formed over the same substrate and the semiconductor substrate 201 is p-type, an n-well region may be formed in part of the semiconductor substrate 201. The n-well region is formed by addition of an impurity element imparting n-type conductivity, such as phosphorus or arsenic.

Although the p-type semiconductor substrate is used as the semiconductor substrate 201 here, a p-channel transistor may be formed using an n-type semiconductor substrate. In that case, an n-channel transistor may be formed over the same substrate in such a manner that an impurity element imparting p-type conductivity, such as boron, is added to an n-type semiconductor substrate and thus a p-well region is formed.

Figure 10B:
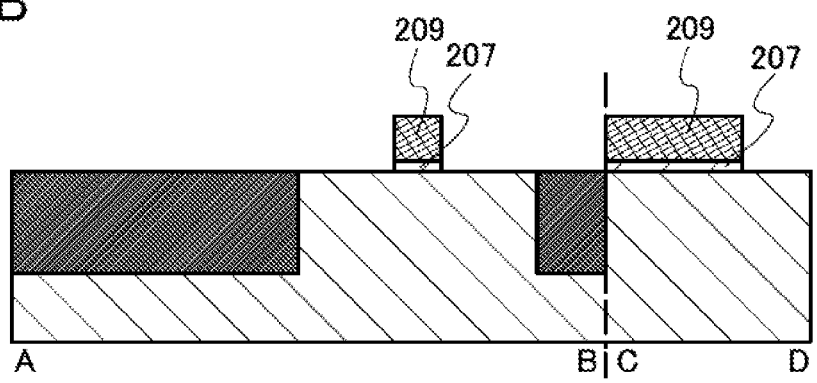

Next, as illustrated in FIG. 10B, a gate insulating film 207 and a gate electrode 209 are formed over the semiconductor substrate 201.

Heat treatment is performed on a surface of the semiconductor substrate 201 to oxidize the surface, whereby a silicon oxide film is formed. Alternatively, a silicon oxide film is formed by a thermal oxidation method, and then a surface of the silicon oxide film is nitrided by a nitridation treatment; thus a stacked structure including the silicon oxide film and the silicon film containing oxygen and nitrogen (silicon oxynitride film) is formed. Next, part of the silicon oxide film or the silicon oxynitride film is selectively etched to form the gate insulating film 207. Alternatively, a 5-to-50-nm-thick film of a silicon oxide; a silicon oxynitride; a metal oxide such as a tantalum oxide, a hafnium oxide, a hafnium silicate oxide, a zirconium oxide, an aluminum oxide, or a titanium oxide; or a rare-earth oxide such as a lanthanum oxide, each of which is a high dielectric constant substance (also referred to as a high-k material), is formed by a CVD method, a sputtering method, or the like; then, part of the film is selectively etched to form the gate insulating film 207.

The gate electrode 209 is preferably formed using a metal selected from metals such as tantalum, tungsten, titanium, molybdenum, chromium, and niobium, or an alloy material or a compound material including any of the metals as its main component. Further, polycrystalline silicon to which an impurity element such as phosphorus is added can be used. Furthermore, the control gate electrode 209 may be formed to have a stacked structure of a metal nitride film and a film of any of the above metals. As the metal nitride, tungsten nitride, molybdenum nitride, or titanium nitride can be used. When the metal nitride film is provided, adhesiveness of the metal film can be increased; accordingly, separation can be prevented.

The gate electrode 209 is formed in such a manner that a conductive film is formed by a sputtering method, a CVD method, or the like and then part of the conductive film is selectively etched.

Here, the surface of the semiconductor substrate 201 is oxidized by heat treatment, so that a silicon oxide film is formed; a conductive film including a stack of a tantalum nitride film and a tungsten film is formed over the silicon oxide film by a sputtering method; then, part of the silicon oxide film and part of the conductive film are selectively etched. Thus, the gate insulating film 207 and the gate electrode 209 are formed.

Note that for high integration, a structure in which sidewall insulating layers are not provided on side surfaces of the gate electrode 209 is preferable. On the other hand, when the characteristics of the transistor have priority, sidewall insulating layers may be provided on the side surfaces of the gate electrode 209.

Figure 10C:
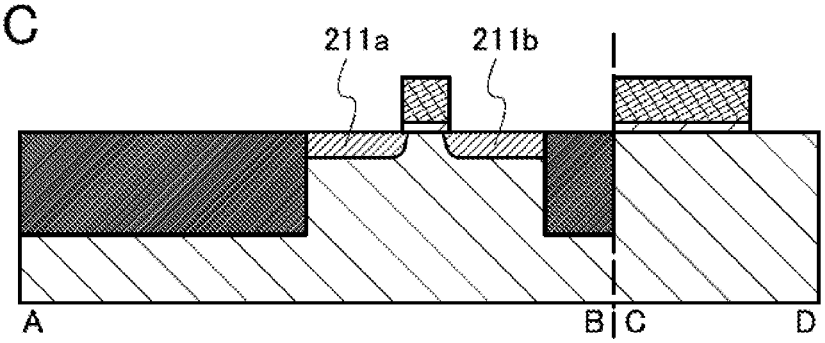

Next, as illustrated in FIG. 10C, an impurity element imparting n-type conductivity is added to the semiconductor substrate 201 to form n-type impurity regions 211a and 211b. In the case where an n-well region is formed in the same substrate, p-type impurity regions are formed by addition of an impurity element imparting p-type conductivity to the n-well region. The concentration of the impurity element imparting n-type conductivity in the n-type impurity regions 211a and 211b and the concentration of the impurity element imparting p-type conductivity in the p-type impurity regions preferably range from $1\times10^{19}$ atoms/cm$^3$ to $1\times10^{21}$ atoms/cm$^3$. The impurity element imparting n-type conductivity and the impurity element imparting p-type conductivity are added to the semiconductor substrate 201 and the n-well region, respectively, by an ion doping method, an ion implantation method, or the like as appropriate.

In the case where sidewall insulating layers are formed on the side surfaces of the gate electrode 209, an impurity region having an impurity concentration different from that in the n-type impurity regions 211a and 211b and that in the p-type concentration regions can be formed in regions overlapping with the sidewall insulating layers.

Figure 10D:
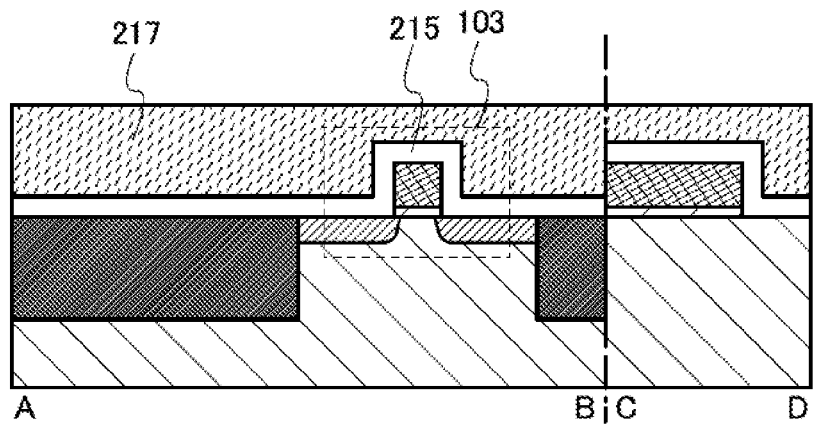

Next, as illustrated in FIG. 10D, an insulating film 215 and an insulating film 217 are formed by a sputtering method, a CVD method, or the like over the semiconductor substrate 201, the element isolation region 203, the gate insulating film 207, and the gate electrode 209.

The insulating films 215 and 217 may each be formed with a single layer or a stack including one or more of silicon oxide, silicon oxynitride, silicon nitride oxide, silicon nitride, aluminum oxide, aluminum oxynitride, aluminum nitride oxide, aluminum nitride, and the like. When the insulating film 215 is formed by a CVD method, a hydrogen content of the insulating film 215 can be increased. Heat treatment is performed using such an insulating film 215, whereby it is possible to hydrogenate the semiconductor substrate, to terminate a dangling bond by hydrogen, and to reduce defects in the semiconductor substrate.

Note that planarity of the insulating film 217 can be high when the insulating film 217 is formed using an inorganic material such as borophosphosilicate glass (BPSG), or an organic material such as polyimide or acrylic.

After the formation of the insulating film 215 or the insulating film 217, heat treatment is performed to activate the impurity elements added to the n-type impurity regions 211a and 211b and the p-type impurity regions.

Through the above steps, as illustrated in FIG. 10D, the n-channel transistor 103 can be manufactured. Here, the transistor 103 is formed using a semiconductor other than an oxide semiconductor, such as single crystal silicon, so that the transistor 103 can operate at high speed. Accordingly, a memory device capable of performing a reading operation at high speed can be formed.

Next, part of each of the insulating films 215 and 217 is selectively etched to form openings. Then, contact plugs 219a and 219b are formed in the openings. Typically, the contact plugs 219a and 219b are formed in such a manner that after a conductive film is formed by a sputtering method, a CVD method, or the like, planarization treatment is performed by a chemical mechanical polishing (CMP) method, etching, or the like so that an unnecessary portion of the conductive film is removed.

The conductive film serving as the contact plugs 219a and 219b is formed by depositing tungsten silicide in the openings by CVD using a $WF_6$ gas and a $SiH_4$ gas.

Next, an insulating film is formed by a sputtering method, a CVD method, or the like over the insulating film 217 and the contact plugs 219a and 219b, and then, part of the insulating film is selectively etched to form an insulating film 221 having a groove portion. Subsequently, a conductive film is formed by sputtering, CVD, or the like and then subjected to planarization treatment such as CMP or etching so that an unnecessary portion of a surface of the conductive film is removed, thereby forming a wiring 223a and a wiring 223b (see FIG. 11A).

Here, the wiring 223a functions as a source electrode of the transistor 103 and electrically connected to the first power supply line 107 illustrated in FIG. 1. The wiring 223b functions as a drain electrode of the transistor 103, and is electrically connected to the source electrode of the transistor 104 and the source electrode of the transistor 105 illustrated in FIG. 1. Note that here, the transistor 103 is electrically connected to the transistors 104 and 105 through the wiring 223b; however, this embodiment is not limited to this structure. For example, the impurity region 211b functioning as the drain region of the transistor 103 may be shared with the transistors 104 and 105.

The insulating film 221 can be formed using a material similar to that of the insulating film 215.

The wirings 223a and 223b are formed to have a single-layer structure or a stacked-layer structure including any of metals such as aluminum, titanium, chromium, nickel, copper, yttrium, zirconium, molybdenum, silver, tantalum, and tungsten and an alloy containing any of these metals as a main component. For example, a single-layer structure of an aluminum film containing silicon, a two-layer structure in which a titanium film is stacked over an aluminum film, a two-layer structure in which a titanium film is stacked over a tungsten film, a two-layer structure in which a copper film is formed over a copper-magnesium-aluminum alloy film, and a three-layer structure in which a titanium film, an aluminum film, and a titanium film are stacked in this order can be given. Note that a transparent conductive material containing indium oxide, tin oxide, or zinc oxide may be used.

The insulating film 221 and the wirings 223a and 223b which are planarized are used, whereby variation in electric characteristics of a transistor including an oxide semiconductor film, which is formed later, can be reduced. Further, the transistor including an oxide semiconductor film can be manufactured with a high yield.

Next, heat treatment or plasma treatment is preferably performed so that hydrogen contained in the insulating film 221 and the wirings 223a and 223b is released. Consequently, in heat treatment performed later, diffusion of hydrogen to an insulating film and an oxide semiconductor film to be formed later can be prevented. The heat treatment is performed at a temperature of higher than or equal to 100° C. and lower than the strain point of the substrate in an inert atmosphere, a reduced-pressure atmosphere, or a dry air atmosphere. Further, for the plasma treatment, rare gas, oxygen, nitrogen, or nitrogen oxide (e.g., nitrous oxide, nitrogen monoxide, or nitrogen dioxide) is used.

Next, an insulating film 225 is formed by a sputtering method, a CVD method, or the like over the insulating film 221 and the wirings 223a and 223b. The insulating film 225 can be formed with a single layer or a stacked layer using one or more of silicon oxide, silicon oxynitride, silicon nitride oxide, gallium oxide, hafnium oxide, yttrium oxide, aluminum oxide, and aluminum oxynitride. The insulating film 225 is preferably formed using an oxide insulating film from which some contained oxygen is desorbed by heating. The oxide insulating film from which part of oxygen is released by heating is preferably an oxide insulating film which contains oxygen at a proportion exceeding the stoichiometric proportion. Oxygen is released by heating from the oxide insulating film from which part of oxygen is released by heating; therefore, oxygen can be diffused into the oxide semiconductor film by heating performed in a later step.

In the case where the insulating film 225 has a layered structure, the insulating film 225 is preferably an insulating film serving as a barrier film that prevents the entry of an impurity that disperses from a lower layer(s). In particular, in the case where a single crystal silicon substrate, an SOI substrate, a substrate provided with a semiconductor element formed using silicon, or the like is used as the semiconductor substrate 201, hydrogen and the like contained in the substrate can be prevented from dispersing and entering the later-formed oxide semiconductor film. Such an insulating film can be formed using, for example, a silicon nitride film, a silicon nitride oxide film, or an aluminum oxide film deposited by a plasma CVD method or a sputtering method.

The insulating film 225 is preferably planarized by CMP treatment or the like. The surface of the insulating film 225 has an average surface roughness ($R_a$) of 1 nm or less, preferably 0.3 nm or less, further preferably 0.1 nm or less.

Note that in this specification and the like, the average surface roughness ($R_a$) is obtained by three-dimension expansion of arithmetic mean deviation ($R_a$) which is defined by JIS B 0601:2001 (ISO 4287:1997) so that $R_a$ can be applied to a curved surface, and is an average value of the absolute values of deviations from a reference surface to a specific surface.

When the specific surface which is a surface represented by measurement data is expressed as Z=F(X,Y), the average surface roughness ($R_a$) is an average value of the absolute values of deviations from the reference surface to the specific surface and is shown by the following formula.

$$Ra = \frac{1}{S_0} \int_{y_1}^{y_2} \int_{x_1}^{x_2} |f(x, y) - Z_0| dx dy \qquad \text{[FORMULA 1]}$$

Here, the specific surface is a surface which is a target of roughness measurement, and is a quadrilateral region which is specified by four points represented by the coordinates ($x_1$, $y_1$, $f(x_1, y_1)$), ($x_1$, $y_2$, $f(x_1, y_2)$), ($x_2$, $y_1$, $f(x_2, y_1)$), and ($x_2$, $y_2$, $f(x_2, y_2)$). $S_0$ represents the area of a rectangle which is obtained by projecting the specific surface on the xy plane, and $Z_0$ represents the height of the reference surface (the average height of the specific surface). The average surface roughness ($R_a$) can be measured using an atomic force microscope (AFM).

The CMP treatment may be performed once or plural times. When the CMP treatment is performed plural times, first polishing is preferably performed with a high polishing rate followed by final polishing with a low polishing rate. By performing polishing steps with different polishing rates in combination, the planarity of the surface of the insulating film 225 can be further increased.

Alternatively, plasma treatment can be used as the planarization treatment of the insulating film 225. The plasma treatment is performed in such a manner that an inert gas, for example, a rare gas such as an argon gas is introduced into a vacuum chamber and an electric field is applied so that a surface to be processed serves as a cathode. The plasma treatment has a principle similar to that of a plasma dry etching method and an inert gas is used in the plasma treatment. That is, the plasma treatment is treatment in which the surface to be processed is irradiated with ions of an inert gas and minute unevenness of the surface is reduced by a sputtering effect. Therefore, the plasma treatment can also be referred to as "reverse sputtering treatment".

When the plasma treatment is performed, electrons and argon cations are present in plasma and the argon cations are accelerated in a cathode direction. The surface to be processed is sputtered by the accelerated argon cations. At that time, a projected portion of the surface to be processed is preferentially sputtered. Particles of sputtering from the surface to be processed attach to another place of the surface to be processed. At that time, the particles of sputtering from the surface to be processed preferentially attach to a depressed portion of the surface to be processed. By thus partially removing the projected portion and filling the depressed portion, planarity of the surface to be processed is increased. Note that a combination of plasma treatment and CMP treatment can further planarize the insulating film 225.

Note that through the plasma treatment, it is possible to remove impurities, such as oxygen, moisture, and an organic compound, attached onto the surface of the insulating film 225 by a sputtering effect.

It is preferable that impurities such as hydrogen, water, a compound having a hydroxyl group, and a hydride in a deposition chamber be removed by heating and evacuation of the deposition chamber before formation of the oxide semiconductor. It is particularly important to remove such impurities adsorbed on an inner wall of the deposition chamber. Here, heat treatment may be performed at temperature higher than or equal to 100° C. and lower than or equal to 450° C. Evacuation of the treatment chamber is preferably performed with a rough vacuum pump, such as a dry pump, and a high vacuum pump, such as a sputter ion pump, a turbo molecular pump, or a cryopump, in appropriate combination. The turbo molecular pump has an outstanding capability in evacuating a large-sized molecule, whereas it has a low capability in evacuating hydrogen or water. Hence, combination of a cryopump having a high capability in evacuating water and a sputter ion pump having a high capability in evacuating hydrogen is effective. At this time, when the impurities are removed while an inert gas is introduced, the rate of elimination of water or the like, which is difficult to eliminate only by evacuation, can be further increased. Removal of impurities in the deposition chamber by such treatment before the film formation of the oxide semiconductor can prevent hydrogen, water, compound having a hydroxyl group, a hydride, and the like from entering the oxide semiconductor.

Before the oxide semiconductor film is formed by a sputtering apparatus, a dummy substrate may be put into the sputtering apparatus, and an oxide semiconductor film may be formed over the dummy substrate, so that hydrogen and moisture attached to the target surface or a deposition shield may be removed.

Figure 11A:
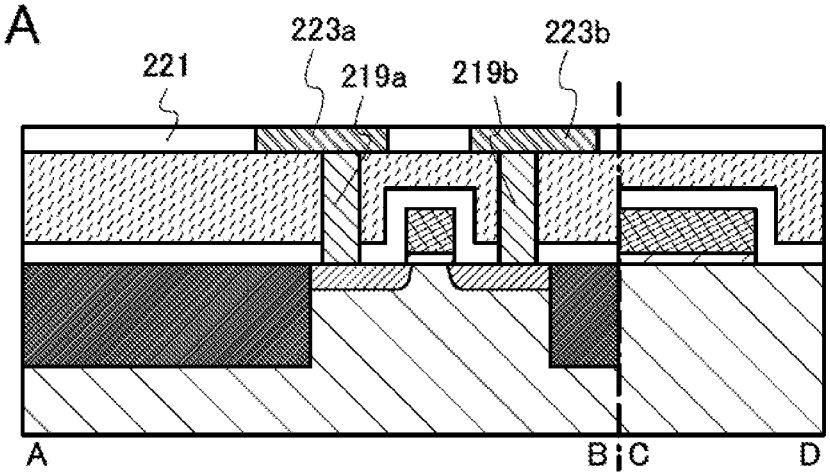
FIGS. 11A and 11B are cross-sectional views illustrating a manufacturing process of the memory device according to one embodiment of the disclosed invention.
Figure 11B:
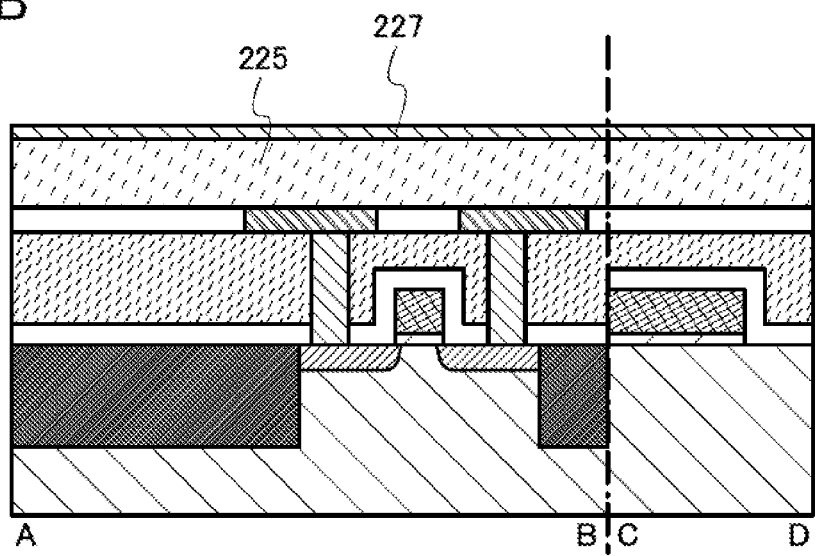

Next, an oxide semiconductor film 227 is formed over the insulating film 225 by a sputtering method, a coating method, a printing method, an evaporation method, a PCVD method, a PLD method, an ALD method, an MBE method, or the like (see FIG. 11B). Here, as the oxide semiconductor film 227, an oxide semiconductor film having a thickness of greater than or equal to 1 nm and less than or equal to 50 nm, preferably greater than or equal to 3 nm and less than or equal to 20 nm is formed by a sputtering method. When the oxide semiconductor film 227 has a thickness in the above range, a short-channel effect which might be caused due to miniaturization of the transistor can be suppressed.

An oxide semiconductor used for the oxide semiconductor film 227 preferably contains at least indium (In) or zinc (Zn). In particular, In and Zn are preferably contained. As a stabilizer for reducing variation in electric characteristics of a transistor using the oxide semiconductor, gallium (Ga) is preferably additionally contained. Tin (Sn) is preferably contained as a stabilizer. Hafnium (Hf) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, any of the following can be used: indium oxide, tin oxide, zinc oxide, an In—Zn-based oxide, a Sn—Zn-based oxide, a Zn—Mg-based oxide, a Sn—Mg-based oxide, an In—Mg-based oxide, an In—Ga-based oxide, an In—Ga—Zn-based oxide (also referred to as IGZO), an In—Sn—Zn-based oxide, a Sn—Ga—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, or an In—Sn—Hf—Zn-based oxide. Moreover, silicon oxide may be included in the above oxide semiconductor. Here, for example, an In—Ga—Zn-based oxide means an oxide containing indium (In), gallium (Ga), and zinc (Zn) as its main components and there is no particular limitation on the ratio of In:Ga:Zn. The In—Ga—Zn-based oxide may contain a metal element other than the In, Ga, and Zn. In this case, the amount of oxygen in the oxide semiconductor preferably exceeds the stoichiometric proportion. When the amount of oxygen exceeds the stoichiometric proportion, generation of carriers which results from oxygen vacancies in the oxide semiconductor film can be suppressed.

Alternatively, a material represented by $InMO_3(ZnO)_m$ (m>0, and m is not an integer) may be used as an oxide semiconductor. Note that M represents one or more metal elements selected from Ga, Fe, Mn, and Co. Alternatively, as the oxide semiconductor, a material expressed by a chemical formula, $In_2SnO_5(ZnO)_n$ (n>0, n is an integer) may be used.

Note that the concentration of alkali metals or alkaline earth metals in the oxide semiconductor film 227 is preferably lower than or equal to $1\times10^{18}$ atoms/cm$^3$, further preferably lower than or equal to $2\times10^{16}$ atoms/cm$^3$. When an alkali metal or an alkaline earth metal is bonded to an oxide semiconductor, carriers are generated in some cases, which causes an increase in the off-state current of the transistor.

The oxide semiconductor film 227 may contain nitrogen at a concentration of lower than or equal to $5\times10^{18}$ atoms/cm$^3$.

As an oxide semiconductor which can be used for the oxide semiconductor film 227, a wide bandgap semiconductor which has a wider bandgap and lower intrinsic carrier density than a silicon semiconductor is used. The band gap of the oxide semiconductor film is greater than or equal to 2.5 eV and less than or equal to 4 eV, preferably greater than or equal to 3 eV and less than or equal to 3.8 eV. In this manner, the off-state current of a transistor can be reduced by using an oxide semiconductor having a wide energy gap.

The oxide semiconductor film 227 may have a single crystal structure or a non-single-crystal structure. The non-single-crystal state is, for example, structured by at least one of amorphous, microcrystal, polycrystal, and c-axis aligned crystal (CAAC). The density of defect states of microcrystal is higher than that of CAAC. Note that an oxide semiconductor including CAAC is referred to as a CAAC-OS (c-axis aligned crystalline oxide semiconductor).

In an oxide semiconductor in an amorphous state, a flat surface can be obtained with relative ease, so that when a transistor is manufactured with the use of the oxide semiconductor, interface scattering can be reduced, and relatively high mobility can be obtained with relative ease.

In an oxide semiconductor having crystallinity, defects in the bulk can be further reduced and when a surface flatness is improved, mobility higher than that of an oxide semiconductor layer in an amorphous state can be obtained. In order to improve the surface flatness, the oxide semiconductor is preferably formed over a flat surface. As described above, the average surface roughness ($R_a$) of the surface of the insulating film 225 is 1 nm or less, preferably 0.3 nm or less, further preferably 0.1 nm or less, and the oxide semiconductor film 227 is preferably formed thereover.

Here, the oxide semiconductor film 227 is formed by a sputtering method. As a target, a target corresponding to the above oxide can be used.

In the case where an In—Ga—Zn—O-based material is used as the oxide semiconductor, the target can be formed as appropriate in accordance with a material of the oxide semiconductor film 227 and the composition thereof. For example, an In—Ga—Zn-based oxide with an atomic ratio of In:Ga:Zn=1:1:1, In:Ga:Zn=1:3:2, In:Ga:Zn=3:1:2, or In:Ga:Zn=2:1:3, or an oxide with an atomic ratio close to the above atomic ratios can be used as the target. However, the target is not limited to these materials and compositions.

However, without limitation to the materials given above, a material with an appropriate composition may be used depending on needed semiconductor characteristics (e.g., mobility, threshold voltage, and variation). In order to obtain the required semiconductor characteristics, it is preferable that the carrier concentration, the impurity concentration, the defect density, the atomic ratio between a metal element and oxygen, the interatomic distance, the density, and the like be set to appropriate values.

As a sputtering gas, a rare gas (typically argon) atmosphere, an oxygen atmosphere, or a mixed gas of a rare gas and oxygen is used as appropriate. In the case of using the mixed gas of a rare gas and oxygen, the proportion of oxygen is preferably higher than that of a rare gas. Further, in order to prevent hydrogen, water, a hydroxyl group, hydride, and the like from entering the oxide semiconductor film, as a sputtering gas, it is preferable to use an atmosphere of a high-purity gas from which impurities such as hydrogen, water, a hydroxyl group, and hydride are sufficiently removed.

In a sputtering method, an RF power supply device, an AC power supply device, a DC power supply device, or the like can be used as a power supply device for generating plasma as appropriate.

Note that the leakage rate of a treatment chamber in which the oxide semiconductor film is formed is preferably lower than or equal to $1\times10^{-10}$ Pa×m$^3$/sec., whereby entry of an impurity into the film to be formed by a sputtering method can be decreased. As described above, in the process for forming the oxide semiconductor film and preferably in the process for forming the oxide insulating film, entry of impurities is suppressed as much as possible through control of the pressure of the treatment chamber, leakage rate of the treatment chamber, and the like, whereby entry of impurities including hydrogen into the oxide semiconductor film can be reduced. In addition, diffusion of impurities such as hydrogen from the oxide insulating film to the oxide semiconductor film can be reduced.

As the oxide semiconductor film 227, a c-axis aligned crystalline oxide semiconductor (CAAC-OS) film including crystallized parts may be included, for example. In the CAAC-OS, for example, c-axes are aligned, and a-axes and/or b-axes are not macroscopically aligned.

The oxide semiconductor film 227 may include a microcrystal, for example. Note that an oxide semiconductor containing a microcrystal is referred to as a microcrystal oxide semiconductor. A microcrystalline oxide semiconductor film includes microcrystal with a size greater than or equal to 1 nm and less than 10 nm, for example. Alternatively, a microcrystalline oxide semiconductor film, for example, includes a crystal-amorphous mixed phase structure where crystal parts (each of which is greater than or equal to 1 nm and less than 10 nm) are distributed in an amorphous phase.

The oxide semiconductor film 227 may include an amorphous part, for example. Note that an oxide semiconductor which includes an amorphous part is referred to as amorphous oxide semiconductor. An amorphous oxide semiconductor film, for example, includes an oxide semiconductor having disordered atomic arrangement and no crystalline component. Alternatively, an amorphous oxide semiconductor film is, for example, absolutely amorphous and has no crystal part.

Note that the oxide semiconductor film 227 may be a mixed film including any of a CAAC-OS, a microcrystalline oxide semiconductor, and an amorphous oxide semiconductor. The mixed film, for example, includes a region of an amorphous oxide semiconductor, a region of a microcrystalline oxide semiconductor, and a region of a CAAC-OS. Further, the mixed film may have a stacked-layer structure including a region of an amorphous oxide semiconductor, a region of a microcrystalline oxide semiconductor, and a region of a CAAC-OS, for example.

Note that the oxide semiconductor film 227 may include a single crystal, for example.

The oxide semiconductor film 227 preferably includes a plurality of crystal parts. In each of the crystal parts, a c-axis is preferably aligned in a direction parallel to a normal vector of a surface where the oxide semiconductor film is formed or a normal vector of a surface of the oxide semiconductor film. Note that, among crystal parts, the directions of the a-axis and the b-axis of one crystal part may be different from those of another crystal part. An example of such an oxide semiconductor film is a CAAC-OS film.

The CAAC-OS film is neither absolutely single crystal (i.e., it is a type of non-single-crystal) nor absolutely amorphous. The CAAC-OS film includes an oxide semiconductor with a crystal-amorphous mixed phase structure where an amorphous phase includes crystal parts, for example. Note that in most cases, the crystal part fits inside a cube whose one side is less than 100 nm. From an observation image obtained with a transmission electron microscope (TEM), a boundary between an amorphous part and a crystal part in the CAAC-OS film is not clear. Further, with the TEM, a grain boundary in the CAAC-OS film is not found. Thus, in the CAAC-OS film, a reduction in electron mobility, due to the grain boundary, is suppressed.

In each of the crystal parts included in the CAAC-OS film, a c-axis is aligned in a direction parallel to a normal vector of a surface where the CAAC-OS film is formed or a normal vector of a surface of the CAAC-OS film. Further, in each of the crystal parts, metal atoms are arranged in a triangular or hexagonal configuration when seen from the direction perpendicular to the a-b plane, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a term "perpendicular" includes a range from 80° to 100°, preferably from 85° to 95°. In addition, a term "parallel" includes a range from −10° to 10°, preferably from −5° to 5.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that the direction of c-axis of the crystal part is the direction parallel to a normal vector of the surface where the CAAC-OS film is formed or a normal vector of the surface of the CAAC-OS film. The crystal part is formed by film formation or by performing treatment for crystallization such as heat treatment after film formation.

With the use of the CAAC-OS film in a transistor, change in electric characteristics of the transistor due to irradiation with visible light or ultraviolet light is small. Thus, the transistor has high reliability.

Note that part of oxygen included in the oxide semiconductor film may be substituted with nitrogen.

In an oxide semiconductor having a crystal portion such as the CAAC-OS, defects in the bulk can be further reduced and when the surface flatness of the oxide semiconductor is improved, mobility higher than that of an oxide semiconductor in an amorphous state can be obtained. In order to improve the surface flatness, the oxide semiconductor is preferably formed over a flat surface. Specifically, the oxide semiconductor may be formed over a surface with the average surface roughness (Ra) of less than or equal to 1 nm, preferably less than or equal to 0.3 nm, more preferably less than or equal to 0.1 nm.

The substrate is heated to a temperature higher than 200° C. and lower than or equal to 700° C., preferably higher than 300° C. and lower than or equal to 500° C., more preferably higher than or equal to 400° C. and lower than or equal to 450° C. during the formation of the oxide semiconductor film 227 so that the oxide semiconductor film 227 includes the CAAC-OS. The oxide semiconductor film 227 is formed while the substrate is heated in this manner, whereby the oxide semiconductor film 227 can include the CAAC-OS.

Alternatively, a first oxide semiconductor film having a thickness of greater than or equal to a thickness of one atomic layer and less than or equal to 10 nm, preferably greater than or equal to 2 nm and less than or equal to 5 nm, which is thin, is formed while the heating is performed at temperature in the above range, and then a second oxide semiconductor film which is thick is formed while heating is performed in a similar manner; thus, the first oxide semiconductor film and the second oxide semiconductor film may be stacked to form the oxide semiconductor film 227 including the CAAC-OS.

In the case where the oxide semiconductor film 227 is formed to have an amorphous structure, the substrate is not heated or the substrate is heated so that the substrate temperature is lower than 200° C., preferably lower than 180° C. in the formation of the oxide semiconductor film 227. The oxide semiconductor film 227 is formed in this manner, whereby the oxide semiconductor film 227 can have an amorphous structure.

Alternatively, the oxide semiconductor film 227 including the CAAC-OS may be formed in the following manner: after an oxide semiconductor film having an amorphous structure is formed in the above manner, heat treatment at a temperature of higher than or equal to 250° C. and lower than or equal to 700° C., preferably higher than or equal to 400° C., more preferably higher than or equal to 500° C., still more preferably higher than or equal to 550° C. is performed, so that at least part of the oxide semiconductor film having an amorphous structure is crystallized. Note that the heat treatment can be performed in an inert gas atmosphere. The inert gas atmosphere is preferably an atmosphere which contains nitrogen or a rare gas (e.g., helium, neon, or argon) as its main component and does not contain water, hydrogen, or the like. For example, the purity of nitrogen or a rare gas such as helium, neon, or argon introduced into a heat treatment apparatus is greater than or equal to 6N (99.9999%), preferably greater than or equal to 7N (99.99999%) (that is, the concentration of the impurities is less than or equal to 1 ppm, preferably less than or equal to 0.1 ppm). Heat treatment for dehydration or dehydrogenation, which is described later, can serve as this heat treatment.

In the above method, as the substrate heating temperature at the time of film formation is higher, the impurity concentration of the obtained oxide semiconductor film 227 is lower. Further, the atomic arrangement in the oxide semiconductor film 227 is ordered and the density thereof is increased, so that a polycrystal or a CAAC-OS is likely to be formed. Furthermore, since an oxygen gas atmosphere is employed for the deposition, an unnecessary atom is not contained in the oxide semiconductor film unlike in the case of employing a rare gas atmosphere or the like, so that a polycrystal or a CAAC-OS is readily formed. Note that a mixed gas atmosphere including an oxygen gas and a rare gas may be used. In that case, the percentage of an oxygen gas is higher than or equal to 30 vol. %, preferably higher than or equal to 50 vol. %, more preferably higher than or equal to 80 vol. %.

After the oxide semiconductor film 227 is formed, the oxide semiconductor film 227 may be subjected to heat treatment. The heat treatment can further remove a substance including a hydrogen atom in the oxide semiconductor film 227; thus, a structure of the oxide semiconductor film 227 can be improved and defect levels in the energy gap can be reduced. The heat treatment is performed in an inert gas atmosphere at temperature higher than or equal to 300° C. and lower than or equal to 700° C., preferably higher than or equal to 450° C. and lower than or equal to 600° C., or less than a strain point of the substrate in the case where the substrate has the strain point. The inert gas atmosphere is preferably an atmosphere which contains nitrogen or a rare gas (e.g., helium, neon, or argon) as its main component and does not contain water, hydrogen, or the like. For example, the purity of nitrogen or a rare gas such as helium, neon, or argon introduced into a heat treatment apparatus is greater than or equal to 6N (99.9999%), preferably greater than or equal to 7N (99.99999%) (that is, the concentration of the impurities is less than or equal to 1 ppm, preferably less than or equal to 0.1 ppm).

The heat treatment can be performed in such a way that, for example, the semiconductor substrate 201 is introduced into an electric furnace using a resistance heating element or the like and heated at 450° C. under a nitrogen atmosphere for an hour.

The heat treatment apparatus is not limited to the electric furnace and may be an apparatus for heating an object to be processed by thermal conduction or thermal radiation from a medium such as a heated gas. For example, a rapid thermal annealing (RTA) apparatus such as a lamp rapid thermal annealing (LRTA) apparatus or a gas rapid thermal annealing (GRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the gas, an inert gas which does not react with an object to be processed by heat treatment, such as nitrogen or a rare gas such as argon is used. Note that in the case where a GRTA apparatus is used as the heat treatment apparatus, the substrate may be heated in an inert gas heated to high temperature of 650° C. to 700° C. because the heat treatment time is short.

In addition, after the oxide semiconductor film 227 is heated by the heat treatment, a high-purity oxygen gas, a high-purity $N_2O$ gas, or ultra dry air (the moisture concentration is less than or equal to 20 ppm (−55° C. by conversion into a dew point), preferably less than or equal to 1 ppm, more preferably less than or equal to 10 ppb, in the measurement with the use of a dew point meter of a cavity ring down laser spectroscopy (CRDS) system) may be introduced into the same furnace. It is preferable that water, hydrogen, and the like be not contained in these gases in particular. The purity of the oxygen gas or the $N_2O$ gas that is introduced into the same furnace is preferably greater than or equal to 6N, more preferably greater than or equal to 7N (i.e., the concentration of impurities in the oxygen gas or the $N_2O$ gas is preferably less than or equal to 1 ppm, more preferably less than or equal to 0.1 ppm). By the action of the oxygen gas or the $N_2O$ gas, oxygen which is one of a main component of the oxide semiconductor and which has been reduced through the step for removing impurities by dehydration or dehydrogenation can be supplied.

The above heat treatment has an effect of removing hydrogen, water, and the like and can be referred to as dehydration, dehydrogenation, or the like. The heat treatment can be performed at the timing, for example, before the oxide semiconductor layer is processed to have an island shape, after the gate insulating film is formed, or the like. The number of times of such heat treatment for dehydration or dehydrogenation is not limited to one and may be two or more.

Next, part of the oxide semiconductor film 227 is selectively etched to form an oxide semiconductor film 229. Then, an insulating film 231 is formed over the oxide semiconductor film 229 by a sputtering method, a CVD method, or the like. After that, a gate electrode 233 is formed over the insulating film 231 (see FIG. 12A).

The insulating film 231 may be formed with a single layer or a stack using one or more of silicon oxide, silicon oxynitride, silicon nitride oxide, silicon nitride, aluminum oxide, hafnium oxide, gallium oxide, a Ga—Zn—O-based metal oxide, and the like. The insulating film 231 may also be an oxide insulating film from which oxygen is eliminated by heating as described as a film that can be used as the insulating film 225. By using a film from which oxygen is released by heating as the insulating film 231, oxygen vacancies caused in the oxide semiconductor film 229 can be reduced by heat treatment performed later and deterioration of electric characteristics of the transistor can be suppressed.

The insulating film 231 is formed using a high-k material such as hafnium silicate ($HfSiO_x$), hafnium silicate to which nitrogen is added ($HfSi_xO_yN_z$), hafnium aluminate to which nitrogen is added ($HfAl_xO_yN_z$), hafnium oxide, or yttrium oxide, whereby a gate leakage current can be decreased even when the thickness of the gate insulating film is small.

The thickness of the insulating film 231 is preferably greater than or equal to 10 nm and less than or equal to 300 nm, more preferably greater than or equal to 5 nm and less than or equal to 50 nm, still more preferably greater than or equal to 10 nm and less than or equal to 30 nm.

The gate electrode 233 can be formed using a metal element selected from aluminum, chromium, copper, tantalum, titanium, molybdenum, and tungsten; an alloy containing any of these metal elements as a component; an alloy containing these metal elements in combination; or the like. Further, one or more metal elements selected from manganese or zirconium may be used. The gate electrode 233 may have a single-layer structure or a stacked-layer structure of two or more layers. For example, a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film, a three-layer structure in which a titanium film, an aluminum film, and a titanium film are stacked in this order, and the like can be given. Alternatively, a film, an alloy film, or a nitride film which contains aluminum and one or more elements selected from titanium, tantalum, tungsten, molybdenum, chromium, neodymium, and scandium may be used.

Alternatively, the gate electrode 233 can be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to have a stacked-layer structure formed using the above light-transmitting conductive material and the above metal element.

The gate electrode 233 is formed by a printing method or an inkjet method. Alternatively, the gate electrode 233 is formed in such a manner that a conductive film is formed by a sputtering method, a CVD method, an evaporation method, or the like and then part of the conductive film is selectively etched.

Further, as a material layer in contact with the insulating film 231, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride film (InN, ZnN, or the like) is preferably provided between the gate electrode 233 and the insulating film 231. These films each have a work function of 5 eV or higher, preferably 5.5 eV or higher; thus, the threshold voltage of the electric characteristics of the transistor can be positive. Accordingly, what is called a normally-off switching element can be obtained. For example, in the case where an In—Ga—Zn—O film containing nitrogen is used, an In—Ga—Zn—O film in which the nitrogen concentration is higher than at least that of the oxide semiconductor film 229, specifically an In—Ga—Zn—O film in which the nitrogen concentration is higher than or equal to 7 atomic % is used.

Heat treatment is preferably performed after that. Through this heat treatment, oxygen can be diffused from the insulating film 225 and the insulating film 231 to the oxide semiconductor film 229 to repair the oxygen vacancies included in the oxide semiconductor film 229; thus, the oxygen vacancies can be reduced.

Note that after the insulating film 231 is formed, heat treatment (second heat treatment) may be performed in an inert gas atmosphere or an oxygen atmosphere. The heat treatment temperature is preferably higher than or equal to 200° C. and lower than or equal to 450° C., and more preferably higher than or equal to 250° C. and lower than or equal to 350° C. With such heat treatment, variation in electric characteristics of the transistor can be reduced. In the case where oxygen is contained in the insulating film 231 or the insulating film 225 which is in contact with the oxide semiconductor film 227, oxygen can be supplied to the oxide semiconductor film 227 and the oxygen vacancies in the oxide semiconductor film 229 can be repaired. As described above, the heat treatment has an effect of supplying oxygen; therefore, the heat treatment can also be referred to as supply of oxygen.

Note that in this embodiment, the heat treatment for supply of oxygen is performed after the insulating film 231 is formed; however, the timing of the heat treatment for supply of oxygen is not limited thereto and the heat treatment may be performed as appropriate as long as the formation of the insulating film 231 is completed.

As described above, the heat treatment for dehydration or dehydrogenation and the heat treatment for supply of oxygen are performed to reduce impurities and fill oxygen vacancies in the oxide semiconductor film 229, whereby the oxide semiconductor film 229 can be highly purified so as to contain impurity elements that are not main components of the oxide semiconductor film 229 as little as possible.

Figure 12A:
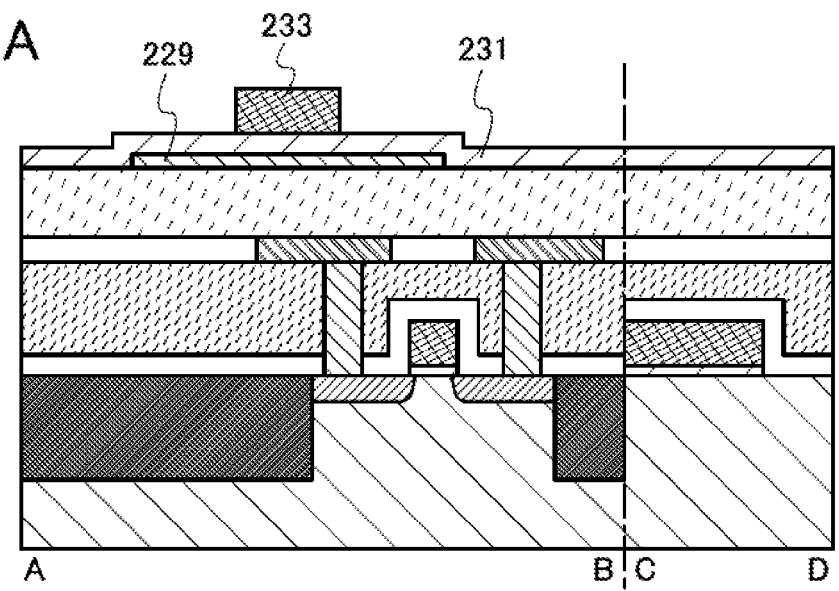
FIGS. 12A to 12C are cross-sectional views illustrating a manufacturing process of the memory device according to one embodiment of the disclosed invention.
Figure 12B:
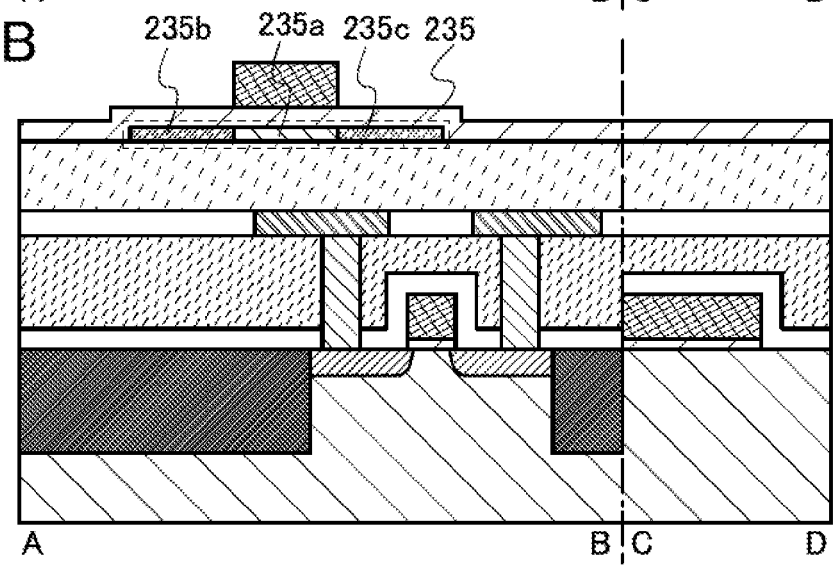

Next, a dopant is added to the oxide semiconductor film 229 with the use of the gate electrode 233 as a mask. As a result, as illustrated in FIG. 12B, a first region 235a which is covered with the gate electrode 233 and to which the dopant is not added and a pair of second regions 235b and 235c containing the dopant are formed. Since the dopant is added with the use of the gate electrode 233 as a mask, the first region 235a to which the dopant is not added and the pair of second regions 235b and 235c containing the dopant can be formed in a self-aligned manner. Note that the first region 235a overlapping with the gate electrode 233 serves as a channel region. The pair of second regions 235b and 235c containing the dopant serves as electric-field relaxation regions. The first region 235a and the pair of second regions 235b and 235c containing the dopant constitute an oxide semiconductor film 235.

Further, the concentration of hydrogen in the first region 235a of the oxide semiconductor film 229 is preferably lower than $5\times10^{18}$ atoms/cm$^3$, more preferably lower than or equal to $1\times10^{18}$ atoms/cm$^3$, still more preferably lower than or equal to $5\times10^{17}$ atoms/cm$^3$, further more preferably lower than or equal to $1\times10^{16}$ atoms/cm$^3$. By a bond of an oxide semiconductor and hydrogen, part of contained hydrogen serves as a donor to generate electrons as carriers. For that reason, by the reduction in the concentration of hydrogen in the first region 235a of the oxide semiconductor film 229, negative shift of the threshold voltage can be reduced.

The concentration of the dopant in the pair of second regions 235b and 235c is higher than or equal to $5\times10^{18}$ atoms/cm$^3$ and lower than or equal to $1\times10^{22}$ atoms/cm$^3$, preferably higher than or equal to $5\times10^{18}$ atoms/cm$^3$ and lower than $5\times10^{19}$ atoms/cm$^3$.

Since the pair of second regions 235b and 235c contains the dopant, the carrier density or the number of defects can be increased. Therefore, the conductivity can be higher than that of the first region 235a which does not include a dopant. Note that an excessive increase in the concentration of the dopant causes inhibition of carrier movement by the dopant, which leads to a reduction in conductivity of the pair of second regions 235b and 235c containing the dopant.

The pair of second regions 235b and 235c containing the dopant preferably has a conductivity of higher than or equal to 0.1 S/cm and lower than or equal to 1000 S/cm, preferably higher than or equal to 10 S/cm and lower than or equal to 1000 S/cm.

The existence of the pair of second regions 235b and 235c including dopant in the oxide semiconductor film 229 can relieve an electric field applied to the end portion of the first region 235a functioning as a channel region. Thus, a short-channel effect of the transistor can be suppressed.

As a method for adding the dopant to the oxide semiconductor film 229, an ion doping method or an ion implantation method can be used. As the dopant, at least one of boron, nitrogen, phosphorus, and arsenic can be added. Alternatively, as the dopant, at least one of helium, neon, argon, krypton, and xenon can be added. Alternatively, as the dopant, hydrogen can be added. Still alternatively, as the dopant, at least one of boron, nitrogen, phosphorus, and arsenic and at least one of helium, neon, argon, krypton, and xenon in appropriate combination with hydrogen can be added.

In the embodiment describe here, the addition of the dopant to the oxide semiconductor film 229 is conducted in a state where the oxide semiconductor film 229 is covered with the insulating film and the like; alternatively, the addition of the dopant may be conducted in a state where the oxide semiconductor film 229 is exposed.

Alternatively, the dopant can be added by a method other than an ion doping method, an ion implantation method, or the like. For example, a dopant can be added in the following manner: plasma is generated in an atmosphere of a gas containing an element to be added and plasma treatment is performed on an object to which the dopant is added. A dry etching apparatus, a CVD apparatus, a high-density CVD apparatus, or the like can be used to generate the plasma.

After that, heat treatment may be performed. The heat treatment is performed typically at a temperature higher than or equal to 150° C. and lower than or equal to 450° C., preferably higher than or equal to 250° C. and lower than or equal to 325° C. In the heat treatment, the temperature may be gradually increased from 250° C. to 325° C.

Through the heat treatment, the resistance of the pair of second regions 235b and 235c containing the dopant can be reduced. In the heat treatment, the pair of second regions 235b and 235c containing the dopant may be in either a crystalline state or an amorphous state.

Figure 12C:
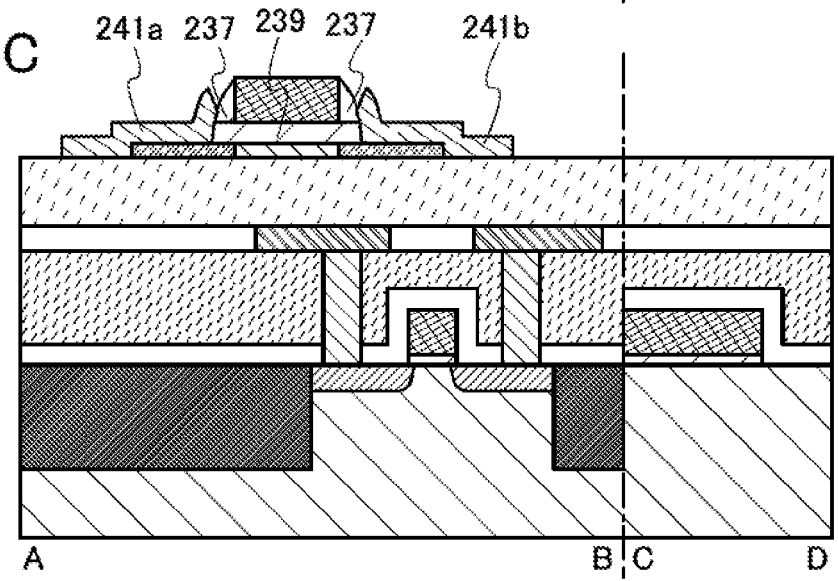

Next, as illustrated in FIG. 12C, sidewall insulating films 237 on side surfaces of the gate electrode 233, a gate insulating film 239, an electrode 241a, and an electrode 241b are formed.

The sidewall insulating film 237 may each be formed with a single layer or a stack using one or more of silicon oxide, silicon oxynitride, silicon nitride oxide, silicon nitride, aluminum oxide, aluminum oxynitride, aluminum nitride oxide, aluminum nitride, and the like. The sidewall insulating film 237 may be formed using an oxide insulating film from which part of oxygen is released by heating in a manner similar to that of the insulating film 225.

Here, a method for forming the sidewall insulating film 237 is described.

First, an insulating film to be the sidewall insulating films 237 is formed over the insulating film 231 and the gate electrode 233. The insulating film is formed by a sputtering method, a CVD method, or the like. In addition, although the thickness of the insulating film is not particularly limited, the thickness is selected as appropriate in consideration of coverage with respect to the shape of the gate electrode 233.

The insulating film is etched to form the sidewall insulating film 237. The etching here is highly anisotropic etching, and the sidewall insulating film 237 can be formed in a self-aligned manner by performing the highly anisotropic etching on the insulating film.

The width of the region for relieving an electric field in each of the pair of second regions 235b and 235c containing the dopant depends on the width of the sidewall insulating films 237, and the width of the sidewall insulating films 237 depends on the thickness of the gate electrode 233. Therefore, the thickness of the gate electrode 233 may be determined so that the width of the region for relieving an electric field has a desired value.

When the sidewall insulating films 237 are formed, the insulating film 231 is also etched by highly anisotropic etching and the oxide semiconductor film 229 is partly exposed, whereby the gate insulating film 239 is formed.

The pair of electrodes 241a and 241b can be formed using a material similar to that of the wirings 223a and 223b, as appropriate. Note that the pair of electrodes 241a and 241b may function as wirings.

The pair of electrodes 241a and 241b is formed by a printing method or an inkjet method. Alternatively, the pair of electrodes 241a and 241b is formed in such a manner that a conductive film is formed by a sputtering method, a CVD method, an evaporation method, or the like and then part of the conductive film is selectively etched.

The pair of electrodes 241a and 241b is preferably formed to be in contact with side surfaces of the sidewall insulating films 237 and the gate insulating film 239. That is, end portions of the pair of electrodes 241a and 241b of the transistor are located over the sidewall insulating films 237 and entirely cover exposed portions of the pair of second regions 235b and 235c including dopant in the oxide semiconductor film 229. As a result, regions in the pair of second regions 235b and 235c containing the dopant, which are in contact with the pair of electrodes 241a and 241b, serve as a source region and a drain region, whereas regions in the pair of second regions 235b and 235c containing the dopant, which overlap with both the gate insulating film 239 and one of the sidewall insulating films 237, serve as electric-field relaxation regions. In addition, since the width of the electric-field relaxation regions can be controlled with the length of the sidewall insulating films 237, a required accuracy in alignment of a mask for forming the pair of electrodes 241a and 241b can be relaxed. Accordingly, variation among plural transistors can be reduced.

Note that the sidewall insulating films 237 are provided in contact with the side surfaces of the gate electrode 233 in this embodiment; however, this embodiment is not limited to this structure, and the sidewall insulating films 237 are not necessarily provided. Although the sidewall insulating films 237 are formed after the pair of second regions 235b and 235c is formed in this embodiment, this embodiment is not limited to this structure and the pair of second regions 235b and 235c may be formed after the sidewall insulating films 237 are formed. With such a structure, the first region 235a can be extended to overlap with the sidewall insulating films 237.

Figure 13A:
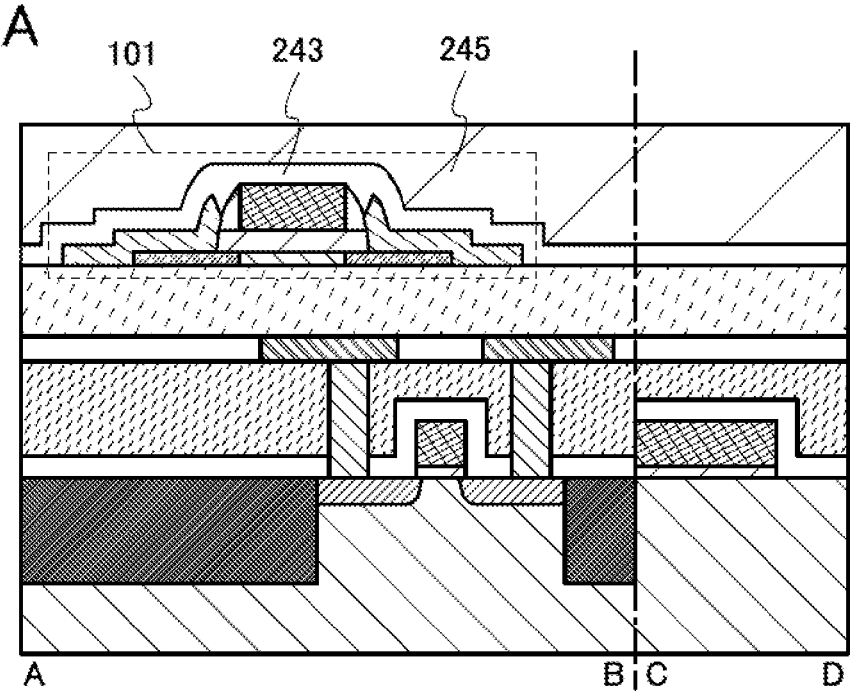
FIGS. 13A and 13B are cross-sectional views illustrating a manufacturing process of the memory device according to one embodiment of the disclosed invention.

Next, as illustrated in FIG. 13A, an insulating film 243 and an insulating film 245 are formed by a sputtering method, a CVD method, a coating method, a printing method, or the like.

The insulating films 243 and 245 may each be formed with a single layer or a stack including one or more of silicon oxide, silicon oxynitride, silicon nitride oxide, silicon nitride, aluminum oxide, aluminum oxynitride, aluminum nitride oxide, aluminum nitride, and the like. Note that with the use of an insulating film which prevents diffusion of oxygen to the outside as the insulating film 245, oxygen released from the insulating film 243 can be supplied to an oxide semiconductor film. Typical examples of the insulating film which prevents diffusion of oxygen to the outside include films of aluminum oxide, aluminum oxynitride, and the like. In addition, with the use of an oxide insulating film which prevents diffusion of hydrogen from the outside as the insulating film 245, diffusion of hydrogen from the outside to the oxide semiconductor film can be reduced, and vacancies in the oxide semiconductor film can be reduced. Typical examples of the insulating film which prevents diffusion of hydrogen from the outside include films of silicon nitride, silicon nitride oxide, aluminum nitride, aluminum nitride oxide, and the like. Further, when the insulating film 243 has a three-layer structure of an oxide insulating film from which part of oxygen is released by heating, an insulating film which prevents diffusion of oxygen to the outside, and an oxide insulating film, oxygen can be efficiently diffused to the oxide semiconductor film and oxygen can be prevented from being released to the outside; accordingly, variation in transistor characteristics can be reduced even at high temperature and in high humidity.

Through the above steps, as illustrated in FIG. 13A, the transistor 101 including an oxide semiconductor film can be manufactured.

As described above, the oxide semiconductor film 229 is preferably highly purified by sufficient removal of impurities such as hydrogen and sufficient supply with oxygen so as to be supersaturated with oxygen. Specifically, the hydrogen concentration in the oxide semiconductor film 229 is lower than or equal to $5\times10^{19}$ atoms/cm$^3$, preferably lower than or equal to $5\times10^{18}$ atoms/cm$^3$, further preferably lower than or equal to $5\times10^{17}$ atoms/cm$^3$. Note that the hydrogen concentration in the oxide semiconductor film 229 is measured by secondary ion mass spectrometry (SIMS). When the oxide semiconductor film 229 which is highly purified by sufficiently reducing the hydrogen concentration and in which defect levels in an energy gap due to oxygen deficiency are reduced by supplying a sufficient amount of oxygen as described above is used for the transistor 101, for example, the off-state current (per unit channel width (1 μm) here) at room temperature (25° C.) is 100 zA (1 zA (zeptoampere) is $1\times10^{-21}$ A) or less, preferably 10 zA or less. The transistor 101 with very excellent off-state current characteristics can be obtained with the use of such an i-type (intrinsic) or substantially i-type oxide semiconductor film 229 in such a manner.

Although the transistor 101 of this embodiment has a top-gate structure, this embodiment is not limited to the top-gate structure and a bottom-gate structure may be employed. Further, in the transistor 101 in this embodiment, the pair of electrodes 241a and 241b is in contact with at least part of top surfaces of the pair of second regions 235b and 235c; however, this embodiment is not limited to this structure, and for example, the pair of second regions 235b and 235c may be in contact with at least part of the pair of electrodes 241a and 241b.

Next, part of each of the insulating film 215, the insulating film 217, the insulating film 221, the insulating film 225, the insulating film 243, and the insulating film 245 is selectively etched, so that openings are formed to expose part of each of the gate electrode 209, the electrode 241a, and the electrode 241b. After a conductive film is formed in the openings, part of the conductive film is selectively etched; thus, a wiring 249 in contact with the electrode 241b and a wiring 250 in contact with the electrode 241a are formed. The wiring 249 and the wiring 250 can be formed using the same material as that of the contact plugs 219a and 219b as appropriate.

Here, the wiring 249 serves as the node FG which electrically connects the drain electrode of the transistor 101 and the gate electrode 209 of the transistor 103. The wiring 250 serves as the source electrode of the transistor 101 and is electrically connected to the first write data line WDL1 in FIG. 1. Although not directly shown in FIG. 13B, the gate electrode 233 of the transistor 101 is electrically connected to the first write selection line WSL1 in FIG. 1. Note that in the case of providing the capacitor 106 in FIG. 1, for example, an insulating film over the wiring 250 and a conductive film overlapping with the wiring 250 with the insulating film therebetween may be provided.

Figure 13B:
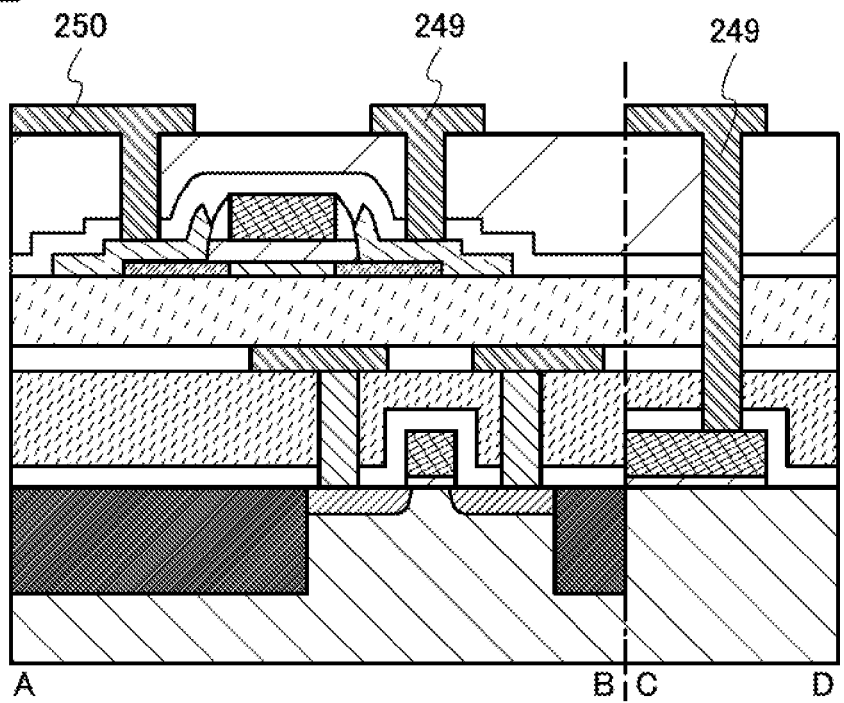

In FIG. 13B, the drain electrode of the transistor 101 and the gate electrode 209 of the transistor 103 are connected through the wiring 249; however, the memory device in this embodiment is not limited to this structure. For example, an upper surface of the gate electrode of the transistor 103 may be exposed and one of the source electrode and the drain electrode of the transistor 101 may be formed to be in direct contact with the upper surface of the gate electrode.

Through the above steps, the memory device including the transistors 101 and 103 can be manufactured.

Figure 14A:
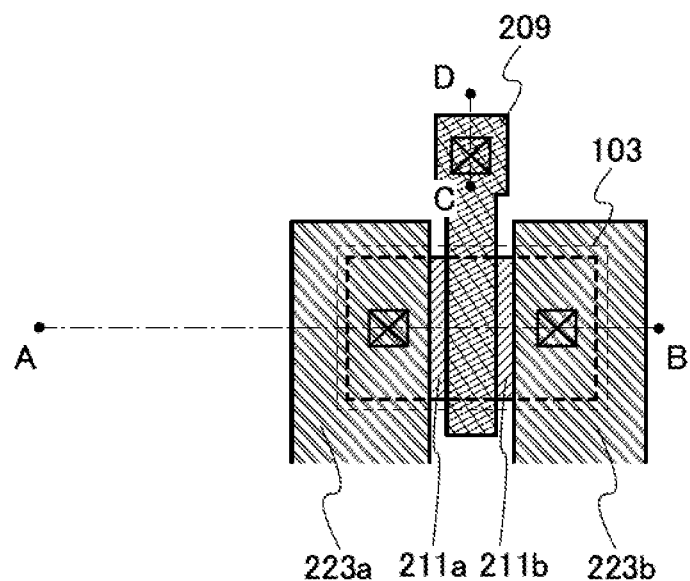
FIGS. 14A and 14B are each a plan view illustrating a memory device according to one embodiment of the disclosed invention.
Figure 14B:
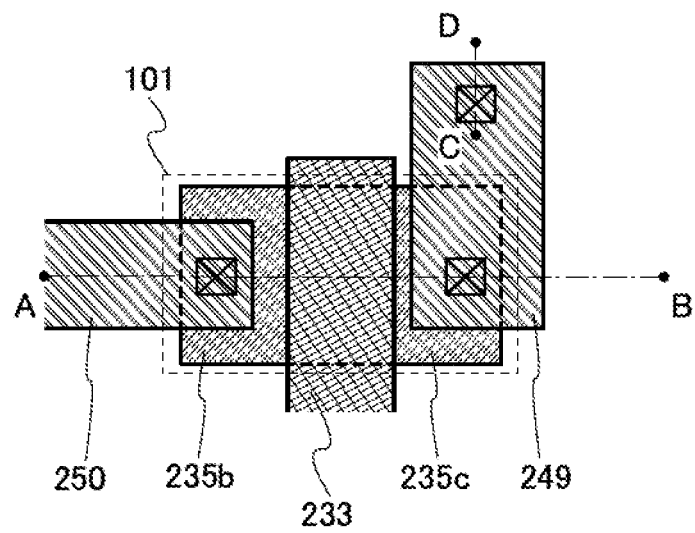

Here, FIGS. 14A and 14B illustrate an example of a plan view of the memory device which corresponds to the cross-sectional view illustrated in FIG. 13B. FIG. 14A is a plan view of a structure below the insulating film 225, i.e., the transistor 103. FIG. 14B is a plan view of a structure over the insulating film 225, i.e., the transistor 101. Note that some of the components (e.g., the insulating film 215) are not illustrated in FIGS. 14A and 14B for easy understanding. Further, each of the cross-sectional views of FIGS. 10A to 10D, FIGS. 11A and 11B, FIGS. 12A to 12C, and FIGS. 13A and 13B is taken along dashed-dotted line A-B and dashed-dotted line C-D in FIGS. 14A and 14B.

In the memory device illustrated in FIGS. 14A and 14B, as illustrated in FIG. 13B, the transistor 101 is electrically connected to the transistor 103 in a region shown in the cross section taken along dashed-dotted line C-D. Here, at least part of the transistor 101 overlaps with at least part of the transistor 103. It is preferable that at least part of the oxide semiconductor film 235 overlap with at least part of the n-type impurity region 211a or part of the n-type impurity region 211b. With such a planar layout, an increase of the area occupied by the memory device due to provision of the transistor including a wide bandgap semiconductor such as an oxide semiconductor can be suppressed. As a result, a high capacity of the memory device can be easily achieved.

As described above, a data write transistor of a memory device shared by a plurality of processors is manufactured with a material capable of achieving a sufficiently low off-state current of a transistor (e.g., an oxide semiconductor material that is a wide band gap semiconductor). Using a wide band gap semiconductor material capable of achieving a sufficiently low off-state current of a transistor makes it possible to hold a potential for a long time without regular or constant supply of power, and therefore, low power consumption can be achieved.

A memory device has a memory cell including at least one data write transistor, at least one data storage transistor, and at least two data read transistors, and is shared by a plurality of processors. With this structure, the number of elements can be smaller than at least that of a memory cell of a dual-port SRAM, which results in achieving a small area of a memory cell and easily achieving a high capacity of the memory device.

The methods and structures described in this embodiment can be combined as appropriate with any of the methods and structures described in the other embodiments.

Embodiment 4

In this embodiment, as an example of the memory device described in the above embodiments and a semiconductor device including the memory device, a multi-core processor in which a plurality of processor cores is provided in one processor package will be described with reference to FIGS. 15A and 15B.

Figure 15A:
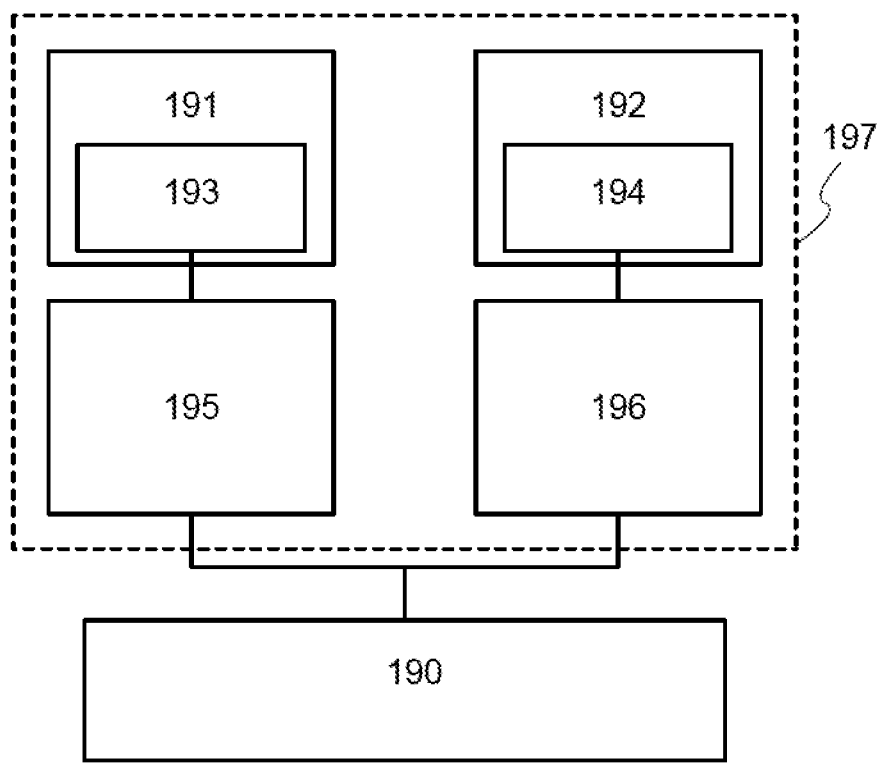
FIGS. 15A and 15B are block diagrams of a semiconductor device according to one embodiment of the disclosed invention.

FIG. 15A is a block diagram of a multi-core processor in which a main memory serves as a shared memory. A multi-core processor 197 illustrated in FIG. 15A includes a first system including a processor core 191, a first-level cache memory 193 in the processor core 191, and a second-level cache memory 195 connected to the processor core 191. In addition, the multi-core processor 197 includes a second system including a processor core 192, a first-level cache memory 194 in the processor core 192, and a second-level cache memory 196 connected to the processor core 192. A main memory 190 is connected to the multi-core processor 197 and is shared by the processor core 191 in the first system and the processor core 192 in the second system.

Here, the main memory 190 which is shared by the processor core 191 in the first system and the processor core 192 in the second system corresponds to the memory device 14 in FIG. 2 which is described in the above embodiment, the processor core 191 in the first system corresponds to the first processor 11, and the processor core 192 in the second system corresponds to the second processor 12.

In the case where the memory device described in the above embodiment is used as the main memory 190 in FIG. 15A, a data write transistor of a memory cell in the main memory 190 can be formed using a material with which an off-state current of a transistor can be sufficiently low (e.g., an oxide semiconductor material which is a wide band gap semiconductor). With this structure, the memory cell in the main memory 190 can hold a potential for a long period without regular or constant supply of power; accordingly, low power consumption can be achieved.

Figure 15B:
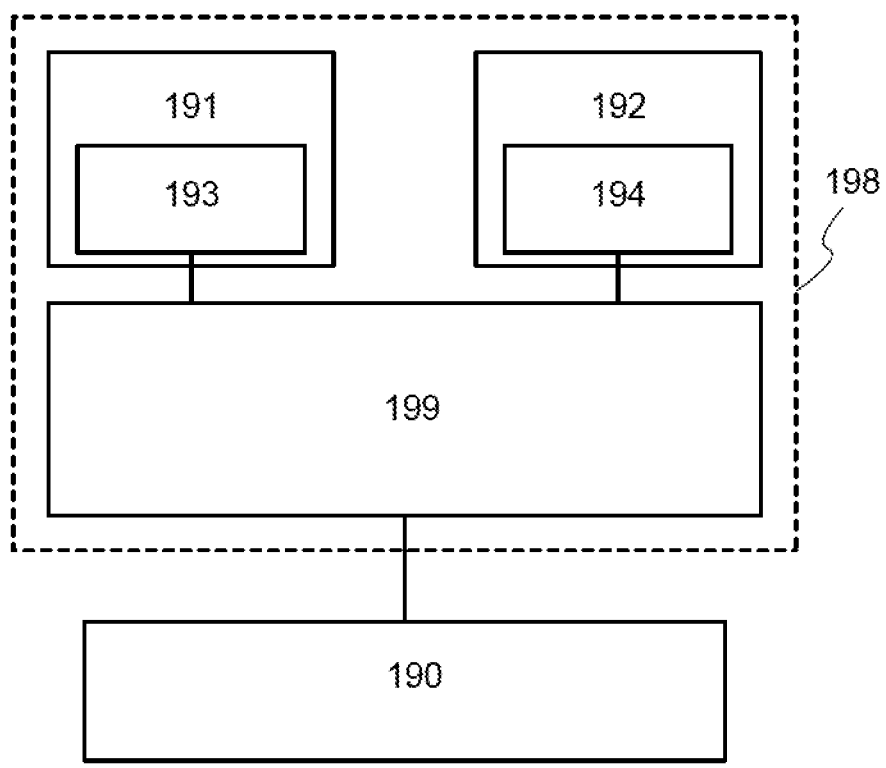

FIG. 15B is a block diagram of a multi-core processor in which a second-level cache memory serves as a shared memory. A multi-core processor 198 in FIG. 15B includes the first system including the processor core 191 and the first-level cache memory 193 in the processor core 191. In addition, the multi-core processor 198 includes the second system including the processor core 192 and the first-level cache memory 194 in the processor core 192. Further, the multi-core processor 198 includes a second-level cache memory 199 shared by the processor core 191 in the first system and the processor core 192 in the second system. The main memory 190 is connected to the multi-core processor 198 through the second-level cache memory 199.

Here, the second-level cache memory 199 which is shared by the processor core 191 in the first system and the processor core 192 in the second system corresponds to the memory device 14 in FIG. 2 which is described in the above embodiment, the processor core 191 in the first system corresponds to the first processor 11, and the processor core 192 in the second system corresponds to the second processor 12.

In the case where the memory device described in the above embodiment is used as the second-level cache memory 199 in FIG. 15B, a data write transistor of a memory cell in the second-level cache memory 199 can be formed using a material with which an off-state current of a transistor can be sufficiently low (e.g., an oxide semiconductor material which is a wide band gap semiconductor). With this structure, the memory cell in the second-level cache memory 199 can hold a potential for a long period without regular or constant supply of power; accordingly, low power consumption can be achieved.

In the case where the memory device described in the above embodiment is used as the second-level cache memory 199 in FIG. 15B, the second-level cache memory 199 includes a memory cell including at least one data write transistor, at least one data storage transistor, and at least two data read transistors. With this structure, the number of elements can be small in comparison with the case of a dual-port SRAM memory cell which is used for many shared second cache memories; thus, the area of a memory cell in the second-level cache memory 199 can be small and a high capacity of the second-level cache memory 199 can be easily achieved.

The methods and structures described in this embodiment can be combined as appropriate with any of the methods and structures described in the other embodiments.

Embodiment 5

A central processing unit (CPU) can be formed in such a manner that a memory device in the above embodiments and a semiconductor device including the memory device are used for at least part of the CPU.

Figure 16A:
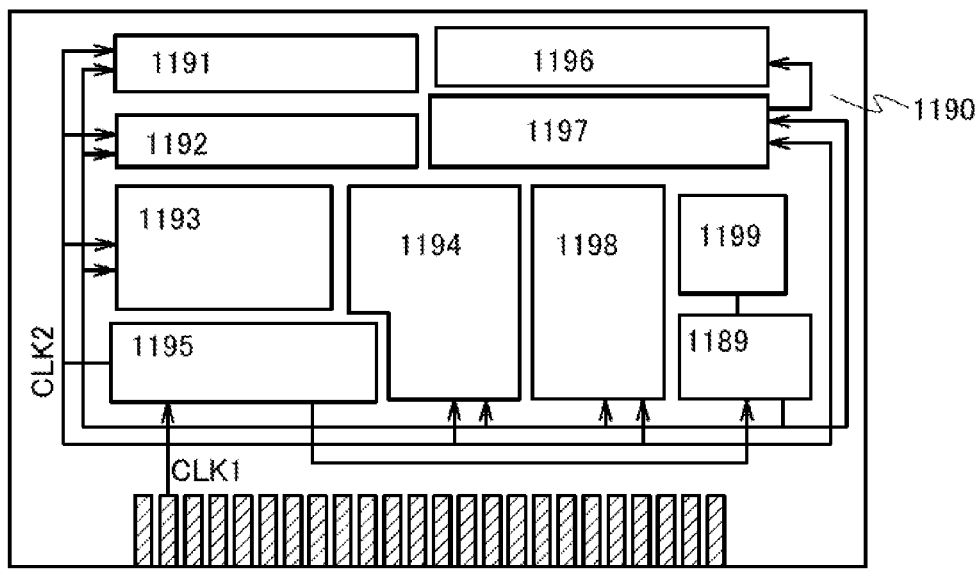
FIGS. 16A to 16C are block diagrams of a semiconductor device according to one embodiment of the disclosed invention.

FIG. 16A is a block diagram illustrating a specific configuration of a CPU. The CPU illustrated in FIG. 16A includes an arithmetic logic unit (ALU) 1191, an ALU controller 1192, an instruction decoder 1193, an interrupt controller 1194, a timing controller 1195, a register 1196, a register controller 1197, a bus interface (Bus I/F) 1198, a rewritable ROM 1199, and an ROM interface (ROM I/F) 1189 over a substrate 1190. A semiconductor substrate, an SOI substrate, a glass substrate, or the like is used as the substrate 1190. The ROM 1199 and the ROM interface 1189 may be provided over a separate chip. Obviously, the CPU illustrated in FIG. 16A is just an example in which the configuration has been simplified, and an actual CPU may have various configurations depending on the application.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the internal clock signal CLK2 to the above circuits.

In the CPU illustrated in FIG. 16A, a memory cell is provided in the register 1196. The memory cell described in the above embodiments can be used as the memory cell provided in the register 1196. In addition, the ALU 1191 can include a plurality of core processors, and the register 1196 can be used as a shared memory.

In the CPU illustrated in FIG. 16A, the register controller 1197 selects operation of holding data in the register 1196 in accordance with an instruction from the ALU 1191. That is, the register controller 1197 selects whether data is held by a logic element which inverts a logic (logic level) or a capacitor in the memory cell included in the register 1196. When data holding by the logic element which inverts a logic (logic level) is selected, power supply voltage is supplied to the memory cell in the register 1196. When data holding by the capacitor is selected, the data is rewritten in the capacitor, and supply of power supply voltage to the memory cell in the register 1196 can be stopped.

Figure 16B:
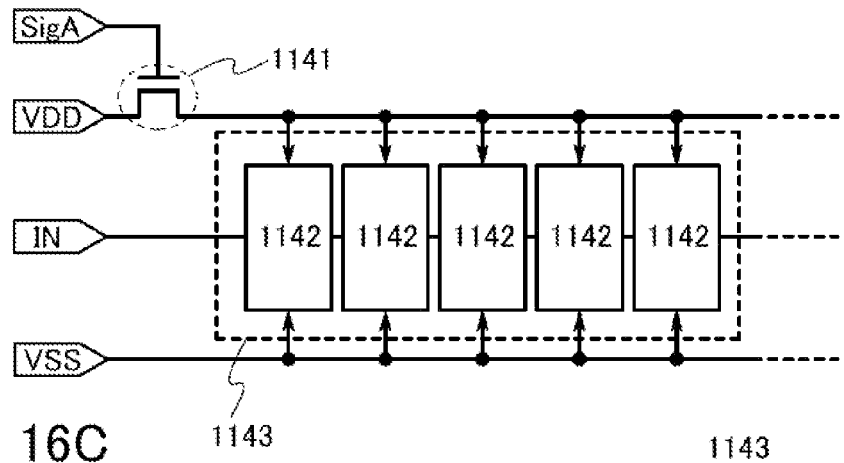
Figure 16C:
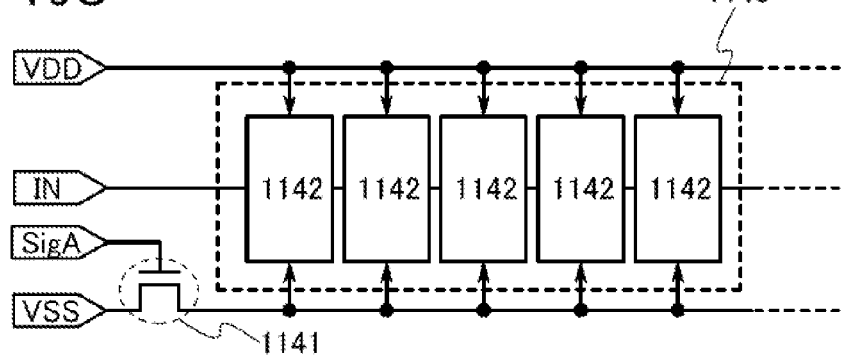

A switching element provided between a memory cell group and a node to which a power supply potential VDD or a power supply potential VSS is supplied, as illustrated in FIG. 16B or FIG. 16C, allows the power supply voltage to be stopped. Circuits illustrated in FIGS. 16B and 16C will be described below.

FIGS. 16B and 16C each illustrate an example of a structure of a memory circuit where any of the transistors which includes a wide band gap semiconductor material such as an oxide semiconductor material and which is disclosed in the above embodiments is used as a switching element for controlling supply of a power supply potential to a memory cell.

The memory device illustrated in FIG. 16B includes a switching element 1141 and a memory cell group 1143 including a plurality of memory cells 1142. Specifically, as each of the memory cells 1142, the memory cell described in the above embodiments can be used. Each of the memory cells 1142 included in the memory cell group 1143 is supplied with the high-level power supply potential VDD via the switching element 1141. Further, each of the memory cells 1142 included in the memory cell group 1143 is supplied with a potential of a signal IN and the low-level power supply potential VSS.

In FIG. 16B, the transistor which includes a wide band gap semiconductor material such as an oxide semiconductor material and which is disclosed in the above embodiments is used as the switching element 1141, and the switching of the transistor is controlled by a signal SigA supplied to a gate electrode thereof.

Note that FIG. 16B illustrates the structure in which the switching element 1141 includes only one transistor; however, without particular limitation thereon, the switching element 1141 may include a plurality of transistors. In the case where the switching element 1141 includes a plurality of transistors which serves as switching elements, the plurality of transistors may be connected to each other in parallel, in series, or in combination of parallel connection and series connection.

Although the switching element 1141 controls the supply of the high-level power supply potential VDD to each of the memory cells 1142 included in the memory cell group 1143 in FIG. 16B, the switching element 1141 may control the supply of the low-level power supply potential VSS.

In FIG. 16C, an example of a memory device in which each of the memory cells 1142 included in the memory cell group 1143 is supplied with the low-level power supply potential VSS via the switching element 1141 is illustrated. The supply of the low-level power supply potential VSS to each of the memory cells 1142 included in the memory cell group 1143 can be controlled by the switching element 1141.

When a switching element is provided between a memory cell group and a node to which the power supply potential VDD or the power supply potential VSS is supplied, data can be held even in the case where an operation of a CPU is temporarily stopped and the supply of the power supply voltage is stopped; accordingly, power consumption can be reduced. Specifically, for example, while a user of a personal computer does not input data to an input device such as a keyboard, the operation of the CPU can be stopped, so that the power consumption can be reduced.

The CPU in this embodiment includes a semiconductor device in which a second semiconductor element layer which includes a wide band gap semiconductor material such as an oxide semiconductor material is provided over a first semiconductor element layer which includes a material other than a wide band gap semiconductor material, such as silicon and which is described in the above embodiments. With this structure, a transistor including single crystal silicon or the like which easily achieves a high-speed operation and a transistor including an oxide semiconductor which has an extremely low off-state current can be used for the CPU as appropriate in accordance with roles for the transistors in the CPU. As a result, a CPU which achieves a high-speed operation and low power consumption can be provided.

The second semiconductor element layer including an oxide semiconductor is stacked over the first semiconductor element layer including a material other than an oxide semiconductor, such as single crystal silicon; consequently, an increase in area due to provision of a transistor including an oxide semiconductor material. As a result, a high integration of CPU can be achieved.

Further, a capacitor can be formed without an additional step in a process for forming a wiring layer and a transistor including an oxide semiconductor of the second semiconductor element layer. Therefore, a semiconductor element and a capacitor which form a CPU can be efficiently formed.

Although the CPU is given as an example, the transistor can also be applied to an LSI such as a digital signal processor (DSP), a custom LSI, or a field programmable gate array (FPGA).

By the way, a magnetic tunnel junction element (an MTJ element) is known as a nonvolatile random access memory. The MTJ element stores data by setting a low-resistance state when the magnetization directions of ferromagnetic films provided above and below an insulating film are parallel, or a high-resistance state when the direction thereof are anti-parallel. Thus, its operation principle is quite different from that of the memory including a wide band gap semiconductor material such as an oxide semiconductor material described in this embodiment. Table 1 shows comparison between the MTJ element and the semiconductor device according to this embodiment.

TABLE 1

| | MTJ element | Semiconductor device of this embodiment |
|---|---|---|
| 1) Heat resistance | Curie temperature | Process temperature at 500° C. (reliability at 150° C.) |
| 2) Driving method | Current driving | Voltage driving |
| 3) Writing principle | Changing magnetization direction of ferromagnetic film | Turning on/off FET |
| 4) Si LSI | Suitable for bipolar LSI (For highly integrated circuit, MOS LSI is preferable to bipolar LSI, which is unsuitable for high integration. Note that W becomes larger.) | Suitable for MOS LSI |
| 5) Overhead | Large (because of high Joule heat) | Smaller than overhead of MTJ element by 2 to 3 or more orders of magnitude (because of utilizing charging and discharging of parasitic capacitance) |
| 6) Nonvolatility | Utilizing spin | Utilizing small off-state current |
| 7) Read cycles | No limitation | No limitation |
| 8) 3D structure | Difficult (at most two layers) | Easy (with a limitless number of layers) |
| 9) Integration degree ($F^2$) | 4 $F^2$ to 15 $F^2$ | Depending on the number of layers stacked in 3D structure (need heat resistance high enough to withstand process of forming upper OS FET) |
| 10) Material | Magnetic rare-earth element | OS material |
| 11) Cost per bit | High | Low (might be slightly high depending on constituent of OS (e.g., In)) |
| 12) Resistance to magnetic field | Low | High |

The MTJ element has a disadvantage in that a magnetic property is lost when the temperature is higher than or equal to the Curie temperature because a magnetic material is used. In addition, the MTJ element is compatible with a silicon bipolar device because current driving is employed; however, the bipolar device is unsuitable for high integration. Further, there is a problem in that power consumption is increased by an increase of memory capacity, though the writing current of the MTJ element is extremely low.

In principle, the MTJ element has low resistance to a magnetic field, so that the magnetization direction is likely to change when the MTJ element is exposed to a high magnetic field. In addition, it is necessary to control magnetic fluctuation which is caused by nanoscaling of a magnetic body used for the MTJ element.

In addition, a rare earth element is used for the MTJ element; thus, it requires special attention to incorporate a process of forming the MTJ element in a process of forming a silicon semiconductor that avoids metal contamination. The material cost per bit of the MTJ element is expensive.

On the other hand, the transistor which includes a wide band gap semiconductor material such as an oxide semiconductor material and which is described in the above embodiments has an element structure and an operation principle similar to those of a silicon MOSFET except that a semiconductor material for forming a channel is a metal oxide. Further, the transistor including an oxide semiconductor is not affected by a magnetic field, and does not cause soft errors. This shows that the transistor is highly compatible with a silicon integrated circuit.

As shown in Table 1, the memory in which the transistor which includes a wide band gap semiconductor material such as an oxide semiconductor material and which is described in the above embodiments and the transistor including silicon are combined has advantages over the spintronics device in many aspects such as the heat resistance, the 3D conversion (stacked-layer structure of three or more layers), and the resistance to a magnetic field. Note that the power for overhead shown in Table 1 is, for example, power for writing data into a memory section or the like in a processor, which is what is called power consumed for overhead.

As described above, the use of the memory including an oxide semiconductor, which has more advantages than the spintronics device makes it possible to reduce power consumption of a CPU.

The methods and structures described in this embodiment can be combined as appropriate with any of the methods and structures described in the other embodiments.

Embodiment 6

A memory device and a semiconductor device including the memory device which are disclosed in this specification can be applied to a variety of electronic appliances (including game machines). Examples of the electronic appliances include display devices of televisions, monitors, and the like, lighting devices, desktop personal computers and laptop personal computers, word processors, image reproduction devices which reproduce still images or moving images stored in recording media such as digital versatile discs (DVDs), portable compact disc (CD) players, radio receivers, tape recorders, headphone stereos, stereos, cordless phone handsets, transceivers, portable wireless devices, mobile phones, car phones, portable game machines, calculators, portable information terminals, electronic notebooks, e-book readers, electronic translators, audio input devices, cameras such as still cameras and video cameras, electric shavers, high-frequency heating appliances such as microwave ovens, electric rice cookers, electric washing machines, electric vacuum cleaners, air-conditioning systems such as air conditioners, dishwashers, dish dryers, clothes dryers, futon dryers, electric refrigerators, electric freezers, electric refrigerator-freezers, freezers for preserving DNA, smoke detectors, radiation counters, and medical equipment such as dialyzers. Further, the examples include industrial equipment such as guide lights, traffic lights, belt conveyors, elevators, escalators, industrial robots, and power storage systems. In addition, oil engines, moving objects driven by electric motors using power from the non-aqueous secondary batteries, and the like are also included in the category of electric devices. Examples of the moving objects include electric vehicles (EV), hybrid electric vehicles (HEV) which include both an internal-combustion engine and a motor, plug-in hybrid electric vehicles (PHEV), tracked vehicles in which caterpillar tracks are substituted for wheels of these vehicles, motorized bicycles including motor-assisted bicycles, motorcycles, electric wheelchairs, golf carts, boats or ships, submarines, helicopters, aircrafts, rockets, artificial satellites, space probes, planetary probes, spacecrafts, and the like. Specific examples for such electronic appliances are illustrated in FIGS. 17A and 17B.

Figure 17A:
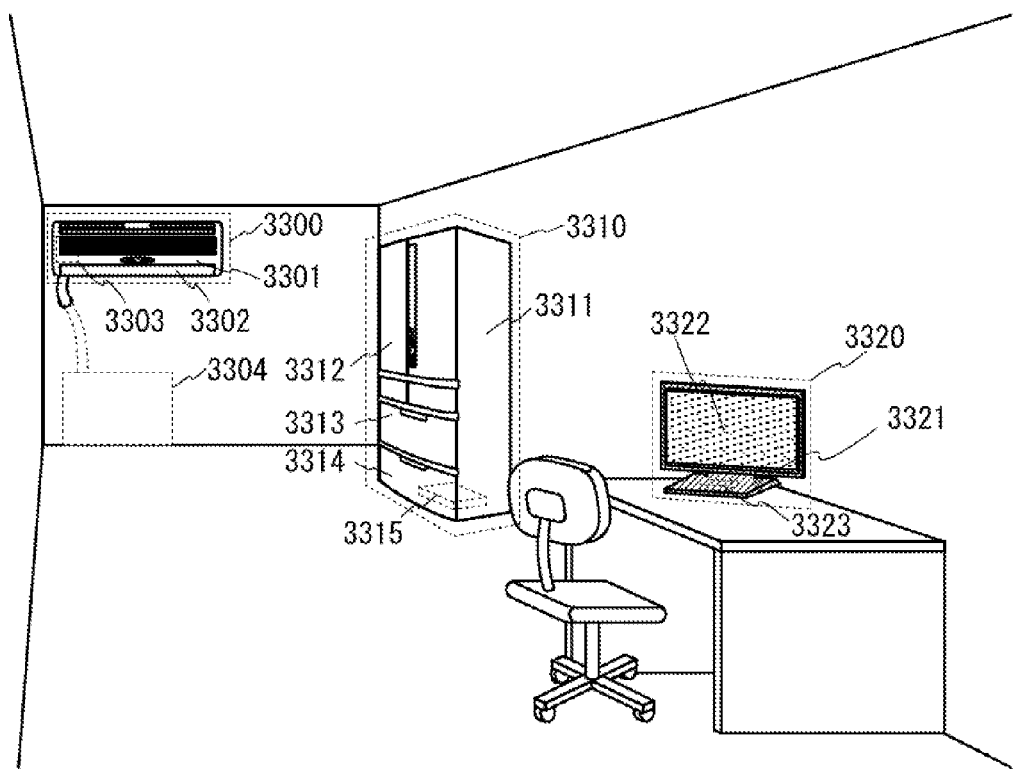
FIGS. 17A and 17B illustrate electronic devices.
Figure 17B:
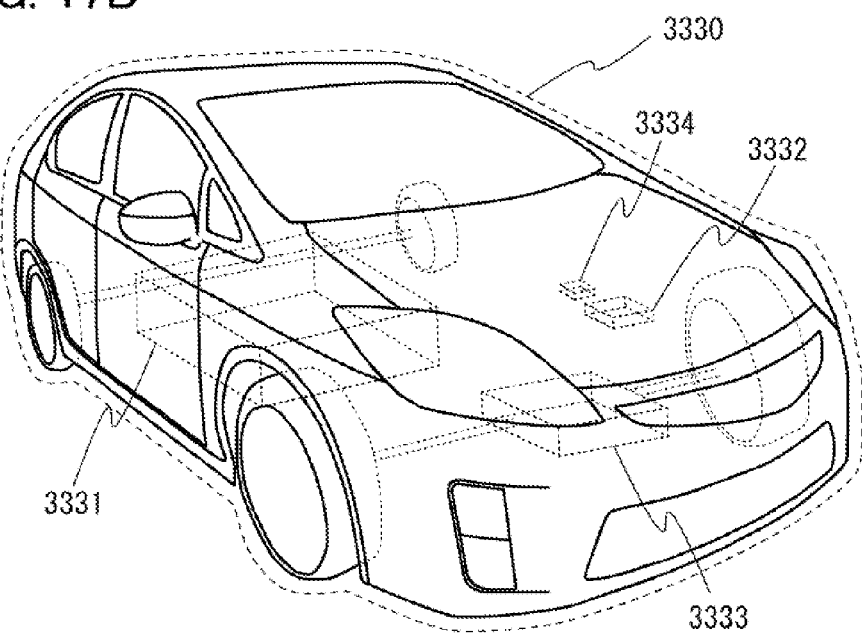

In FIG. 17A, an air conditioner including an indoor unit 3300 and an outdoor unit 3304 is an example of an electronic appliance using the memory device and the semiconductor device including the memory device which are disclosed in the above embodiments for a CPU. Specifically, the indoor unit 3300 includes a housing 3301, a ventilation duct 3302, a CPU 3303, and the like. Although the CPU 3303 is provided in the indoor unit 3300 in FIG. 17A, the CPU 3303 may be provided in the outdoor unit 3304. Alternatively, the CPU 3303 may be provided in both the indoor unit 3300 and the outdoor unit 3304. The CPU achieves low power consumption as described in the above embodiments, and accordingly, power consumption of the air conditioner can be low.

In FIG. 17A, an electric refrigerator-freezer 3310 is an example of an electronic appliance which is provided with the CPU formed using an oxide semiconductor. Specifically, the electric refrigerator-freezer 3310 includes a housing 3311, a door for a refrigerator 3312, a door for a freezer 3313, a door for a vegetable drawer 3314, a CPU 3315, and the like. The CPU 3315 is provided in the housing 3311 in FIG. 17A. When a CPU including the memory device and the semiconductor device including the memory device which are disclosed in the above embodiments is used for the electric refrigerator-freezer 3310, power consumption of the electric refrigerator-freezer 3310 can be low.

In FIG. 17A, a video display device 3320 is an example of an electronic appliance which is provided with the CPU formed using an oxide semiconductor. Specifically, the video display device 3320 includes a housing 3321, a display portion 3322, a CPU 3323, and the like. The CPU 3323 is provided in the housing 3321 in FIG. 17A. When a CPU including the memory device and the semiconductor device including the memory device which are disclosed in the above embodiments is used as the CPU 3323 in the video display device 3320, power consumption of the video display device 3320 can be low.

FIG. 17B illustrates an example of an electric vehicle. An electric vehicle 3330 is equipped with a secondary battery 3331. The power of the secondary battery 3331 is controlled by a control circuit 3332 to be output and is supplied to a driving device 3333. The control circuit 3332 is controlled by a processing unit 3334 including a ROM, a RAM, a CPU, or the like which is not illustrated. When a CPU including the memory device and the semiconductor device including the memory device which are disclosed in the above embodiments is used as the CPU in the electric vehicle 3330, power consumption of the electric vehicle 3330 can be low.

The driving device 3333 includes a DC motor or an AC motor either alone or in combination with an internal-combustion engine. The processing unit 3334 outputs a control signal to the control circuit 3332 based on input data such as data of operation (e.g., acceleration, deceleration, or stop) by a driver or data during driving (e.g., data on an upgrade or a downgrade, or data on a load on a driving wheel) of the electric vehicle 3330. The control circuit 3332 adjusts the electric energy supplied from the secondary battery 3331 in accordance with the control signal of the processing unit 3334 to control the output of the driving device 3333. In the case where the AC motor is mounted, although not illustrated, an inverter which converts direct current into alternate current is also incorporated.

This embodiment can be combined with any of the other embodiments as appropriate.

(Off-State Current of Transistor)

The results of measuring the off-state current of a transistor including a highly purified oxide semiconductor are described below.

Figure 18:
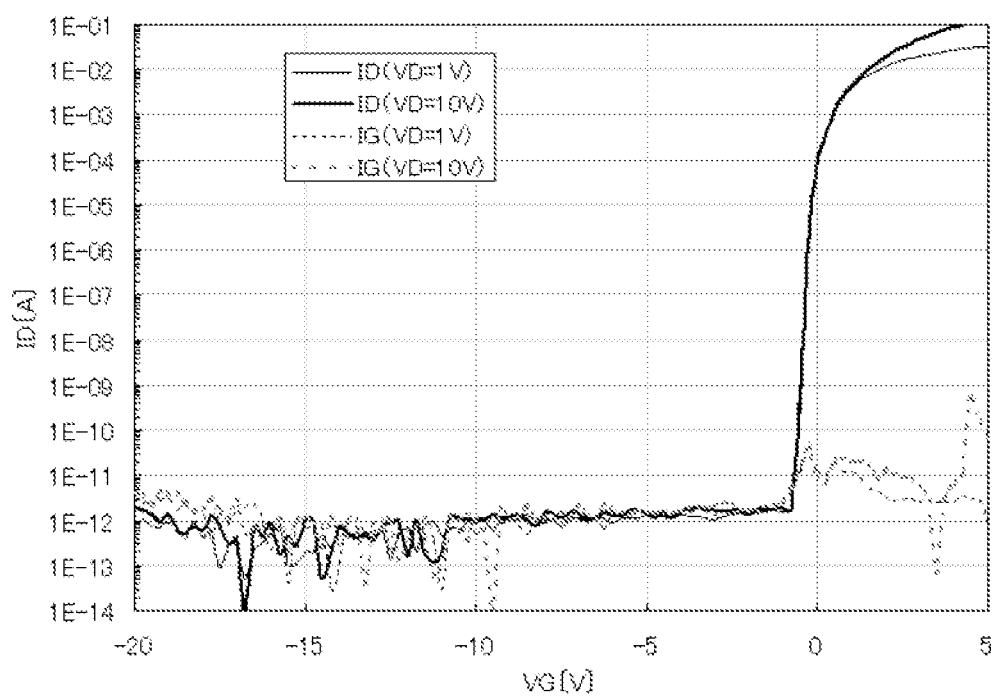
FIG. 18 is a graph showing the characteristics of a transistor including an oxide semiconductor.

First, a transistor with a channel width W of 1 m, which is sufficiently wide, was prepared in consideration of the very small off current of a transistor including a highly purified oxide semiconductor, and the off current is measured. FIG. 18 shows the results obtained by measurement of the off-state current of the transistor with a channel width W of 1 m. In FIG. 18, the horizontal axis shows gate voltage $V_G$ and the vertical axis shows drain current $I_D$. In the case where the drain voltage VD is +1 V or +10 V and the gate voltage VG is in a range of −5 V to −20 V, the off-state current of the transistor was found to be lower than or equal to $1\times10^{-12}$ A which is the detection limit. Moreover, it was found that the off current of the transistor (per unit channel width (1 μm)) is smaller than or equal to 1 aA ($1\times10^{-18}$ A).

Next, the results obtained by more accurately measuring the off-state current of the transistor including a highly purified oxide semiconductor will be described. As described above, the off-state current of the transistor including a highly purified oxide semiconductor was found to be lower than or equal to $1\times10^{-12}$ A which is the detection limit of the measurement equipment. Here, the results obtained measuring more accurate off current (the value smaller than or equal to the detection limit of measurement equipment in the above measurement), with the use of an element for characteristic evaluation, will be described.

First, the element for characteristic evaluation which was used in a method for measuring current will be described with reference to FIG. 19.

Figure 19:
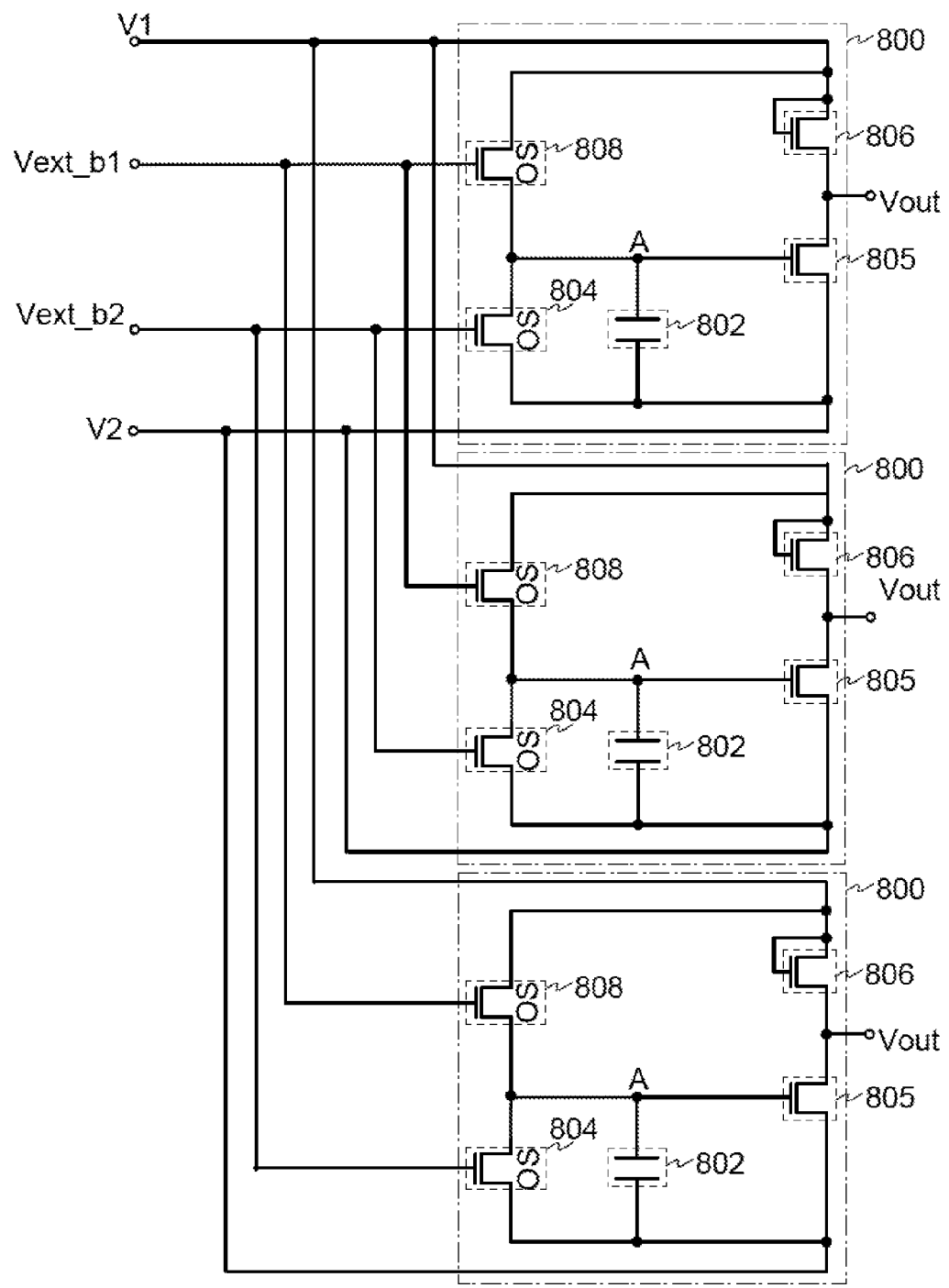
FIG. 19 is a diagram of a circuit for evaluating characteristics of a transistor including an oxide semiconductor.

In the element for characteristic evaluation in FIG. 19, three measurement systems 800 are connected in parallel. The measurement system 800 includes a capacitor 802, a transistor 804, a transistor 805, a transistor 806, and a transistor 808. As the transistor 804, the transistor 805, the transistor 806, and the transistor 808, transistors including a highly purified oxide semiconductor were employed.

In the measurement system 800, one of a source terminal and a drain terminal of the transistor 804, one of terminals of the capacitor 802, and one of a source terminal and a drain terminal of the transistor 805 are electrically connected to a power source (for supplying V2). The other of the source terminal and the drain terminal of the transistor 804, one of a source terminal and a drain terminal of the transistor 808, the other of the terminals of the capacitor 802, and a gate terminal of the transistor 805 are electrically connected to one another. The other of the source terminal and the drain terminal of the transistor 808, one of a source terminal and a drain terminal of the transistor 806, and a gate terminal of the transistor 806 are electrically connected to a power source (for supplying V1). The other of the source terminal and the drain terminal of the transistor 805 and the other of the source terminal and the drain terminal of the transistor 806 are electrically connected to each other and electrically connected to an output terminal.

A potential Vext_b2 for controlling an on state and an off state of the transistor 804 is supplied to the gate terminal of the transistor 804. A potential Vext_b1 for controlling an on state and an off state of the transistor 808 is supplied to the gate terminal of the transistor 808. A potential Vout is output from the output terminal.

Next, a method for measuring current with the use of the element for characteristic evaluation will be described.

First, an initialization period in which a potential difference is applied to measure the off current will be described briefly. In the initialization period, the potential Vext_b1 for turning on the transistor 808 is input to the gate terminal of the transistor 808. Accordingly, a potential V1 is supplied to a node A that is electrically connected to the other of the source terminal and the drain terminal of the transistor 804 (that is, the node electrically connected to one of the source terminal and the drain terminal of the transistor 808, the other of the terminals of the capacitor 802, and the gate terminal of the transistor 805). Here, the potential V1 is, for example, a high potential. The transistor 804 is off.

After that, the potential Vext_b1 for turning off the transistor 808 is input to the gate terminal of the transistor 808 so that the transistor 808 is turned off. After the transistor 808 is turned off, the potential V1 is set to low. Still, the transistor 804 is off. The potential V2 is the same potential as V1. Thus, the initialization period is completed. In a state where the initialization period is completed, a potential difference is generated between the node A and one of the source terminal and the drain terminal of the transistor 804, and also, a potential difference is generated between the node A and the other of the source terminal and the drain terminal of the transistor 808. Therefore, charge flows slightly through the transistor 804 and the transistor 808. That is, the off-state current flows.

Next, a measurement period of the off-state current is briefly described. In the measurement period, the potential (that is, V2) of one of the source terminal and the drain terminal of the transistor 804 and the potential (that is, V1) of the other of the source terminal and the drain terminal of the transistor 808 are set to low and fixed. On the other hand, the potential of the node A is not fixed (the node A is in a floating state) in the measurement period. Accordingly, electric charge flows through the transistor 804, and the amount of electric charge stored in the node A is changed as time passes. The potential of the node A is changed depending on the change in the amount of electric charge stored in the node A. That is to say, the output potential Vout of the output terminal also varies.

Figure 20:
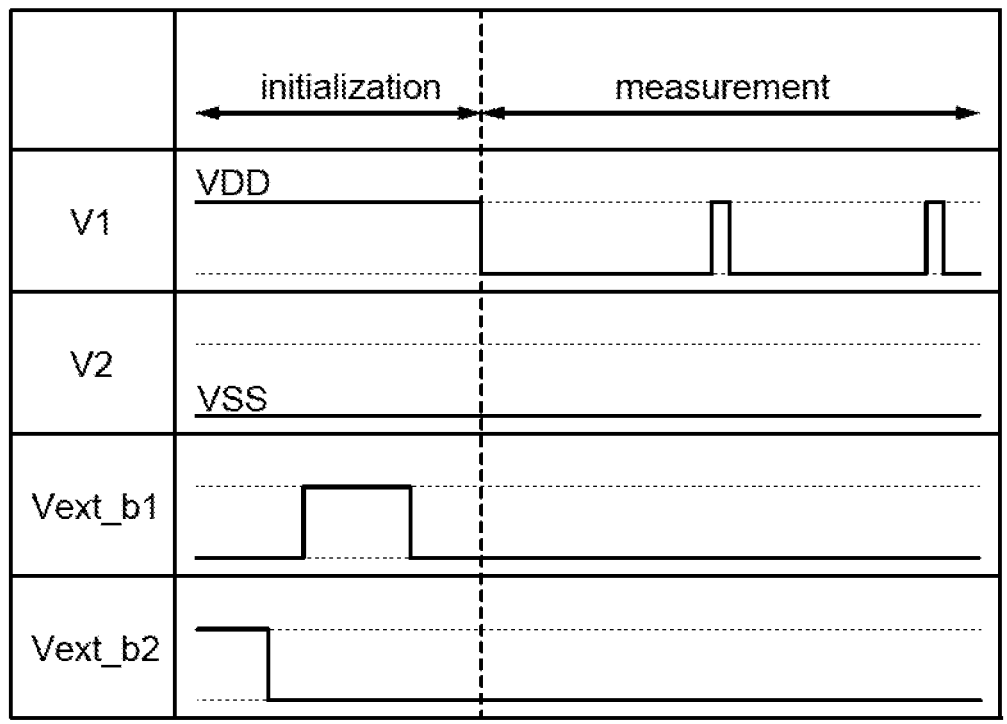
FIG. 20 is a timing diagram for evaluating characteristics of a transistor including an oxide semiconductor.

FIG. 20 shows details (a timing chart) of the relationship among potentials in the initialization period in which the potential difference is generated and those in the subsequent measurement period.

In the initialization period, first, the potential Vext_b2 is set to a potential (high potential) at which the transistor 804 is turned on. Thus, the potential of the node A comes to be V2, that is, a low potential (VSS). Note that a low potential (VSS) is not necessarily supplied to the node A. After that, the potential Vext_b2 is set to a potential (low potential) at which the transistor 804 is turned off, whereby the transistor 804 is turned off. Next, the potential Vext_b1 is set to a potential (a high potential) with which the transistor 808 is turned on. Thus, the potential of the node A comes to be V1, that is, a high potential (VDD). After that, the potential Vext_b1 is set to a potential at which the transistor 808 is turned off. Accordingly, the node A is brought into a floating state and the initialization period is completed.

In the following measurement period, the potential V1 and the potential V2 are individually set to potentials at which electric charge flows to or from the node A. Here, the potential V1 and the potential V2 are low potentials (VSS). Note that at the timing of measuring the output potential Vout, it is necessary to operate an output circuit; thus, V1 is set to a high potential (VDD) temporarily in some cases. The period in which V1 is a high potential (VDD) is set to be short so that the measurement is not influenced.

When the potential difference is generated and the measurement period is started as described above, the amount of electric charge stored in the node A is changed as time passes, which changes the potential of the node A. This means that the potential of a gate terminal of the transistor 805 varies and thus, the output potential Vout of the output terminal also varies with the lapse of time.

A method for calculating the off-state current on the basis of the obtained output potential Vout is described below.

The relation between the potential $V_A$ of the node A and the output potential Vout is obtained in advance before the off current is calculated. With this, the potential $V_A$ of the node A can be obtained using the output potential Vout. In accordance with the above relationship, the potential $V_A$ of the node A can be expressed as a function of the output potential Vout by the following equation.

$$V_A = F(Vout) \quad \text{[FORMULA 2]}$$

Electric charge $Q_A$ of the node A can be expressed by the following equation with the use of the potential $V_A$ of the node A, capacitance $C_A$ connected to the node A, and a constant (const). Here, the capacitance $C_A$ connected to the node A is the sum of the capacitance of the capacitor 802 and other capacitance.

$$Q_A = C_A V_A + \text{const} \quad \text{[FORMULA 3]}$$

Since a current $I_A$ of the node A is obtained by differentiating charge flowing to the node A (or charge flowing from the node A) with respect to time, the current $I_A$ of the node A is expressed by the following equation.

$$I_A = \frac{\Delta Q_A}{\Delta t} = \frac{C_A \cdot \Delta F(Vout)}{\Delta t} \quad \text{[FORMULA 4]}$$

In this manner, the current $I_A$ of the node A can be obtained from the capacitance $C_A$ connected to the node A and the output potential Vout of the output terminal.

In accordance with the above method, it is possible to measure leakage current (off-state current) which flows between a source and a drain of a transistor in an off state.

In this measurement, the transistor 804, the transistor 805, the transistor 806, and the transistor 808 were manufactured using a highly purified oxide semiconductor with a channel length L of 10 μm and a channel width W of 50 μm. In the measurement systems 800 which are arranged in parallel, the capacitance of the capacitors 802 were 100 fF, 1 pF, and 3 pF.

Note that in the measurement, VDD was 5 V and VSS was 0 V. In the measurement period, Vout was measured while the potential V1 was basically set to VSS and changed to VDD for 100 msec at intervals of 10 sec to 300 sec. Δt which was used in calculation of current I which flows through the element was about 30000 sec.

Figure 21:
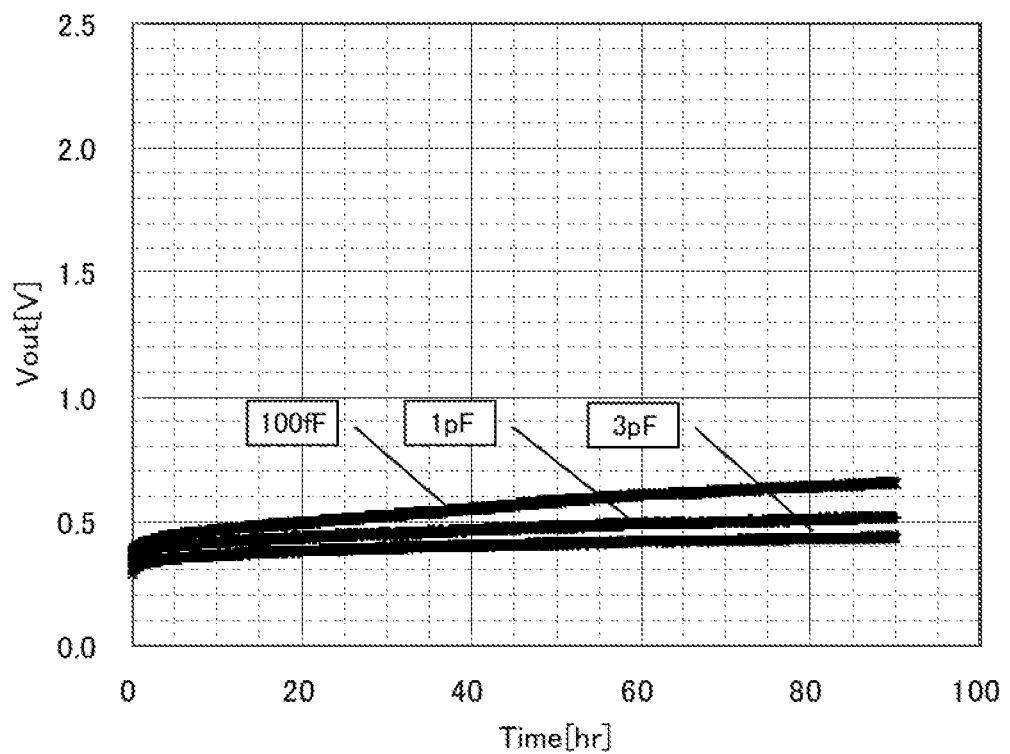
FIG. 21 is a graph showing characteristics of a transistor including an oxide semiconductor.

FIG. 21 shows the relation between the output potential Vout and elapsed time Time in the current measurement. As is seen in FIG. 21, the potential changes over time.

Figure 22:
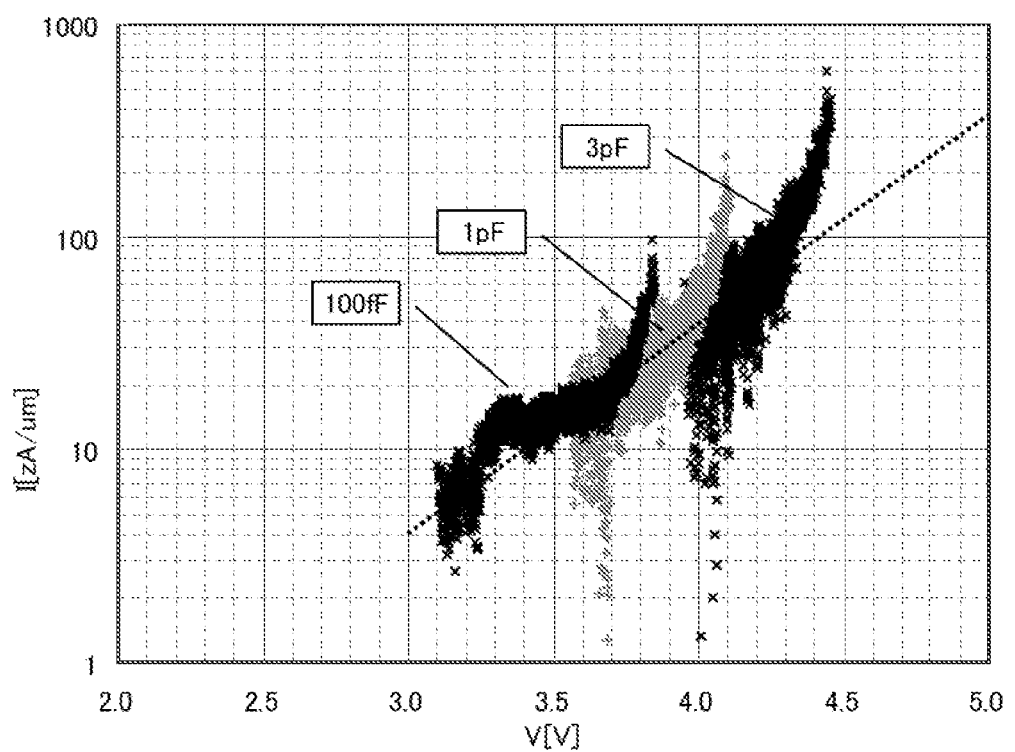
FIG. 22 is a graph showing characteristics of a transistor including an oxide semiconductor.

FIG. 22 shows the off-state current at room temperature (25° C.) calculated in the above current measurement. Note that FIG. 22 shows the relation between source-drain voltage V and off-state current I. According to FIG. 22, the off-state current was approximately 40 zA/μm under the condition that the source-drain voltage was 4 V. In addition, the off-state current was less than or equal to 10 zA/μm under the condition where the source-drain voltage was 3.1 V. Note that 1 zA represents $10^{-21}$ A. Note that the off-state current I is a mean value when the elapsed time Time is 30000 sec.

Figure 23:
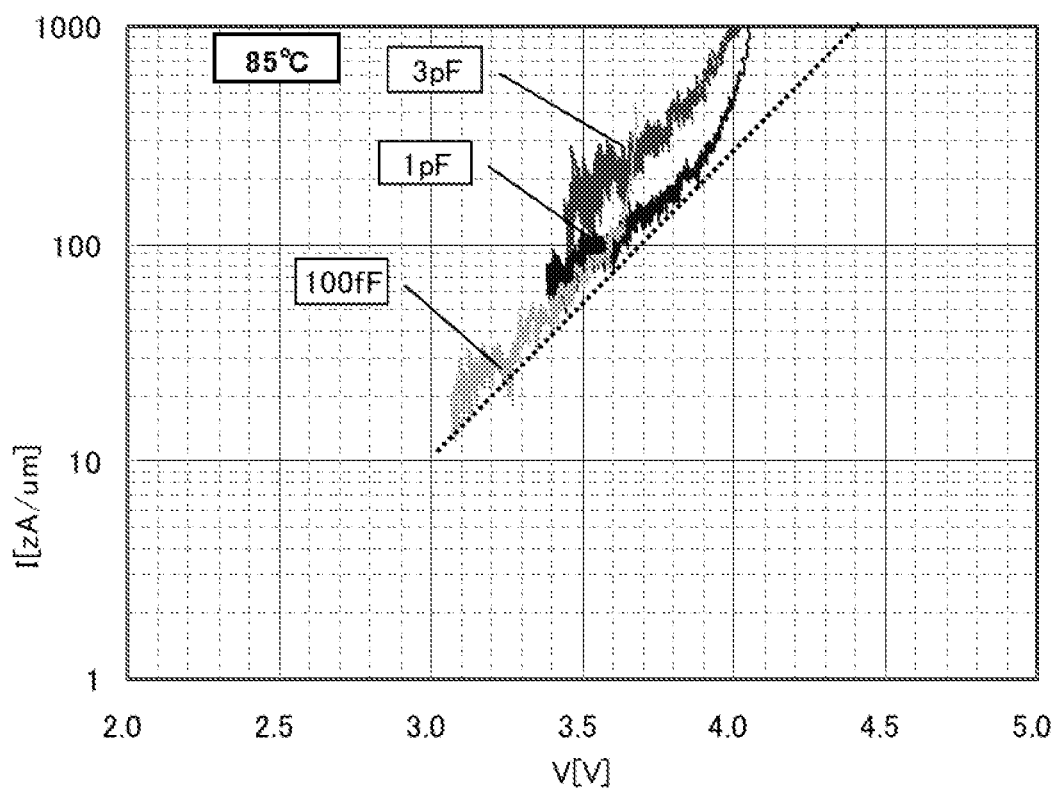
FIG. 23 is a graph showing the characteristics of the transistor including an oxide semiconductor.

Further, FIG. 23 shows the off-state current at the time when the temperature is 85° C. calculated in the above current measurement. FIG. 23 shows the relation between the source-drain voltage V and the off-state current I at the time when the temperature is 85° C. According to FIG. 23, the off-state current was less than or equal to 100 zA/μm when the source-drain voltage was 3.1 V. Note that the off-state current I is a mean value when the elapsed time Time is from 6000 to 30000 sec.

In this manner, it was confirmed that the off-state current is sufficiently small in a transistor including a highly purified oxide semiconductor.

This application is based on Japanese Patent Application serial no. 2012-046571 filed with Japan Patent Office on Mar. 2, 2012, the entire contents of which are hereby incorporated by reference.

What is claimed is:

1. A memory device comprising:
   a first transistor including a first channel formation region;
   a second transistor including a second channel formation region;
   a third transistor including a third channel formation region;
   a fourth transistor including a fourth channel formation region;
   a first line;
   a second line;
   a third line;
   a fourth line;
   a fifth line;
   a sixth line; and
   a seventh line,
   wherein one of a source and a drain of the first transistor is electrically connected to the first line,
   wherein one of a source and a drain of the second transistor is electrically connected to the second line,
   wherein one of a source and a drain of the third transistor is electrically connected to the third line,
   wherein one of a source and a drain of the fourth transistor is electrically connected to the fourth line,
   wherein a gate of the first transistor is electrically connected to the fifth line,
   wherein a gate of the third transistor is electrically connected to the sixth line,
   wherein a gate of the fourth transistor is electrically connected to the seventh line,
   wherein the other of the source and the drain of the first transistor is electrically connected to a gate of the second transistor so that a node is formed,
   wherein the other of the source and the drain of the second transistor is electrically connected to the other of the source and the drain of the third transistor,
   wherein the other of the source and the drain of the second transistor is electrically connected to the other of the source and the drain of the fourth transistor,
   wherein the first channel formation region includes a semiconductor material that is different from a semiconductor material in the second channel formation region, the third channel formation region and the fourth channel formation region, and
   wherein the first channel formation region includes an oxide semiconductor.

2. The memory device according to claim 1, further comprising:
   a capacitor; and
   an eighth line;
   wherein one electrode of the capacitor is electrically connected to the node, and
   wherein the other electrode of the capacitor is electrically connected to the eighth line.

3. The memory device according to claim 1,
   wherein the memory device is configured to store electric charge in the node when the first transistor is in an off state.

4. The memory device according to claim 1,
   wherein the second channel formation region, the third channel formation region and the fourth channel formation region contain single crystal silicon.

5. The memory device according to claim 2,
wherein the first line is a write data line,
wherein the second line is a first power supply line,
wherein the third line is a first read data line,
wherein the fourth line is a second read data line,
wherein the fifth line is a write selection line,
wherein the sixth line is a first read selection line,
wherein the seventh line is a second read selection line, and
wherein the eighth line is a second power supply line.

6. A semiconductor device comprising the memory device according to claim 1, the semiconductor device further comprising:
a first processor;
a second processor; and
a selector,
wherein the first processor is configured to write data to the memory device using the fifth line and the first line through the selector at a first timing,
wherein the second processor is configured to write data to the memory device using the fifth line and the first line through the selector at a second timing that is different from the first timing,
wherein the first processor is configured to read data of the memory device using the sixth line and the third line, and
wherein the second processor is configured to read data of the memory device using the seventh line and the fourth line.

7. The memory device according to claim 1,
wherein the first channel formation region contains indium, gallium and zinc.

8. An electric device comprising the memory device according to claim 1.

9. A memory device comprising:
a first transistor including a first channel formation region;
a second transistor including a second channel formation region;
a third transistor including a third channel formation region;
a fourth transistor including a fourth channel formation region;
a fifth transistor including a fifth channel formation region;
a first line;
a second line;
a third line;
a fourth line;
a fifth line;
a sixth line;
a seventh line;
an eighth line; and
a ninth line,
wherein one of a source and a drain of the first transistor is electrically connected to the first line,
wherein one of a source and a drain of the second transistor is electrically connected to the second line,
wherein one of a source and a drain of the third transistor is electrically connected to the third line,
wherein one of a source and a drain of the fourth transistor is electrically connected to the fourth line,
wherein one of a source and a drain of the fifth transistor is electrically connected to the eighth line,
wherein a gate of the first transistor is electrically connected to the fifth line,
wherein a gate of the third transistor is electrically connected to the sixth line,
wherein a gate of the fourth transistor is electrically connected to the seventh line,
wherein a gate of the fifth transistor is electrically connected to the ninth line,
wherein the other of the source and the drain of the first transistor and the other of the source and the drain of the fifth transistor are electrically connected to a gate of the second transistor so that a node is formed,
wherein the other of the source and the drain of the second transistor is electrically connected to the other of the source and the drain of the third transistor,
wherein the other of the source and the drain of the second transistor is electrically connected to the other of the source and the drain of the fourth transistor,
wherein the first channel formation region includes a semiconductor material different from a semiconductor material in the second channel formation region, the third channel formation region and the fourth channel formation region,
wherein the first channel formation region includes an oxide semiconductor, and
wherein the fifth channel formation region includes an oxide semiconductor.

10. The memory device according to claim 9, further comprising:
a capacitor; and
a tenth line;
wherein one electrode of the capacitor is electrically connected to the node, and
wherein the other electrode of the capacitor is electrically connected to the tenth line.

11. The memory device according to claim 9,
wherein the memory device is configured to store electric charge in the node when the first transistor and the fifth transistor are in an off state.

12. The memory device according to claim 9,
wherein the second channel formation region, the third channel formation region and the fourth channel formation region contain single crystal silicon.

13. The memory device according to claim 10,
wherein the first line is a first write data line,
wherein the second line is a first power supply line,
wherein the third line is a first read data line,
wherein the fourth line is a second read data line,
wherein the fifth line is a first write selection line,
wherein the sixth line is a first read selection line,
wherein the seventh line is a second read selection line,
wherein the eighth line is a second write data line,
wherein the ninth line is a second write selection line, and
wherein the tenth line is a second power supply line.

14. A semiconductor device comprising the memory device according to claim 9, the semiconductor device further comprising:
a first processor; and
a second processor;
wherein the first processor is configured to write data to the memory device using the fifth line and the first line,
wherein the second processor is configured to write data to the memory device using the eighth line and the ninth line,
wherein the first processor is configured to read data of the memory device using the sixth line and the third line, and
wherein the second processor is configured to read data of the memory device using the seventh line and the fourth line.

15. The memory device according to claim 9,
wherein the first channel formation region contains indium, gallium and zinc, and wherein the fifth channel formation region contains indium, gallium and zinc.

16. An electric device comprising the memory device according to claim 9.

* * * * *